US009209415B2

(12) United States Patent
Shitagaki et al.

(10) Patent No.: US 9,209,415 B2
(45) Date of Patent: Dec. 8, 2015

(54) LIGHT-EMITTING ELEMENT WITH MULTIPLE LIGHT-EMITTING LAYERS HAVING CONTROLLED CARRIER MOBILITY AND LIGHTING DEVICE AND ELECTRONIC DEVICE USING THE SAME

(75) Inventors: Satoko Shitagaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 487 days.

(21) Appl. No.: 12/873,544

(22) Filed: Sep. 1, 2010

(65) Prior Publication Data

US 2011/0057178 A1 Mar. 10, 2011

(30) Foreign Application Priority Data

Sep. 4, 2009 (JP) ................................. 2009-205300

(51) Int. Cl.
*H01L 51/54* (2006.01)
*H01L 51/50* (2006.01)
*H01L 51/00* (2006.01)

(52) U.S. Cl.
CPC .......... *H01L 51/5012* (2013.01); *H01L 51/504* (2013.01); *H01L 51/006* (2013.01); *H01L 51/0072* (2013.01); *H01L 51/0081* (2013.01); *H01L 51/5048* (2013.01); *H01L 2251/552* (2013.01)

(58) Field of Classification Search
None
See application file for complete search history.

(56) References Cited

U.S. PATENT DOCUMENTS

| | | | |
|---|---|---|---|
| 6,566,807 B1 | 5/2003 | Fujita et al. | |
| 6,580,213 B2 | 6/2003 | Yamazaki | |
| 7,351,999 B2 | 4/2008 | Li | |
| 7,528,542 B2 | 5/2009 | Kawamura et al. | |
| 7,615,925 B2 | 11/2009 | Suzuki et al. | |
| 7,663,304 B2 | 2/2010 | Fukuoka et al. | |
| 8,026,662 B2 | 9/2011 | Ishihara et al. | |
| 8,143,613 B2 | 3/2012 | Forrest | |
| 8,283,856 B2 | 10/2012 | Ushikubo | |
| 8,653,537 B2 | 2/2014 | He et al. | |
| 8,664,849 B2 | 3/2014 | Ushikubo | |
| 2003/0068528 A1* | 4/2003 | Thompson et al. | 428/690 |
| 2003/0175553 A1* | 9/2003 | Thompson et al. | 428/690 |
| 2003/0234607 A1* | 12/2003 | Kim et al. | 313/502 |
| 2004/0222736 A1* | 11/2004 | Yoneda | 313/503 |
| 2005/0084712 A1 | 4/2005 | Kido et al. | |
| 2005/0098207 A1 | 5/2005 | Matsumoto et al. | |
| 2005/0162075 A1* | 7/2005 | Madathil et al. | 313/504 |
| 2005/0170208 A1 | 8/2005 | Yatsunami et al. | |
| 2006/0008740 A1 | 1/2006 | Kido et al. | |
| 2006/0043859 A1 | 3/2006 | Fukuoka et al. | |
| 2006/0051563 A1 | 3/2006 | Okumoto et al. | |
| 2006/0158104 A1* | 7/2006 | Iijima et al. | 313/504 |
| 2006/0292394 A1 | 12/2006 | Iwaki et al. | |
| 2007/0031700 A1 | 2/2007 | Guo et al. | |
| 2007/0075632 A1 | 4/2007 | Kawakami et al. | |
| 2007/0090756 A1 | 4/2007 | Okada et al. | |
| 2007/0200125 A1 | 8/2007 | Ikeda et al. | |
| 2007/0205713 A1* | 9/2007 | Okinaka et al. | 313/504 |
| 2007/0222376 A1 | 9/2007 | Ohsawa et al. | |
| 2007/0279560 A1 | 12/2007 | Ishitani et al. | |
| 2008/0006821 A1 | 1/2008 | Suzuki et al. | |
| 2008/0067928 A1* | 3/2008 | Fukuoka et al. | 313/506 |
| 2008/0211066 A1* | 9/2008 | Akedo et al. | 257/640 |
| 2008/0238305 A1* | 10/2008 | Kondo et al. | 313/504 |
| 2008/0284318 A1* | 11/2008 | Deaton et al. | 313/504 |
| 2009/0004506 A1* | 1/2009 | Nomura et al. | 428/690 |
| 2009/0058278 A1* | 3/2009 | Ushikubo et al. | 313/504 |
| 2009/0091246 A1 | 4/2009 | Tsuji et al. | |
| 2009/0091255 A1 | 4/2009 | Lee et al. | |
| 2009/0167168 A1 | 7/2009 | Seo et al. | |
| 2009/0200918 A1 | 8/2009 | Seo et al. | |
| 2009/0236590 A1 | 9/2009 | Ohsawa | |
| 2009/0283757 A1 | 11/2009 | Seo et al. | |
| 2010/0096622 A1 | 4/2010 | Iizumi et al. | |
| 2010/0141129 A1 | 6/2010 | Fukuoka et al. | |
| 2011/0215301 A1* | 9/2011 | Forrest | 257/40 |

FOREIGN PATENT DOCUMENTS

| | | |
|---|---|---|
| CN | 101399315 A | 4/2009 |
| CN | 101459224 A | 6/2009 |
| EP | 1 017 118 A2 | 7/2000 |
| EP | 1 565 041 A1 | 8/2005 |
| EP | 2 117 063 A1 | 11/2009 |

(Continued)

OTHER PUBLICATIONS

Brooks et al. Proceedings of SPIE vol. 5519, 2004, 35-41. Year of publication: 2004.*

(Continued)

*Primary Examiner* — Andrew K Bohaty
(74) *Attorney, Agent, or Firm* — Husch Blackwell LLP

(57) ABSTRACT

Disclosed is a light-emitting element which includes a first light-emitting layer over and in contact with a hole-transport layer and a second light-emitting layer over and in contact with the first light-emitting layer. The first and the second light-emitting layers contain a bipolar host material and an emissive guest material. The guest material in the first light-emitting layer has a lower ability for capturing a hole than a guest material in the second light-emitting layer; therefore, the hole-transport property of the first light-emitting layer can be controlled to be higher than that of the second light-emitting layer. The difference in hole-transport property between the first and second light-emitting layers allows a recombination region to be widely spread in the light-emitting layers. An anti-reducing material may be provided in the hole-transport layer, which prevents the hole-transport layer from being reduced by electrons which fail to undergo recombination in the light-emitting layers.

23 Claims, 24 Drawing Sheets

(56) References Cited

FOREIGN PATENT DOCUMENTS

| | | |
|---|---|---|
| JP | 2000-196140 | 7/2000 |
| JP | 2004-6165 | 1/2004 |
| JP | 2004-221045 | 8/2004 |
| JP | 2004-235168 | 8/2004 |
| JP | 2005-26121 | 1/2005 |
| JP | 2005-285708 A | 10/2005 |
| JP | 2005-310741 A | 11/2005 |
| JP | 2006-173050 | 6/2006 |
| JP | 2007-59848 | 3/2007 |
| JP | 2007-91721 | 4/2007 |
| JP | 2007-294261 | 11/2007 |
| JP | 2008-509565 | 3/2008 |
| JP | 2008-198801 | 8/2008 |
| KR | 2009-0036504 A | 4/2009 |
| TW | I306113 B | 2/2009 |
| TW | I308467 B | 4/2009 |
| TW | I311031 B | 6/2009 |
| WO | WO 2006/070619 A1 | 7/2006 |
| WO | WO 2007/029530 A1 | 3/2007 |
| WO | WO 2008/102644 A1 | 8/2008 |
| WO | WO 2009/070382 A1 | 6/2009 |

OTHER PUBLICATIONS

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

Goldsmith, C.R. et al., "C—H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Ohnishi, T. et al, "A Method of Measuring an Energy Level," *High Molecular EL Materials Development of Light-Emitting High Molecular Compounds*, Kyoritsu Shuppan, Dec. 25, 2004, p. 64-67 (with English translation, pp. 1-3).

International Search Report re application No. PCT/JP2010/063595, dated Nov. 22, 2010.

Written Opinion re application No. PCT/JP2010/063595, dated Nov. 22, 2010.

Search Report re European application No. EP 10813604.5, dated Feb. 21, 2013.

Chinese Office Action re Application No. CN 201080039512.9, dated Apr. 24, 2014.

Korean Office Action re Application No. KR 2012-7008674, dated Sep. 29, 2015.

\* cited by examiner

LIGHT-EMITTING ELEMENT WITH MULTIPLE LIGHT-EMITTING LAYERS HAVING CONTROLLED CARRIER MOBILITY AND LIGHTING DEVICE AND ELECTRONIC DEVICE USING THE SAME

TECHNICAL FIELD

The present invention relates to a light-emitting element, a light-emitting device, and a manufacturing method thereof.

BACKGROUND ART

In recent years, research and development have been extensively conducted on light-emitting elements using electroluminescence. Such a light-emitting element has a structure where a layer containing a material with a light-emitting property is interposed between a pair of electrodes. By application of a voltage between the pair of electrodes, light can be emitted from the material with a light-emitting property.

Characteristic features of the light-emitting element using electroluminescence can be found in its advantages in being manufactured to be thin and lightweight and having very fast response time. There are various possible applications of such a self-luminous light-emitting element. For example, the light-emitting element is preferably used for a flat panel display because it has advantages such as high visibility of pixels as compared to a liquid crystal display and ability to display bright image despite the absence of a backlight.

Furthermore, by applying the light-emitting element using electroluminescence, a planar light-emitting device with a large area can be easily formed. This is a feature which is difficult to obtain in point light sources typified by an incandescent lamp and an LED, or line light sources typified by a fluorescent bulb. In addition, such a light-emitting element has attracted attention as a preferable next-generation lighting device because it is estimated to have higher emission efficiency than filament bulbs or fluorescent bulbs.

The light-emitting elements using electroluminescence are roughly classified in accordance with whether they include an organic compound or an inorganic compound as a material with a light-emitting property. When the light-emitting element using electroluminescence uses an organic compound as a material with a light-emitting property, light is emitted in the following manner. First, a voltage is applied to a pair of electrodes between which a layer containing a material with a light-emitting property, in other words, an EL layer, is interposed, so that electrons and holes are transported from one electrode and the other electrode, respectively. The electrons and holes which are transported to the EL layer are recombined to form an excited state of the organic compound which emits light in relaxing to a ground state.

Such a light-emitting element which emits light by the transport of electrons and holes to the light-emitting layer is called a current excitation type light-emitting element. Note that the excited state of an organic compound can be a singlet excited state or a triplet excited state, and light emission from the singlet excited state is referred to as fluorescence, and light emission from the triplet excited state is referred to as phosphorescence.

In improving element characteristics of such a light-emitting element, there are many problems. Therefore, improvement in an element structure, development of a material, and the like have been carried out in order to solve the problems.

For example, in terms of improving emission efficiency, it is preferable that the light-emitting element realize a state where the numbers of electrons and holes which are transported to the light-emitting layer are balanced, i.e., a state where the balance of carriers is achieved, which achieves efficient recombination to result in increase in emission efficiency.

As an example of a known method for achieving a well balance of carriers, there is a method for providing a hole-transport layer between an anode and the light-emitting layer in the light-emitting element, and an electron-transport layer between the light-emitting layer and a cathode in the light-emitting element. Another method for achieving a well-controlled balance of carriers transported to the light-emitting layer includes the adjustment of the carrier-transporting abilities and thicknesses of the hole-transport layer and the electron-transport layer.

In Non-Patent Document 1, a method for preventing holes from leaking from a light-emitting layer to a cathode side with the use of a hole-blocking layer provided between the light-emitting layer and the cathode is disclosed. The holes are confined in the light-emitting layer, whereby the recombination of the electrons and the holes in the light-emitting layer is facilitated. As a result, the emission efficiency of a phosphorescent material is successfully increased.

REFERENCE

Non-Patent Document

Tetsuo TSUTSUI, et al., *Japanese Journal of Applied Physics*, vol. 38, L 1502-L 1504 (1999).

DISCLOSURE OF INVENTION

The numbers of holes and electrons which are transported to a light-emitting layer is influenced by various factors such as the selection of a material, a thickness, and an interface state of layers included in a light-emitting element. Therefore, it is difficult to achieve and maintain the balance of carriers.

In a state where the numbers of electrons and holes which are transported to the light-emitting layer are not well balanced, some of the holes transported from a hole-transport layer side might pass through the light-emitting layer and reach an electron-transport layer, or some of the electrons transported from an electron-transport layer side might pass through the light-emitting layer and reach the hole-transport layer.

Carriers which have passed from one side of the light-emitting layer to the other side without recombination cause the decrease in emission efficiency and the decrease in reliability of the light-emitting element. That is, the carriers which pass through the light-emitting layer without recombination corresponds to a current which does not cause light emission; therefore, the emission efficiency decreases. Further, holes which have passed through the light-emitting layer and have reached the electron-transport layer might oxidize the electron-transport layer, resulting in deterioration in the electron-transport layer. In a similar manner, electrons which have passed through the light-emitting layer and have reached the hole-transport layer might reduce the hole-transport layer, resulting in deterioration in the hole-transport layer.

As a result, a method of using a carrier-blocking layer has been proposed in order to confine carriers in the light-emitting layer. However, there is a case where carriers which are confined by this method serve as quenchers, resulting in the decrease in emission efficiency. For example, in the case where a hole-blocking layer is provided in contact with the cathode side of the light-emitting layer so that holes are confined in the light-emitting layer, the holes (i.e., cationic species) exist in the vicinity of the interface between the light-emitting layer and the hole-blocking layer. Since the cationic species often serve as quenchers, the emission efficiency of the element is diminished.

It is an object of an embodiment of the present invention to provide a light-emitting element with high emission efficiency. It is another object to provide a highly reliable light-emitting element whose luminance is not decreased easily during operation. It is another object to provide a light-emitting element which is driven at a low voltage.

An embodiment of the present invention is a light-emitting element including at least a first light-emitting layer whose one side is in contact with a hole-transport layer and a second light-emitting layer which is in contact with the other side of the first light-emitting layer. Both the first light-emitting layer and the second light-emitting layer contain a bipolar host material and a guest material which is a light-emitting material. The guest material contained in the first light-emitting layer has a lower ability for capturing a hole than the guest material contained in the second light-emitting layer; therefore, the hole-transport property of the first light-emitting layer is higher than that of the second light-emitting layer. As a result, holes are transported to a region apart from the hole-transport layer, and a recombination region of holes and electrons is not formed in the vicinity of the interface between the first light-emitting layer and the hole-transport layer but is formed widely in the light-emitting layers. Furthermore, an anti-reducing material may be contained in the hole-transport layer so that the hole-transport layer is not reduced by electrons passing through the light-emitting layers and reaching the hole-transport layer.

That is, an embodiment of the present invention is a light-emitting element including at least a first light-emitting layer whose one side is in contact with a hole-transport layer, and a second light-emitting layer which is in contact with the other side of the first light-emitting layer. Both the first light-emitting layer and the second light-emitting layer contain a bipolar host material and a guest material which is a light-emitting material. The guest material contained in the first light-emitting layer has a low ability for capturing a hole than the guest material contained in the second light-emitting layer, and the hole-transport layer contains an anti-reducing material.

Another embodiment of the present invention is the above-described light-emitting element in which the HOMO level of the light-emitting material (or a first light-emitting material) contained in the first light-emitting layer ($HOMO_{EM1}$) is shallower than or substantially equal to the HOMO level of the host material (or a first host material) contained in the first light-emitting layer ($HOMO_{HOST1}$), in which the HOMO level of the light-emitting material (or a second light-emitting material) contained in the second light-emitting layer ($HOMO_{EM2}$) is shallower than or substantially equal to the HOMO level of the host material (or a second host material) contained in the second light-emitting layer ($HOMO_{HOST2}$), and in which the absolute value of the difference between $HOMO_{EM2}$ and $HOMO_{HOST2}$ ($\Delta HOMO_{EM2\text{-}HOST2}$) is larger than the absolute value of the difference between $HOMO_{EM1}$ and $HOMO_{HOST1}$ ($\Delta HOMO_{EM1\text{-}HOST1}$) ($|\Delta HOMO_{EM1\text{-}HOST1}| < |\Delta HOMO_{EM2\text{-}HOST2}|$).

Another embodiment of the present invention is the above-described light-emitting element in which $HOMO_{EM1}$ is deeper than or substantially equal to $HOMO_{EM2}$.

Another embodiment of the present invention is the above-described light-emitting element in which the HOMO level of the host material contained in the first light-emitting layer ($HOMO_{HOST1}$) is deeper than or substantially equal to the HOMO level of the host material contained in the second light-emitting layer ($HOMO_{HOST2}$).

Another embodiment of the present invention is the above-described light-emitting element in which the first light-emitting layer and the second light-emitting layer contain the same host material.

Another embodiment of the present invention is the above-described light-emitting element in which the first light-emitting layer and the second light-emitting layer contain light-emitting materials of different emission colors.

Another embodiment of the present invention is the above-described light-emitting element in which the LUMO level of the light-emitting material contained in the first light-emitting layer ($LUMO_{EM1}$) is deeper than or substantially equal to the LUMO level of the host material contained in the first light-emitting layer ($LUMO_{HOST1}$), in which the LUMO level of the light-emitting material contained in the second light-emitting layer ($LUMO_{EM2}$) is deeper than or substantially equal to the LUMO level of the host material contained in the second light-emitting layer ($LUMO_{HOST2}$), in which $LUMO_{EM1}$ is deeper than or substantially equal to $LUMO_{EM2}$, and in which the absolute value of the difference between $LUMO_{HOST1}$ and $LUMO_{EM1}$ ($\Delta LUMO_{HOST\text{-}EM1}$) is larger than the absolute value of the difference between $LUMO_{HOST2}$ and $LUMO_{EM2}$ ($\Delta LUMO_{HOST2\text{-}EM2}$) ($|\Delta LUMO_{HOST1\text{-}EM1}| > |\Delta LUMO_{HOST2\text{-}EM2}|$).

Another embodiment of the present invention is the above-described light-emitting element including a third light-emitting layer between the second light-emitting layer and an electron-transport layer, the third light-emitting layer contains a host material (or a third host material) and a light-emitting material (or a third light-emitting material), in which the HOMO level of the light-emitting material contained in the first light-emitting layer ($HOMO_{EM1}$) is shallower than or substantially equal to the HOMO level of the host material contained in the first light-emitting layer ($HOMO_{HOST1}$), in which the HOMO level of the light-emitting material contained in the second light-emitting layer ($HOMO_{EM2}$) is shallower than or substantially equal to the HOMO level of the host material contained in the second light-emitting layer ($HOMO_{HOST2}$), in which the HOMO level of the light-emitting material contained in the third light-emitting layer ($HOMO_{EM3}$) is shallower than or substantially equal to the HOMO level of the host material contained in the third light-emitting layer ($HOMO_{HOST3}$), and in which the absolute value of the difference between $HOMO_{EM1}$ and $HOMO_{HOST1}$ ($|\Delta HOMO_{EM1\text{-}HOST1}|$) is smaller than or equal to the absolute value of the difference between $HOMO_{EM2}$ and $HOMO_{HOST2}$ ($|\Delta HOMO_{EM2\text{-}HOST2}|$) and the absolute value of the difference between $HOMO_{EM3}$ and $HOMO_{HOST3}$ ($|\Delta HOMO_{EM3\text{-}HOST3}|$) is larger than the absolute value of the difference between $HOMO_{EM2}$ and $HOMO_{HOST2}$ ($|\Delta HOMO_{EM2\text{-}HOST2}|$) ($|\Delta HOMO_{EM1\text{-}HOST1}| \leq |\Delta HOMO_{EM2\text{-}HOST2}| < |\Delta HOMO_{EM3\text{-}HOST3}|$).

Another embodiment of the present invention is the above-described light-emitting element in which a metal oxide is contained in the hole-transport layer as the anti-reducing material.

Another embodiment of the present invention is the above-described light-emitting element in which the anti-reducing material is an organic compound, in which the LUMO level of the anti-reducing material ($LUMO_{ARM}$) is deeper than the LUMO level of the host material contained in the first light-emitting layer ($LUMO_{HOST1}$), in which a band gap of the anti-reducing material ($\Delta E_{ARM}$) is wider than a band gap of the light-emitting material contained in the first light-emitting layer ($\Delta E_{EM1}$), and in which the HOMO level of the anti-reducing material ($HOMO_{ARM}$) is deeper than the HOMO level of the organic compound contained in the hole-transport layer ($HOMO_{HTL}$).

Another embodiment of the present invention is the above-described light-emitting element in which the hole-transport layer contains the anti-reducing material and is in direct contact with an anode.

With the above structure, at least one of the above objects can be achieved.

In this specification, an EL layer refers to a layer provided between electrodes or intermediate layers in a light-emitting element using electroluminescence, and the layer contains at least a light-emitting material. Therefore, a light-emitting layer containing an organic compound with a light-emitting property and interposed between a pair of electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that in this specification, a bipolar material refers to a material which is capable of an oxidation (a reaction in which electrons are removed from a substance) and a reduction (a reaction in which electrons are donated to a substance) and is comparatively stable with respect to either reaction (stable after either reaction).

In addition, a HOMO level refers to a level of a highest occupied molecular orbital, and a LUMO level refers to a level of a lowest unoccupied molecular orbital. In the case where orbital levels are referred to as being "substantially equal," a difference therebetween is less than or equal to 0.2 (eV).

Note that in this specification, an anti-reducing material refers to a material which protects a coexisting material from a reduction and also, for example, a material which is reduced more easily (which accepts electrons more easily) than a coexisting organic material in an EL layer and which is stable with respect to a reduction (which is stable in a reduced state). Further, in this specification, the term "composite" does not simply mean a state in which two materials are mixed but also means a state in which electric charges are donated and received between a plurality of materials by mixing of the plurality of materials. In addition, a composite material refers to a material which exists in such a state.

Note that in this specification, a light-emitting device refers to an image display unit, a light-emitting unit, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted on a substrate over which a light-emitting element is formed by a COG (chip on glass) method.

With the present invention, a light-emitting element with high emission efficiency can be provided. Further, a highly reliable light-emitting element whose luminance is not decreased easily during operation can be provided. Furthermore, a light-emitting element which is driven at a low voltage can be provided.

BEST MODE FOR CARRYING OUT THE INVENTION

Embodiments of the present invention are described below with reference to drawings. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of embodiments given below.

Embodiment 1

A light-emitting element which is described in this embodiment includes at least a first light-emitting layer whose one side is in contact with a hole-transport layer and a second light-emitting layer which is in contact with the other side of the first light-emitting layer. Both the first light-emitting layer and the second light-emitting layer contain a bipolar host material and a guest material which is a light-emitting material. The guest material contained in the first light-emitting layer has a lower ability for capturing a hole than the guest material contained in the second light-emitting layer; therefore, the hole-transport property of the first light-emitting layer is higher than that of the second light-emitting layer. As a result, holes are transported into a region apart from the hole-transport layer, and a recombination region of holes and electrons are formed widely in the light-emitting layers. Furthermore, an anti-reducing material is contained in the hole-transport layer so that the hole-transport layer is not deteriorated by electrons passing through the light-emitting layers and reaching the hole-transport layer.

Figure 1A:
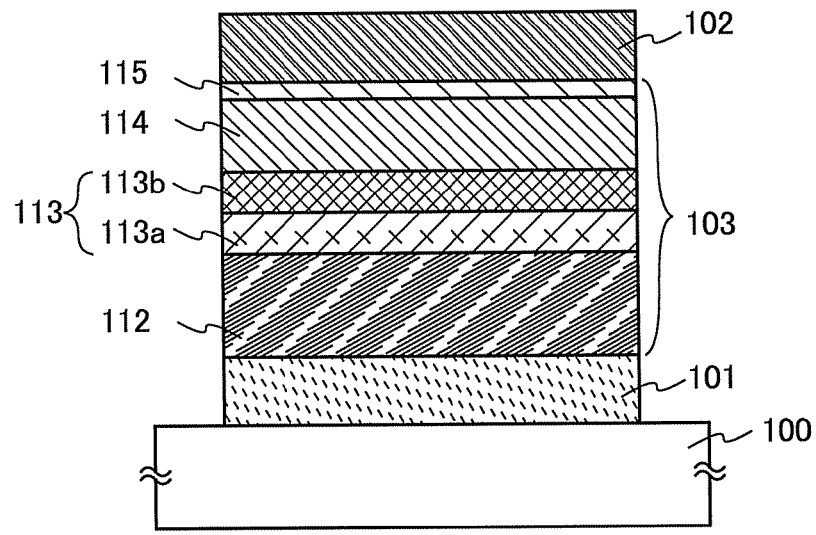
FIGS. 1A and 1B illustrate a light-emitting element according to an embodiment.

FIG. 1A illustrates a structure of the light-emitting element of this embodiment. The light-emitting element of this embodiment includes a first electrode 101, a second electrode 102, and an EL layer 103. The first electrode 101 is formed over a substrate 100. Note that in this embodiment, mainly described is the case where the first electrode 101 serves as an anode and the second electrode 102 serves as a cathode.

The EL layer 103 includes at least a hole-transport layer 112, a first light-emitting layer 113a, and a second light-emitting layer 113b. Further, an electron-transport layer 114, an electron-injection layer 115, and the like are combined as appropriate. The hole-transport layer 112 is provided between the electrode serving as an anode and the first light-emitting layer 113a and is in contact with a side on the anode side of the first light-emitting layer 113a. The second light-emitting layer 113b is provided between the first light-emitting layer 113a and the electrode serving as a cathode and is in contact with a side on the cathode side of the first light-emitting layer 113a. The electron-transport layer 114 is provided between the second light-emitting layer 113b and the electrode serving as a cathode and is in contact with a side on the cathode side of the second light-emitting layer 113b. The electron-injection layer 115 is provided between the electron-transport layer 114 and the electrode serving as a cathode and is in contact with the electrode serving as a cathode.

Figure 1B:
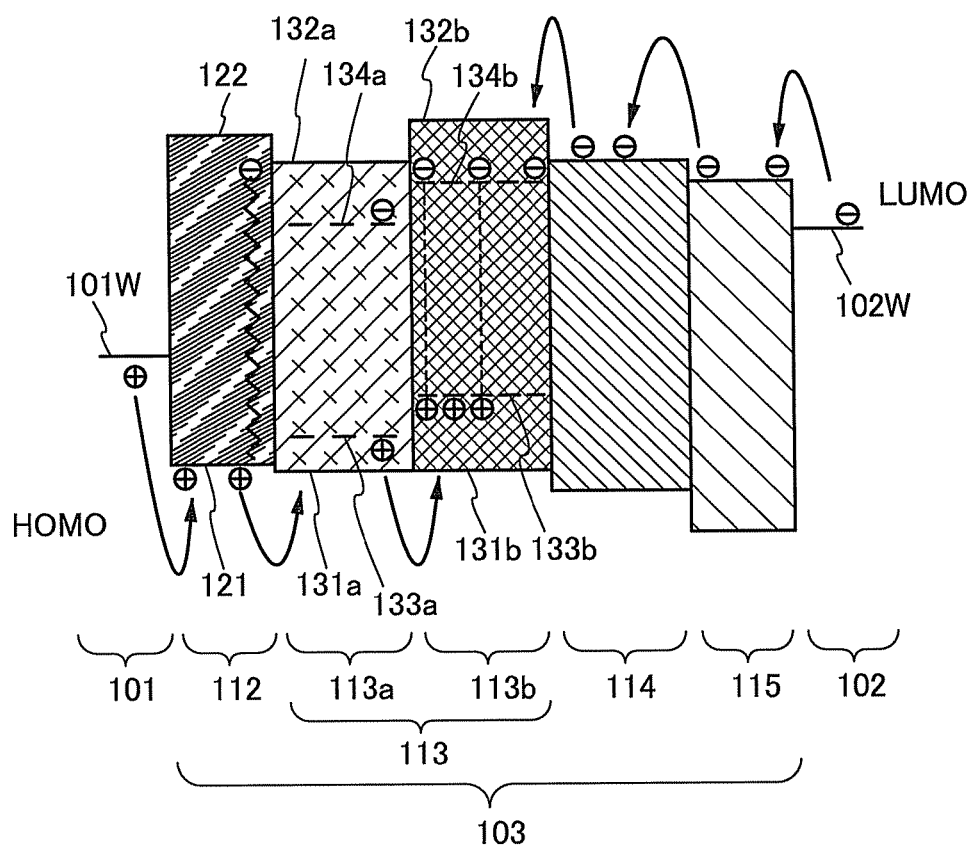

Next, the behavior of carriers in the light-emitting element of this embodiment is described. FIG. 1B is a band diagram illustrating the correlation of bands of layers in the EL layer of the light-emitting element illustrated in this embodiment.

First, the structure of the EL layer and the behavior of holes which move in the EL layer are described.

In the light-emitting element of this embodiment, holes are transported through the hole-transport layer 112 to a light-emitting layer 113. The hole-transport layer 112 contains a first organic compound and an anti-reducing material and has a high hole-transport property. It is preferable that a HOMO level 121 of the first organic compound contained in the hole-transport layer 112 ($HOMO_{HTL}$) be deeper than or substantially equal to a HOMO level 131a of the host material contained in the first light-emitting layer 113a ($HOMO_{HOST1}$) (the absolute value of $HOMO_{HTL}$ be larger than or substantially equal to that of $HOMO_{HOST1}$), because injection of holes from the hole-transport layer 112 to the first light-emitting layer 113a is facilitated and the light-emitting element can be driven at a lower voltage.

Further, when a composite layer formed using the first organic compound and an acceptor material functioning as an anti-reducing material is used as the hole-transport layer 112, the hole-transport layer 112 can also serve as a hole-injection layer, whereby the hole-transport layer 112 can be formed in contact with the anode, and the structure of the light-emitting element can be simplified. Note that a structure in which a hole-injection layer is additionally interposed between the first electrode 101 serving as an anode and the hole-transport layer 112 may be used.

Both the first light-emitting layer 113a and the second light-emitting layer 113b contain a host material and a guest material.

Note that the host materials of the first light-emitting layer 113a and the second light-emitting layer 113b may be the same or different. At least, the host materials are bipolar and are stable with respect to an oxidation and a reduction. Therefore, the first light-emitting layer 113a and the second light-emitting layer 113b can transport both holes and electrons.

Light-emitting materials are contained in the first light-emitting layer 113a and the second light-emitting layer 113b as the guest materials and have influence on the carrier-transport rate.

The relationship among the HOMO level 131a of the host material contained in the first light-emitting layer 113a ($HOMO_{HOST1}$), a HOMO level 133a of the light-emitting material contained in the first light-emitting layer 113a ($HOMO_{EM1}$), a HOMO level 131b of the host material contained in the second light-emitting layer 113b ($HOMO_{HOST2}$), and a HOMO level 133b of the light-emitting material contained in the second light-emitting layer 113b ($HOMO_{EM2}$) is described below (see FIG. 1B). Note that FIG. 1B also illustrates a work function 101W of the first electrode 101, a work function 102W of the second electrode 102, and the HOMO level 121 and a LUMO level 122 of the hole-transport layer 112 of the light-emitting element of this embodiment. (FIG. 1B is a schematic view illustrating the correlation of orbital levels of the layers included in the EL layer 103. A rectangle in FIG. 1B represents each layer. The lower side of the rectangle represents the HOMO level of a main material or a host material of each layer, and the upper side of the rectangle represents the LUMO level of the main material or the host material of each layer. The dashed lines in the rectangle schematically represent the HOMO level and the LUMO level of a guest material contained in each layer.) Note that the phrase "the orbital level of B is deeper than the orbital level of A" means that the energy of the orbital level of B is lower than the energy of the orbital level of A, and the phrase "the orbital level of B is shallower than the orbital level of A" means that the energy of the orbital level of B is higher than the energy of the orbital level of A.

In the EL layer 103, $HOMO_{HOST2}$ is shallower than or substantially equal to $HOMO_{HOST1}$. $HOMO_{EM1}$ is shallower than or substantially equal to $HOMO_{HOST1}$, $HOMO_{EM2}$ is shallower than or substantially equal to $HOMO_{HOST2}$, and $HOMO_{EM2}$ is shallower than or substantially equal to $HOMO_{EM1}$. In addition, the absolute value of the difference between $HOMO_{EM2}$ and $HOMO_{HOST2}$ ($\Delta HOMO_{EM2-HOST2}$) is larger than the absolute value of the difference between $HOMO_{EM1}$ and $HOMO_{HOST1}$ ($\Delta HOMO_{EM1-HOST1}$) ($|\Delta HOMO_{EM1-HOST1}| < |\Delta HOMO_{EM2-HOST2}|$).

It is possible to assume that $\Delta HOMO_{EM1-HOST1}$ is a depth of a hole trap level formed by the light-emitting material, which is the guest material, in the first light-emitting layer 113a, and that $\Delta HOMO_{EM2\text{-}HOST2}$ is a depth of a hole trap level formed by the light-emitting material, which is the guest material, in the second light-emitting layer 113b. That is, the hole trap level formed in the second light-emitting layer 113b is deep (the absolute value thereof is large) as compared with that formed in the first light-emitting layer 113a.

Since holes are captured at the hole trap level, the hole trap level has influence on the hole-transport property of the light-emitting layer. In addition, the degree of the influence depends on the depth of the trap level. Specifically, in the first light-emitting layer 113a, holes are easily transported as compared with in the second light-emitting layer 113b which has a deep trap level.

With such a structure, the hole-transport property of the first light-emitting layer 113a can be higher than the hole-transport property of the second light-emitting layer 113b in the light-emitting element of this embodiment. As a result, holes which are transported from the anode through the hole-transport layer 112 to the first light-emitting layer 113a are further transported to the inside of the second light-emitting layer 113b which is apart from the hole-transport layer 112, whereby a recombination region with electrons is formed mainly in the second light-emitting layer 113b. Furthermore, by providing the second light-emitting layer 113b with a suppressed hole-transport property, it is possible to prevent holes from being transported through the light-emitting layer 113 into the electron-transport layer 114 located on the cathode side.

Next, the behavior of electrons which move in the EL layer and recombination of holes and electrons are described.

With the electron-injection layer 115, electrons are transported from the second electrode 102 serving as a cathode to the electron-transport layer 114. The electron-transport layer 114 has a high electron-transport property, so that the electrons are transported to the second light-emitting layer 113b.

Since the hole-transport property of the second light-emitting layer 113b is suppressed due to its deep trap level, the electrons transported from the electron-transport layer 114 are recombined with holes with high efficiency in the second light-emitting layer 113b. The recombination of the electrons and the holes allows the guest material to be excited, resulting in light emission.

Further, even in the case where electrons leak from the second light-emitting layer 113b to the first light-emitting layer 113a without being recombined with holes in the second light-emitting layer 113b, the electrons which fail to undergo recombination can be recombined with holes in the first light-emitting layer 113a, and a light-emitting material which is added to the first light-emitting layer 113a can emit light. Thus, emission efficiency is not diminished. In this manner, not only the second light-emitting layer 113b but also a wide region of the light-emitting layer 113 including both the first light-emitting layer 113a and the second light-emitting layer 113b can be used as a region which can emit light, the probability of recombination of holes and electrons can be increased. Thus, the emission efficiency can be increased.

Note that in the case where electrons reach the hole-transport layer 112 without being recombined with holes in the second light-emitting layer 113b and the first light-emitting layer 113a, the emission efficiency may be diminished, and the hole-transport layer 112 might deteriorate. However, deterioration of the hole-transport layer 112 can be prevented because the hole-transport layer 112 which is illustrated in this embodiment contains the anti-reducing material in addition to the first organic compound. The anti-reducing material accepts electrons which have reached the hole-transport layer 112 instead of the first organic compound, so that deterioration of the first organic compound by a reduction can be prevented. Note that the anti-reducing material does not emit light in the hole-transport layer 112.

HOMO levels and LUMO levels of materials used in the light-emitting element of an embodiment of the present invention can be measured by a variety of methods. Specifically, there are a method with cyclic voltammetry measurement, a method in which a HOMO level is measured with use of a photoelectron spectrometer and a LUMO level is estimated by obtaining an energy gap in a solid state from an absorption edge obtained from Tauc plot of an absorption spectrum, and the like. A measurement method is described in detail in Example 2 below.

Materials contained in layers of the light-emitting element of this embodiment are described in detail.

The substrate 100 is used as a support of the light-emitting element. For example, glass, quartz, plastics, or the like can be used for the substrate 100 as long as it has heat resistance with which the substrate can withstand the temperature of the manufacturing process of the light-emitting element of this embodiment.

As specific examples of the glass substrate, any of the following substrates can be used: non-alkaline glass substrates formed using barium borosilicate glass, aluminoborosilicate glass, aluminosilicate glass, and the like formed by a fusion method or a float method; ceramic substrates; plastic substrates having heat resistance high enough to withstand a process temperature of this manufacturing process; and the like. For example, a glass substrate which contains more barium oxide (BaO) than boric acid ($B_2O_3$) and has a strain point of 730° C. or higher is preferable. This is because the glass substrate does not strain even when the semiconductor layer is thermally processed at high temperatures of about 700° C.

In the case where the substrate 100 is a mother glass, the substrate may have any of the following sizes: the first generation (320 mm×400 mm), the second generation (400 mm×500 mm), the third generation (550 min×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

A metal substrate such as a stainless steel alloy substrate which is provided with an insulating film over the surface may also be used. A plastic substrate has features such as being lightweight, being flexible, and making visible light transmitted, which are attractive as a substrate of a light-emitting element. A plastic substrate which a film with moisture resistance is deposited on or attached to may be used so that the light-emitting element can be protected against an impurity such as water.

In addition, an insulating film as a base film may be formed over the substrate 100. The base film may be formed to have a single-layer structure or a stacked-layer structure of a silicon oxide film, a silicon nitride film, a silicon oxynitride film, and/or a silicon nitride oxide film by a CVD method, a sputtering method, or the like. Further, the substrate 100 in which a driver circuit of a light-emitting device, or the like is separately manufactured may be used, and an EL layer may be formed over a first electrode which is electrically connected to the driver circuit. By forming an insulating film, a substrate having conductivity can have an insulating surface. In addition, the formation of an insulating film can prevent an impurity from diffusing from the substrate into the light-emitting element.

The first electrode 101 is formed over the substrate 100. In the case where the first electrode 101 is used as an anode, a metal, an alloy, an electroconductive compound, a mixture thereof, or the like having a high work function (specifically, a work function of 4.0 eV or more) is preferably used. Specifically, for example, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like are given. In addition, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (for example, titanium nitride), and the like can be given.

These materials are generally deposited by a sputtering method. For example, indium oxide-zinc oxide (IZO) can be deposited by a sputtering method with the use of a target in which 1 wt % to 20 wt % of zinc oxide is mixed into indium oxide. Indium oxide containing tungsten oxide and zinc oxide (IWZO) can be formed by a sputtering method using a target in which 0.5 wt % to 5 wt % of tungsten oxide and 0.1 wt % to 1 wt % of zinc oxide are mixed into indium oxide. Alternatively, by application of a sol-gel method or the like, an ink-jet method, a spin coating method, or the like may be used.

Note that in the case where a layer including a composite material described below is used as the layer in contact with the first electrode 101, which is included in the EL layer 103 formed over the first electrode 101 serving as an anode, any of a variety of metals, alloys, electroconductive compounds, and a mixture thereof can be used as a material used for the first electrode 101, regardless of whether the work function is high or low. For example, aluminum (Al), silver (Ag), an alloy containing aluminum (e.g., AlSi), or the like can also be used.

Alternatively, any of the following low-work function materials can be used: elements belonging to Group 1 or Group 2 of the periodic table, that is, alkali metals such as lithium (Li) and cesium (Cs), alkaline-earth metals such as magnesium (Mg), calcium (Ca), and strontium (Sr), and alloys thereof (e.g., MgAg and AlLi); rare earth metals such as europium (Eu) and ytterbium (Yb), and alloys thereof; and the like.

Note that in the case where the first electrode 101 is formed using an alkali metal, an alkaline-earth metal, or an alloy thereof, a vacuum evaporation method or a sputtering method can be used. Alternatively, in the case where a silver paste or the like is used, a coating method, an ink-jet method, or the like can be used.

The EL layer 103 formed over the first electrode 101 can be formed using a known material, and either a low molecular compound or a high molecular compound can be used as long as the aforementioned correlation of the bands of the layers in the EL layer 103 is maintained. Note that the material contained in the EL layer 103 is not limited to organic compounds, and it may partially contain an inorganic compound.

Here, materials contained in the layers of the EL layer 103 are described in detail.

The hole-transport layer 112 contains the first organic compound and an anti-reducing material. In particular, a composite material formed by adding an acceptor material as an anti-reducing material to the first organic compound exhibits a hole-transport property and stability with respect to reduction by an electron transported from the light-emitting layer. Further, the composite material also has a high hole-injection property; thus, the hole-transport layer 112 formed using the composite material can also serve as a hole-injection layer.

As the acceptor material used for the anti-reducing material, organic compounds such as 7,7,8,8-tetracyano-2,3,5,6-tetrafluoroquinodimethane (abbreviation: $F_4$-TCNQ) and chloranil, and a transition metal oxide can be given. In addition, oxides of metals belonging to any one of Groups 4 to 8 of the periodic table can also be given. Specifically, vanadium oxide, niobium oxide, tantalum oxide, chromium oxide, molybdenum oxide, tungsten oxide, manganese oxide, and rhenium oxide are preferable because their electron-accepting properties are high. Among these metal oxides, molybdenum oxide is especially preferable since it is stable in the air, its hygroscopic property is low, and it is easily treated.

As the first organic compound for forming the composite material together with the acceptor material, various compounds such as an aromatic amine compound such as a triaryl amine, a carbazole derivative, aromatic hydrocarbon, and a compound with a high molecular weight (such as oligomer, dendrimer, or polymer) can be used. Note that the first organic compound used for the composite material is preferably an organic compound having a high hole-transport property. Specifically, a substance having a hole mobility of $10^{-6}$ cm$^2$/Vs or higher is preferably used. However, substances other than the above-described materials may also be used as long as the substances have higher hole-transport properties than electron-transport properties. Examples of the first organic compound which can be used for the composite material are specifically listed below.

As the first organic compound which can be used for the composite material, the following can be given, for example: aromatic amine compounds such as 4,4',4"-tris[N-(3-methylphenyl)-N-phenylamino]triphenylamine (abbreviation: MTDATA), 4,4',4"-tris(N,N-diphenylamino)triphenylamine (abbreviation: TDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), N-(4-biphenyl)-4-(carbazol-9-yl)phenylaniline (abbreviation: YGA1BP), 4-phenyl-4'-(1-naphthyl)triphenylamine (abbreviation: αNBA1BP), and 4,4',4"-tri(N-carbazolyl)triphenylamine (abbreviation: TCTA); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Further, the following can be given: aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10- bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Further, the following can be given: aromatic hydrocarbon compounds such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Further, high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), and the like can be used.

In the case where a composite material formed by adding an acceptor material as an anti-reducing material to the first organic compound is used for the hole-transport layer 112, it is not necessary to provide a hole-injection layer because the hole-transport layer 112 has a high hole-injection property. Further, a material for the first electrode 101 serving as an anode is not limited to a material having a high work function, and the first electrode 101 serving as an anode can be formed using a material having a low work function.

Such a composite material can be formed by co-evaporation of the first organic compound and the anti-reducing material.

As an example of an anti-reducing material other than the acceptor material, an organic compound whose LUMO level is deeper than that of the host material of the first light-emitting layer 113a, whose band gap is wider than that of the light-emitting material of the first light-emitting layer 113a, and whose HOMO level is deeper than that of the first organic compound of the hole-transport layer 112 can be given. The addition of such a material to the hole-transport layer 112 can prevent a reduction of the first organic compound because the material accepts electrons which have leaked from the first light-emitting layer. Note that in the case where an anti-reducing material other than the acceptor material is used, it is preferable to employ a substance having a high hole-transport property as the first organic compound.

As the substance with a high hole-transport property, for example, the following can be given: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB), and the like. The substances mentioned here mainly have a hole mobility of $10^{-6}$ cm$^2$/Vs or higher. However, substances other than the above described substances may also be used as long as the substances have higher hole-transport properties than electron-transport properties. Note that the hole-transport layer 112 is not limited to a single layer, and may have a structure in which two or more layers containing the aforementioned substance are stacked.

Holes and electrons are injected to the light-emitting layer 113, and the hole-transport property of the first light-emitting layer 113a is higher than the hole-transport property of the second light-emitting layer 113b. Such a light-emitting layer 113 may be formed using a guest material and a material capable of an oxidation and a reduction, that is, a bipolar host material, in appropriate combination.

As such an organic compound which is capable of an oxidation and a reduction and is used as the host material contained in the light-emitting layer 113, a tricyclic condensed aromatic compound, a tetracyclic condensed aromatic compound, a pentacyclic condensed aromatic compound, and a hexacyclic condensed aromatic compounds are given, for example. Specifically, an anthracene derivative, a phenanthrene derivative, a pyrene derivative, a chrysene derivative, a dibenzo[g,p]chrysene derivative, a triphenylene derivative, a naphthacene derivative, and the like are given. Another example is an anthracene derivative having a carbazolyl group.

For example, the following can be given: 9,10-diphenylanthracene (abbreviation: DPAnth), N,N-diphenyl-9-[4-(10-phenyl-9-anthryl)phenyl]-9H-carbazol-3-amine (abbreviation: CzA1PA), 9-phenyl-9'-[4-(10-phenyl-9-anthryl)phenyl]-3,3'-bi(9H-carbazole) (abbreviation: PCCPA), 6,12-dimethoxy-5,11-diphenylchrysene, 9-[4-(10-phenyl-9-anthryl)phenyl]-9H-carbazole (abbreviation: CzPA), 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (t-BuDNA), 9,9'-bianthryl (abbreviation: BANT), 9-[4-(9-phenylcarbazol-3-yl)]phenyl-10-phenylanthracene (abbreviation: PCzPA), 9-[4-(3-phenyl-9H-carbazol-9-yl)phenyl]-10-phenylanthracene (abbreviation: CzPAP), 9,10-bis[4-(9-phenylcarbazol-3-yl)]phenyl-2-t-butylanthracene (abbreviation: PCzBPA), 3-(9,9-dimethylfluoren-2-yl)-9-[4-(10-phenyl-9-anthryl)phenyl]-9H-carbazole (abbreviation: CzPAFL), 9-{4-[3-(1-naphthyl)-9H-carbazol-9-yl]phenyl}-10-phenylanthracene (abbreviation: CzPAαN), 9-{4-[10-(1-naphthyl)-9-anthryl]phenyl}-9H-carbazole (abbreviation: αNCzPA), 9-[3-(10-phenyl-9-anthryl)phenyl]-9H-carbazole (abbreviation: mCzPA), 9,9'-(stilbene-3,3'-diyl)diphenanthrene (abbreviation: DPNS), 9,9'-(stilbene-4,4'-diyl)diphenanthrene (abbreviation: DPNS2); 3,3',3"-(benzene-1,3,5-triyl)tripyrene (abbreviation: TPB3), and the like.

As the host material used for dispersing the guest material, a mixture of plural kinds of substances can be used. For example, in order to control a carrier-transport property, a material with a high hole-transport property can be mixed with a material having a high electron-transport property, so that the resulting material can be used for the host material.

Further, a polymeric compound can be used for the host material contained in the light-emitting layer 113.

The light-emitting layer 113 contains a light-emitting material as a guest material. As the light-emitting material, for example, the following organic compounds can be given.

As a substance which emits blue light, for example, a substance having an emission peak wavelength greater than or equal to 400 nm and less than 480 nm may be used, and the following can be given: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazole-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), and the like. In addition, a phosphorescent material such as bis[2-(4',6'-difluorophenyl)pyridinato-N,C$^{2'}$]iridium(III)tetrakis(1-pyrazolyl)borate (abbreviation: FIr6) or bis[2-(4',6'-difluorophenyl)pyridinato-N,C$^{2'}$]iridium(III)picolinate (abbreviation: FIrpic) can also be given.

As a substance which emits blue green light, for example, a substance having an emission peak wavelength greater than or equal to 480 nm and less than 520 nm may be used, and the following can be given: N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, and the like. In addition, a phosphorescent material such as bis[2-(3',5'-bistrifluoromethylphenyl)pyridinato-N,C$^{2'}$]iridium(III)picolinate (abbreviation: Ir(CF$_3$ppy)$_2$(pic)) or bis[2-(4',6'-difluorophenyl)pyridinato-N,C$^{2'}$]iridium(III)acetylacetonate (abbreviation: FIracac) can also be given.

As a substance which emits green light, the following can be given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-amine (abbreviation: 2YGABPhA), N,N,9-triphenylanthracen-9-amine (abbreviation: DPhAPhA), coumarin 545T, N,N'-diphenylquinacridone (abbreviation: DPQd), and the like. In addition, the following can be given: tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(III) (abbreviation: Tb(acac)$_3$(Phen)), and the like.

As a substance which emits yellow light, for example, a substance having an emission peak wavelength greater than or equal to 540 nm and less than 600 nm may be used, and the following can be given: rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), and the like. In addition, a phosphorescent material such as bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), or bis(2-phenylbenzothiazolato-N,C$^{2'}$)iridium(III)acetylacetonate (abbreviation: Ir(bt)$_2$(acac)) can also be used.

As a substance which emits red light, for example, a substance having an emission peak wavelength greater than or equal to 600 nm and less than 700 nm may be used, and the following can be given: N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). In addition, a phosphorescent material such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (2,3,7,8,12,13,17,18-octaethyl-21H,23H-porphyrinato)platinum(II) (abbreviation: PtOEP), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) can also be given.

Note that the concentration of the light-emitting material in the second light-emitting layer 113b is preferably lower than or equal to 10% in terms of mass ratio. Further, in the case where the first light-emitting layer 113a and the second light-emitting layer 113b are formed using the same host materials, the concentration of the light-emitting material in the first light-emitting layer 113a is made lower than the concentration of the light-emitting material in the second light-emitting layer 113b.

The electron-transport layer 114 contains a substance with high electron-transport property.

For example, the electron-transport layer 114 is a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), bis(2-methyl-8-quinolinolato)(4-phenylphenolato)aluminum (abbreviation: BAlq), or the like. A metal complex having an oxazole-based or thiazole-based ligand, such as bis[2-(2-hydroxyphenyl)benzoxazolato]zinc (abbreviation: Zn(BOX)$_2$), bis[2-(2-hydroxyphenyl)benzothiazolato]zinc (abbreviation: Zn(BTZ)$_2$), or the like can also be used. In addition to the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here mainly have an electron mobility of 10$^{-6}$ cm$^2$/Vs or higher. The electron-transport layer may be formed using substances other than those described above as long as the materials have electron-transport properties higher than hole-transport properties. Furthermore, the electron-transport layer is not limited to a single layer, and two or more layers including the aforementioned substances may be stacked.

Polymers can also be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injection layer 115 contains a substance with a high electron-injection property.

For example, a compound of an alkali metal or an alkaline-earth metal, such as lithium fluoride (LiF), cesium fluoride (CsF), or calcium fluoride (CaF$_2$) can be used.

A layer of a substance with an electron-transport property which contains an alkali metal, an alkaline-earth metal, or a compound thereof, specifically, a layer of Alq which contains magnesium (Mg), or the like may also be used. Note that in this case, electrons can be more efficiently injected from the second electrode 102.

For the second electrode 102, a metal, an alloy, an electroconductive compound, a mixture thereof, or the like which has a low work function (specifically, a work function of 3.8 eV or less) can be used. As specific examples of such a cathode material, elements that belong to Group 1 or 2 of the periodic table, that is, alkali metals such as lithium (Li) and cesium (Cs), alkaline-earth metals such as magnesium (Mg), calcium (Ca), and strontium (Sr), alloys containing these metals (e.g., MgAg and AlLi), rare earth metals such as europium (Eu) and ytterbium (Yb), alloys containing these metals, and the like can be given.

Note that in the case where the second electrode 102 is formed using an alkali metal, an alkaline-earth metal, or an alloy thereof, a vacuum evaporation method or a sputtering method can be used. In the case of using a silver paste or the like, a coating method, an ink-jet method, or the like can be used.

Note that with the electron-injection layer 115 provided, the second electrode 102 can be formed using any of a variety of conductive materials such as Al, Ag, ITO, and indium oxide-tin oxide containing silicon or silicon oxide regardless of their work functions. A film including such a conductive material can be deposited by a sputtering method, an ink jet method, a spin coating method, or the like.

In order to emit light outside of the light-emitting element of this embodiment, either or both the first electrode 101 or/and the second electrode 102 may be formed using a conductive film having a light-transmitting property.

Note that when only the first electrode 101 is an electrode with a light-transmitting property, light emitted from the EL layer 103 is extracted from the substrate 100 side through the first electrode 101. In contrast, when only the second electrode 102 is an electrode having a light-transmitting property, light emitted from the EL layer 103 is extracted from a side opposite to the substrate 100 through the second electrode 102. Further, when both the first electrode 101 and the second electrode 102 are electrodes with a light-transmitting property, light emitted from the EL layer 103 is extracted from both the substrate 100 side and the side opposite to the substrate 100 through the first electrode 101 and the second electrode 102.

As a method for forming the above-described EL layer 103, various methods can be used regardless of a dry process or a wet process. For example, a vacuum evaporation method, an ink-jet method, a spin coating method, or the like can be used. Note that the layers included in the EL layer 103 may be formed using different formation methods.

The first electrode 101 and the second electrode 102 can be formed by a wet process such as an ink-jet method using a paste of a metal material and a sol-gel method as well as a dry process such as a sputtering method or a vacuum evaporation method.

Note that the structure of the EL layer provided between the first electrode 101 and the second electrode 102 is not limited to the above structure. The structure of the EL layer may be any other structure as long as the following conditions are satisfied: at least the hole-transport layer 112, the first light-emitting layer 113a, and the second light-emitting layer 113b are included; carrier-transport properties of the first light-emitting layer 113a and the second light-emitting layer 113b are bipolar; a hole-transport property of the first light-emitting layer 113a is higher than a hole-transport property of the second light-emitting layer 113b; both the first light-emitting layer 113a and the second light-emitting layer 113b contain a light-emitting material; and the hole-transport layer 112 contains the first organic compound and the anti-reducing material.

Figure 4:
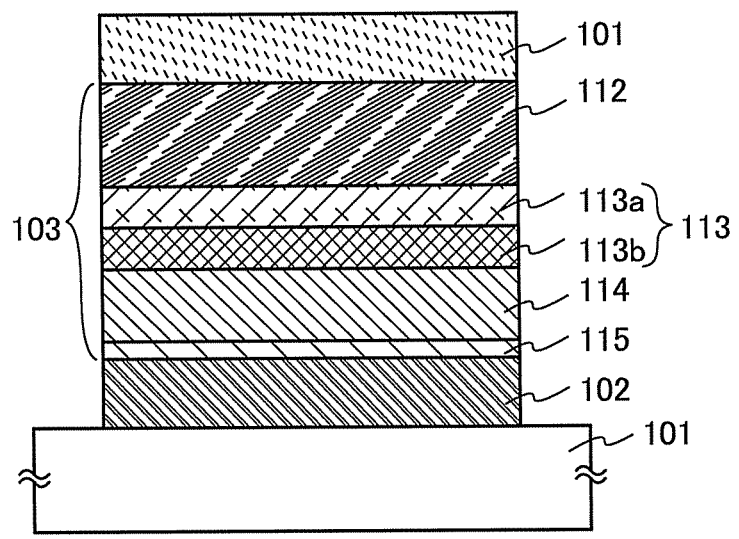
FIG. 4 illustrates a light-emitting element according to an embodiment.

As shown in FIG. 4, it is also possible to employ another structure in which the second electrode 102 serving as a cathode, the EL layer 103, and the first electrode 101 serving as an anode are stacked in that order over the substrate 100. In this case, the EL layer 103 has a structure in which the electron-injection layer 115, the electron-transport layer 114, the second light-emitting layer 113b, the first light-emitting layer 113a, and the hole-transport layer 112 are stacked in that order over the second electrode 102, for example.

Figure 5A:
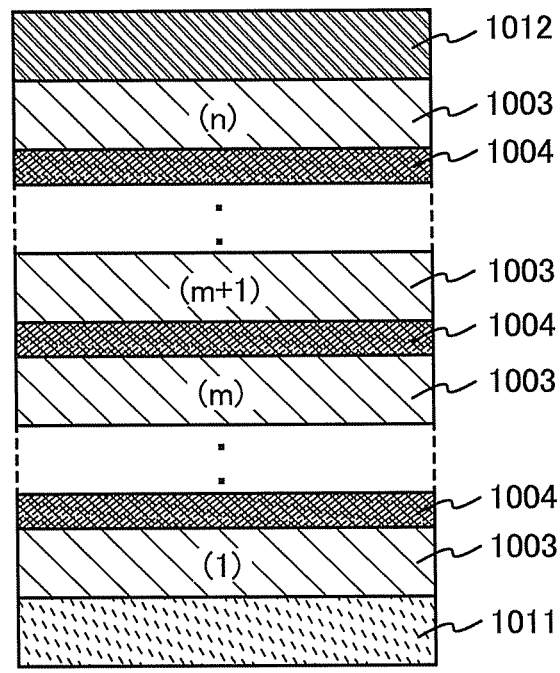
FIGS. 5A and 5B illustrate a light-emitting element according to an embodiment.

The structure of the light-emitting element described in this embodiment may be a structure in which a plurality of EL layers 1003 are stacked between a pair of electrodes as illustrated in FIG. 5A, that is, a stacked-layer element structure. Note that an intermediate layer 1004 is interposed between each two of the plurality of EL layers 1003. For example, in the case where the light-emitting element described in this embodiment includes n (n is a natural number of 2 or more) EL layers between the pair of electrodes, an intermediate layer 1004 is provided between an m-th (m is a natural number, where $1 \leq m \leq n-1$) EL layer 1003 and an (m+1)-th EL layer 1003.

Note that the intermediate layer 1004 has a function of injecting holes to one EL layer 1003 in contact with the intermediate layer 1004 and injecting electrons to the other EL layer 1003 when a voltage is applied to a first electrode 1011 and a second electrode 1012. Specifically, the intermediate layer 1004 injects holes to the EL layer 1003 in contact with a side on the cathode side of the intermediate layer 1004 and injects electrons to the EL layer 1003 in contact with a side on the anode side of the intermediate layer 1004.

Note that in the case where the first electrode 1011 is an anode, the hole-transport layer of the EL layer 1003 may be formed over the first electrode 1011 and in contact with a side on the second electrode 1012 side of the intermediate layer 1004. Note also that in the case where the first electrode 1011 is a cathode, the electron-injection layer of the EL layer 1003 may be formed over the first electrode 1011 and in contact with a side on the second electrode 1012 side of the intermediate layer 1004.

The intermediate layer 1004 may be a single layer or a multilayer in which a plurality of layers are stacked, and can be formed using the above-described composite material of an organic compound and an inorganic compound (the composite material with a hole-injection property or the composite material with an electron-injection property) or formed using materials such as metal oxides in appropriate combination. More preferably, the intermediate layer 1004 is formed using a composite material with a hole-injection property and a different material in combination. These materials used for the intermediate layer 1004 have high carrier-injection properties and high carrier-transport properties, and thus, a light-emitting element can achieve low-voltage driving.

In the case where the intermediate layer 1004 is formed using a plurality of layers, a composite material layer formed by adding an acceptor material as an anti-reducing material to the first organic compound can be used for one of the plurality of layers which is closest to the cathode. As described above, the composite material in which an acceptor material is added as an anti-reducing material to the first organic compound has a high hole-transport property. Therefore, in the case, the first light-emitting layer can be provided in direct contact with the cathode side of the intermediate layer 1004. In this case, the composite material layer in the intermediate layer can also serve as the hole-transport layer 112 of an embodiment of the present invention.

With the use of the light-emitting element illustrated in this embodiment, a lighting device and a passive-matrix light-emitting device can be manufactured. Further, a light-emitting element is controlled by a thin film transistor (TFT), whereby an active-matrix light-emitting device can be manufactured.

Note that there is no particular limitation on the structure of the TFT which is used in an active-matrix light-emitting device. For example, a staggered TFT or an inverted staggered TFT can be used as appropriate. Further, a driver circuit formed over a TFT substrate may be formed using both an n-channel TFT and a p-channel TFT or only either an n-channel TFT or a p-channel TFT. Further, as the semiconductor film used for the TFT, a semiconductor film formed using an element belonging to Group 14 of the periodic table, which is typified by Si, may be used, or a compound semiconductor film, an oxide semiconductor film, or particularly, a composite oxide semiconductor film including indium, gallium, zinc, and the like may be used. Furthermore, there is no particular limitation on the crystallinity of a semiconductor film used for the TFT. An amorphous semiconductor film may be used, or a crystalline semiconductor film may be used.

Note that this embodiment can be combined with any of the other embodiments as appropriate.

The light-emitting element illustrated in this embodiment has the light-emitting layer whose carrier-transport property is bipolar and in which on the side near the anode has a hole-transport property higher than the side near the cathode. A recombination region of carriers is formed in the light-emitting layer. Additionally, since a phenomenon in which the holes are transported through the light-emitting layer to reach the electron-transport layer without recombination is suppressed, the holes transported from the electron-transport layer undergo recombination with high efficiency in the light-emitting layer. Thus, the light-emitting element illustrated in this embodiment has high emission efficiency.

Further, in the light-emitting element illustrated in this embodiment, the hole-transport layer contains an anti-reducing material. Therefore, even when electrons which have passed through the light-emitting layer from the electron-transport layer side reach the hole-transport layer, deterioration of the hole-transport layer is suppressed. Thus, the light-emitting element illustrated in this embodiment has high reliability.

Embodiment 2

A light-emitting element illustrated in this embodiment includes at least a first light-emitting layer whose one side is in contact with a hole-transport layer, and a second light-emitting layer in contact with the other side of the first light-emitting layer. Both the first light-emitting layer and the second light-emitting layer contain a bipolar host material and a guest material which is a light-emitting material. The guest material contained in the first light-emitting layer has a low ability for capturing a hole than the guest material contained in the second light-emitting layer; therefore, the hole-transport property of the first light-emitting layer is higher than that of the second light-emitting layer. As a result, holes are transported to a region apart from the hole-transport layer, and a recombination region of holes and electrons is formed widely in the light-emitting layers. Emission colors of the light-emitting material contained in the first light-emitting layer and the light-emitting material contained in the second light-emitting layer are different. Furthermore, an anti-reducing material is contained in the hole-transport layer so that the hole-transport layer is not deteriorated by electrons passing through the light-emitting layer and reaching the hole-transport layer.

Figure 2A:
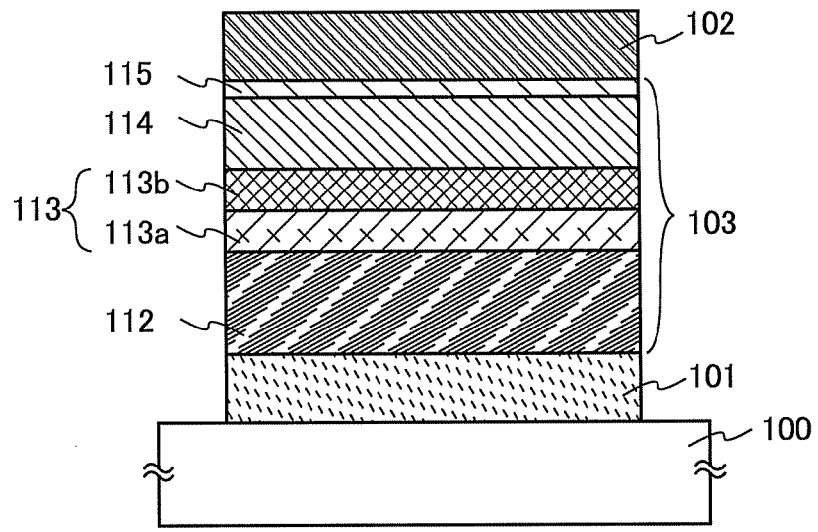
FIGS. 2A and 2B illustrate a light-emitting element according to an embodiment.

FIG. 2A illustrates a structure of the light-emitting element of this embodiment. The light-emitting element of this embodiment includes a first electrode 101, a second electrode 102, and an EL layer 103. The first electrode 101 is formed over a substrate 100. Note that in this embodiment, mainly described is the case where the first electrode 101 serves as an anode and the second electrode 102 serves as a cathode.

The EL layer 103 includes at least a hole-transport layer 112, a first light-emitting layer 113a, and a second light-emitting layer 113b. Further, an electron-transport layer 114, an electron-injection layer 115, and the like are combined as appropriate. The hole-transport layer 112 is provided between the electrode serving as an anode and the first light-emitting layer 113a, and is in contact with a side on the anode side of the first light-emitting layer 113a. The second light-emitting layer 113b is provided between the first light-emitting layer 113a and the electrode serving as a cathode, and is in contact with a side on the cathode side of the first light-emitting layer 113a. The electron-transport layer 114 is provided between the second light-emitting layer 113b and the electrode serving as a cathode, and is in contact with a side on the cathode side of the second light-emitting layer 113b. The electron-injection layer 115 is provided between the electron-transport layer 114 and the electrode serving as a cathode and is in contact with the electrode serving as a cathode.

Figure 2B:
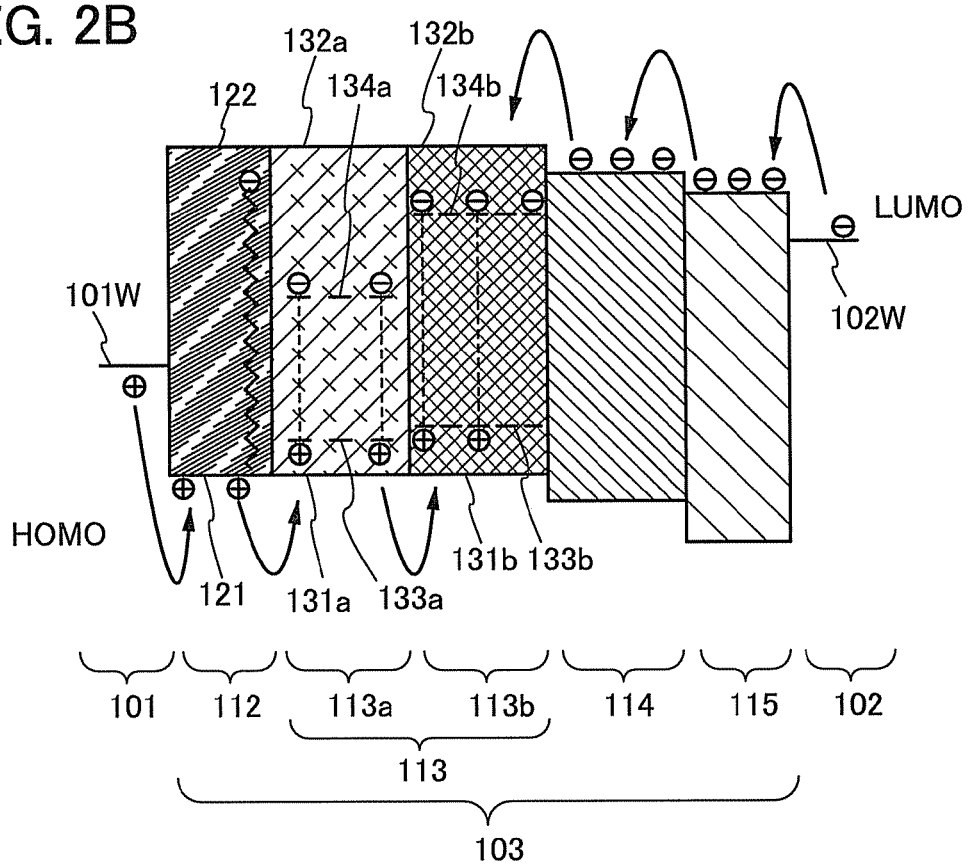

Next, the behavior of carriers in the light-emitting element of this embodiment is described. FIG. 2B illustrates the correlation of bands of layers in the EL layer of the light-emitting element illustrated in this embodiment.

The light-emitting element in this embodiment is different from the light-emitting element illustrated in Embodiment 1 in the structure of the light-emitting layer 113. Therefore, only a portion relating to the light-emitting layer 113 is described in this embodiment.

Both the first light-emitting layer 113a and the second light-emitting layer 113b contain a host material and a guest material. Emission colors of the light-emitting material contained in the first light-emitting layer and the light-emitting material contained in the second light-emitting layer are different.

Note that the host materials of the first light-emitting layer 113a and the second light-emitting layer 113b may be the same or different. At least, the host materials are bipolar and are stable with respect to an oxidation and a reduction. Therefore, the first light-emitting layer 113a and the second light-emitting layer 113b can transport both holes and electrons In addition, light-emitting materials are contained in the first light-emitting layer 113a and the second light-emitting layer 113b as the guest materials and have influence on the carrier-transport rate.

The relationship among a HOMO level 131a of the host material contained in the first light-emitting layer 113a ($HOMO_{HOST1}$), a HOMO level 133a of the light-emitting material contained in the first light-emitting layer 113a ($HOMO_{EM1}$), a HOMO level 131b of the host material contained in the second light-emitting layer 113b ($HOMO_{HOST2}$), and a HOMO level 133b of the light-emitting material contained in the second light-emitting layer 113b ($HOMO_{EM2}$) is described below (see FIG. 2B). Note that FIG. 2B also illustrates a work function 101W of the first electrode 101, a work function 102W of the second electrode 102, and a HOMO level 121 and a LUMO level 122 of the hole-transport layer 112 of the light-emitting element of this embodiment.

In the EL layer 103, $HOMO_{HOST2}$ is shallower than or substantially equal to $HOMO_{HOST1}$. $HOMO_{EM1}$ is shallower than or substantially equal to $HOMO_{HOST1}$, $HOMO_{EM2}$ is shallower than or substantially equal to $HOMO_{HOST2}$, and $HOMO_{EM1}$ is deeper than or substantially equal to $HOMO_{EM2}$. In addition, the absolute value of the difference between $HOMO_{EM2}$ and $HOMO_{HOST2}$ ($\Delta HOMO_{EM2\text{-}HOST2}$) is larger than the absolute value of the difference between $HOMO_{EM1}$ and $HOMO_{HOST1}$ ($\Delta HOMO_{EM1\text{-}HOST1}$)($|\Delta HOMO_{EM2\text{-}HOST2}|>|\Delta HOMO_{EM1\text{-}HOST1}|$).

It is possible to assume that $\Delta HOMO_{EM1\text{-}HOST1}$ is a depth of a hole trap level formed by the light-emitting material, which is the guest material, in the first light-emitting layer 113a and that $\Delta HOMO_{EM2\text{-}HOST2}$ is a depth of a hole trap level formed by the light-emitting material, which is the guest material, in the second light-emitting layer 113b. That is, the hole trap level formed in the second light-emitting layer 113b is deep (the absolute value thereof is large) as compared with that formed in the first light-emitting layer 113a.

Since holes are captured at the hole trap level, the hole trap level has influence on the hole-transport property of the light-emitting layer. In addition, the degree of the influence depends on the depth of the trap level. Specifically, in the first light-emitting layer 113a, holes are easily transported as compared with in the second light-emitting layer 113b which has a deep trap level.

With such a structure, the hole-transport property of the first light-emitting layer 113a can be higher than the hole-transport property of the second light-emitting layer 113b in the light-emitting element of this embodiment. As a result, holes which are transported from the anode through the hole-transport layer 112 to the first light-emitting layer 113a are further transported to the inside of the second light-emitting layer 113b which is apart from the hole-transport layer 112, whereby a recombination region is formed mainly in the second light-emitting layer 113b. Furthermore, by providing the second light-emitting layer 113b with a reduced hole-transport property, it is possible to prevent holes from being transported through the light-emitting layer 113 to the electron-transport layer 114 located on the cathode side.

Next, the relationship among a LUMO level 132a of the host material contained in the first light-emitting layer 113a ($LUMO_{HOST1}$), a LUMO level 134a of the light-emitting material contained in the first light-emitting layer 113a ($LUMO_{EM1}$), a LUMO level 132b of the host material contained in the second light-emitting layer 113b ($LUMO_{HOST2}$), and a LUMO level 134b of the light-emitting material contained in the second light-emitting layer 113b ($LUMO_{EM2}$) is described (see FIG. 2B).

In the EL layer 103, $LUMO_{HOST1}$ is shallower than or substantially equal to $LUMO_{HOST2}$ (the absolute value of $LUMO_{HOST1}$ is smaller than or substantially equal to that of $LUMO_{HOST2}$). $LUMO_{EM1}$ is deeper than or substantially equal to $LUMO_{HOST1}$ (the absolute value of $LUMO_{EM1}$ is larger than or substantially equal to that of $LUMO_{HOST1}$), $LUMO_{EM2}$ is deeper than or substantially equal to $LUMO_{HOST2}$ (the absolute value of $LUMO_{EM2}$ is larger than or substantially equal to that of $LUMO_{HOST2}$), and $LUMO_{EM1}$ is deeper than or substantially equal to $LUMO_{EM2}$. In addition, the absolute value of the difference between $LUMO_{HOST1}$ and $LUMO_{EM1}$ ($\Delta LUMO_{HOST\text{-}EM1}$) is larger than the difference between $LUMO_{HOST2}$ and $LUMO_{EM2}$ ($\Delta LUMO_{HOST2\text{-}EM2}$) ($|\Delta LUMO_{HOST1\text{-}EM1}|>|\Delta LUMO_{HOST2\text{-}EM2}|$).

It is possible to assume that $\Delta LUMO_{HOST2\text{-}EM2}$ is a depth of an electron trap level formed by the light-emitting material, which is the guest material, in the second light-emitting layer 113b and that $\Delta LUMO_{HOST1\text{-}EM1}$ is a depth of an electron trap level formed by the light-emitting material, which is the guest material, in the first light-emitting layer 113a. Therefore, in the light-emitting element illustrated in this embodiment, the electron trap level formed in the first light-emitting layer 113a is deep (the absolute value thereof is large) as compared with that formed in the second light-emitting layer 113b.

Since electrons are captured at the electron trap level, the electron trap level has influence on the electron-transport property of the light-emitting layer. In addition, the degree of the influence depends on the depth of the trap level. Specifically, since the first light-emitting layer 113a has a deeper trap level than the second light-emitting layer 113b, electrons are less likely to be transported in the first light-emitting layer 113a than in the second light-emitting layer 113b. In other words, the electron-transport property of the first light-emitting layer 113a is lower than the electron-transport property of the second light-emitting layer 113b.

With such a structure, the electron-transport property of the first light-emitting layer 113a can be lower than the electron-transport property of the second light-emitting layer 113b. As a result, electrons which are transported from the second light-emitting layer 113b to the first light-emitting layer 113a are unlikely to reach the hole-transport layer 112, which is particularly preferable. In addition, since $LUMO_{EM1}$ is deeper than or substantially equal to $LUMO_{EM2}$, electrons which are transported from the electron-transport layer 114 to the second light-emitting layer 113b can easily move from the second light-emitting layer 113b to the first light-emitting layer 113a. As a result, a recombination region of holes and electrons are formed widely in the light-emitting layer 113, and light can be emitted from the first light-emitting layer 113a in addition to the second light-emitting layer 113b.

Note that in this embodiment, since the emission colors of light-emitting materials contained in the first light-emitting layer 113a and the second light-emitting layer 113b are different, light emitted from the light-emitting element of this embodiment is a mixture of light emitted from the two light-emitting materials. Note also that combination of the light-emitting material contained in the first light-emitting layer and the light-emitting material contained in the second light-emitting layer may be of fluorescent materials, of phosphorescent materials, or of a fluorescent material and a phosphorescent material.

For example, in the light-emitting element in this embodiment, in the case where the first light-emitting layer 113a contains a yellow fluorescent material and the second light-emitting layer 113b contains a blue fluorescent material, white light emission can be obtained. In the case where the first light-emitting layer 113a contains a red phosphorescent material and the second light-emitting layer 113b contains a green phosphorescent material, yellow light emission can be obtained.

Note that in the case where electrons reach the hole-transport layer 112 without being recombined with holes in the second light-emitting layer 113b and the first light-emitting layer 113a, the hole-transport layer 112 might deteriorate. However, deterioration of the first organic compound by a reduction can be prevented because the hole-transport layer 112 which is illustrated in this embodiment contains the first organic compound and the anti-reducing material. The anti-reducing material receives electrons which have reached the hole-transport layer 112 instead of the first organic compound.

Note that in the case where the LUMO level of the first organic compound contained in the hole-transport layer 112

(LUMO$_{HTL}$) is shallower than the LUMO level of the host material contained in the first light-emitting layer 113a (LUMO$_{HOST1}$), electrons are not easily injected from the first light-emitting layer 113a. Thus, the electrons can be confined in the first light-emitting layer 113a, and recombination of electrons and holes in the first light-emitting layer 113a can be facilitated.

The first electrode 101, the second electrode 102, and the layers in the EL layer 103 of the light-emitting element of this embodiment can be formed using materials which are the same or substantially the same as those in Embodiment 1, as appropriate. Further, the direction of light emission, the stack order of the layers in the EL layer 103, and the like can be selected and used as appropriate in a manner similar to that in Embodiment 1. Alternatively, the EL layer 103 illustrated in this embodiment can be applied to the stacked structures of the light-emitting elements of Embodiment 1, which are illustrated in FIG. 4 and FIG. 5A.

The structure of the stacked-layer element is preferable in the case where white light emission is obtained. With the stacked-layer element structure combined with the structure of Embodiment 2, a long-lifetime light-emitting device with high efficiency can be manufactured.

As for the combination of a plurality of light-emitting layers, a structure for obtaining white light by including red light, green light, and blue light may be used. For example, the structure may include a first EL layer containing a blue fluorescent material as a light-emitting material and a second EL layer containing red and green phosphorescent materials as light-emitting materials.

Also with a structure including light-emitting layers emitting light of complementary colors, white light emission can be obtained. When light emitted from the first EL layer and light emitted from the second EL layer have complementary colors to each other in a stacked-layer element including two EL layers stacked, the combination of colors are as follows: blue and yellow, blue green and red, and the like. A substance which emits light of blue, yellow, blue green, or red may be selected as appropriate from, for example, the light-emitting materials given above.

Figure 5B:
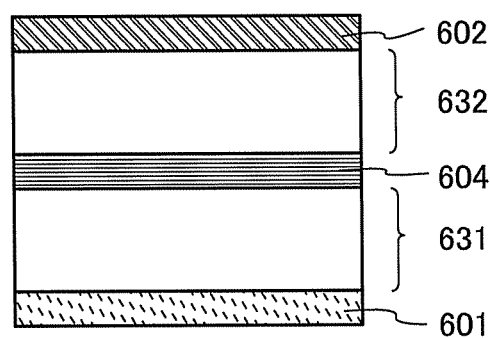

In the following, described is an example of a structure in which a first EL layer and a second EL layer each having a plurality of light-emitting layers emitting light of complementary colors is included such that white light can be obtained. FIG. 5B illustrates a structure of the case where two EL layers are stacked. In FIG. 5B, the first EL layer 631 and the second EL layer 632 are stacked between a first electrode 601 and a second electrode 602. In this case, an intermediate layer 604 is preferably provided between the first EL layer 631 and the second EL layer 632.

The light-emitting element illustrated in FIG. 5B includes the first EL layer 631, the intermediate layer 604, and the second EL layer 632 between the first electrode 601 and the second electrode 602. The first EL layer 631 includes a first light-emitting layer which exhibits an emission peak in the wavelength range of blue to blue green, and a second light-emitting layer which exhibits an emission peak in the wavelength range of yellow to orange. The second EL layer 632 includes a third light-emitting layer which exhibits an emission peak in the wavelength range of blue green to green, and a fourth light-emitting layer which exhibits an emission peak in the wavelength range of orange to red.

In this case, light emitted from the first EL layer 631 is a combination of light emitted from the first light-emitting layer and light emitted from the second light-emitting layer and thus exhibits emission peaks both in the wavelength range of blue to blue green and in the wavelength range of yellow to orange. That is, the first EL layer 631 exhibits light emission which has a 2-wavelength-type white color or a 2-wavelength-type color that is similar to white.

In addition, light emitted from the second EL layer 632 is a combination of light emitted from the third light-emitting layer and light emitted from the fourth light-emitting layer and thus exhibits emission peaks both in the wavelength range of blue green to green and in the wavelength range of orange to red. That is, the second EL layer 632 exhibits light emission which has a 2-wavelength-type white color or a 2-wavelength-type color that is similar to white, which is different from that of the first EL layer 631.

Thus, by combination of the light emitted from the first EL layer 631 and the light emitted from the second EL layer 632, white light emission which covers the wavelength range of blue to blue green, the wavelength range of blue green to green, the wavelength range of yellow to orange, and the wavelength range of orange to red can be obtained.

Note that in the aforementioned stacked-layer element structure, by providing the intermediate layer between the stacked EL layers, the element can emit light at a high-luminance at a low current density. Since the current density can be kept low, a long-lifetime element can be realized. In addition, the voltage drop due to the resistance of the electrode material can be diminished, whereby uniform light emission in a large area is possible.

The light-emitting element illustrated in this embodiment has the light-emitting layers with a bipolar carrier-transport property. One light-emitting layer on the side near the anode has a high hole-transport property as compared with another light-emitting layer on the side near the cathode. A recombination region of carriers is formed in the light-emitting layers. Additionally, since phenomenon in which the holes and electrons are transported through the light-emitting layer, without recombination, to reach the electron-transport layer and the hole-transport layer, respectively, is suppressed, the holes and electrons efficiently undergo recombination in the light-emitting layer. Thus, the light-emitting element illustrated in this embodiment has high emission efficiency.

Further, in the light-emitting element illustrated in this embodiment, the hole-transport layer contains an anti-reducing material. Therefore, even when electrons which have passed through the light-emitting layers from the electron-transport layer side reach the hole-transport layer, deterioration of the hole-transport layer is suppressed. Thus, the light-emitting element illustrated in this embodiment has high reliability.

The light-emitting element illustrated in this embodiment has a light-emitting layer in which a plurality of light-emitting layers of different emission colors are stacked, and a recombination region of carriers is widely spread in the plurality of light-emitting layers. Thus, the light-emitting element illustrated in this embodiment has a wide emission wavelength range.

Embodiment 3

A light-emitting element which is illustrated in this embodiment includes at least a first light-emitting layer whose one side is in contact with a hole-transport layer, a second light-emitting layer in contact with the other side of the first light-emitting layer, and a third light-emitting layer in contact with a side of the second light-emitting layer on a cathode side. The first light-emitting layer, the second light-emitting layer, and the third light-emitting layer each contain a bipolar host material and a guest material which is a light-emitting material. The guest material contained in the first light-emitting layer has a lower ability for capturing a hole than the guest material contained in the second light-emitting layer, and the guest material contained in the second light-emitting layer has a lower ability for capturing a hole than the guest material contained in the third light-emitting layer. The hole-transport property of the first light-emitting layer is higher than or equal to that of the second light-emitting layer, and the hole-transport property of the second light-emitting layer is higher than the third light-emitting layer. As a result, holes are transported into a region apart from the hole-transport layer, and a recombination region of holes and electrons is formed widely in the light-emitting layers. Furthermore, an anti-reducing material is contained in the hole-transport layer so that the hole-transport layer is not deteriorated by electrons passing through the light-emitting layers and reaching the hole-transport layer.

Figure 3A:
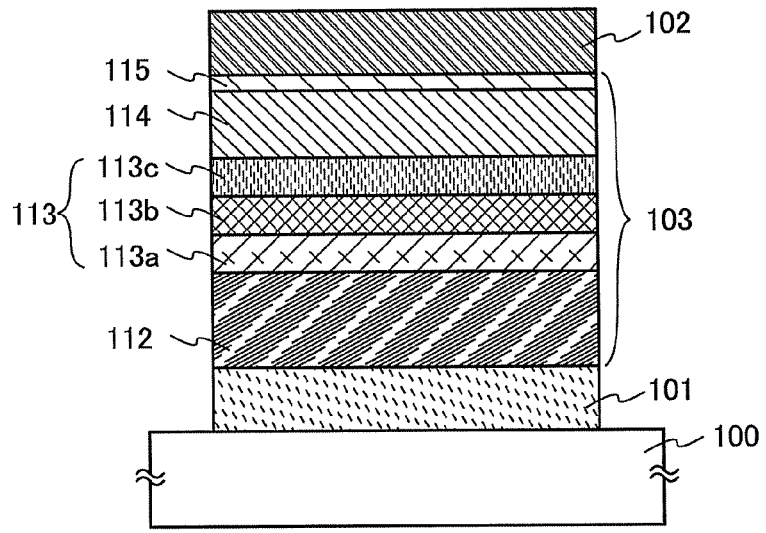
FIGS. 3A and 3B illustrate a light-emitting element according to an embodiment.

FIG. 3A illustrates the structure of the light-emitting element of this embodiment. The light-emitting element of this embodiment includes a first electrode 101, a second electrode 102, and an EL layer 103. The first electrode 101 is formed over a substrate 100. Note that in this embodiment, mainly described is the case where the first electrode 101 serves as an anode and the second electrode 102 serves as a cathode.

The EL layer 103 includes at least a hole-transport layer 112, a light-emitting layer 113 (a first light-emitting layer 113a, a second light-emitting layer 113b, and a third light-emitting layer 113c), and further, an electron-transport layer 114, an electron-injection layer 115, and the like are combined as appropriate. The hole-transport layer 112 is provided between the electrode serving as an anode and the first light-emitting layer 113a and is in contact with a side on the anode side of the first light-emitting layer 113a. The second light-emitting layer 113b is provided between the first light-emitting layer 113a and the electrode serving as a cathode and is in contact with a side on the cathode side of the first light-emitting layer 113a. The third light-emitting layer 113c is provided between the second light-emitting layer 113b and the electrode serving as a cathode, and is in contact with a side on the cathode side of the second light-emitting layer 113b. The electron-transport layer 114 is provided between the third light-emitting layer 113c and the electrode serving as a cathode, and is in contact with a side on the cathode side of the third light-emitting layer 113c. The electron-injection layer 115 is provided between the electron-transport layer 114 and the electrode serving as a cathode and is in contact with the electrode serving as a cathode.

Figure 3B:
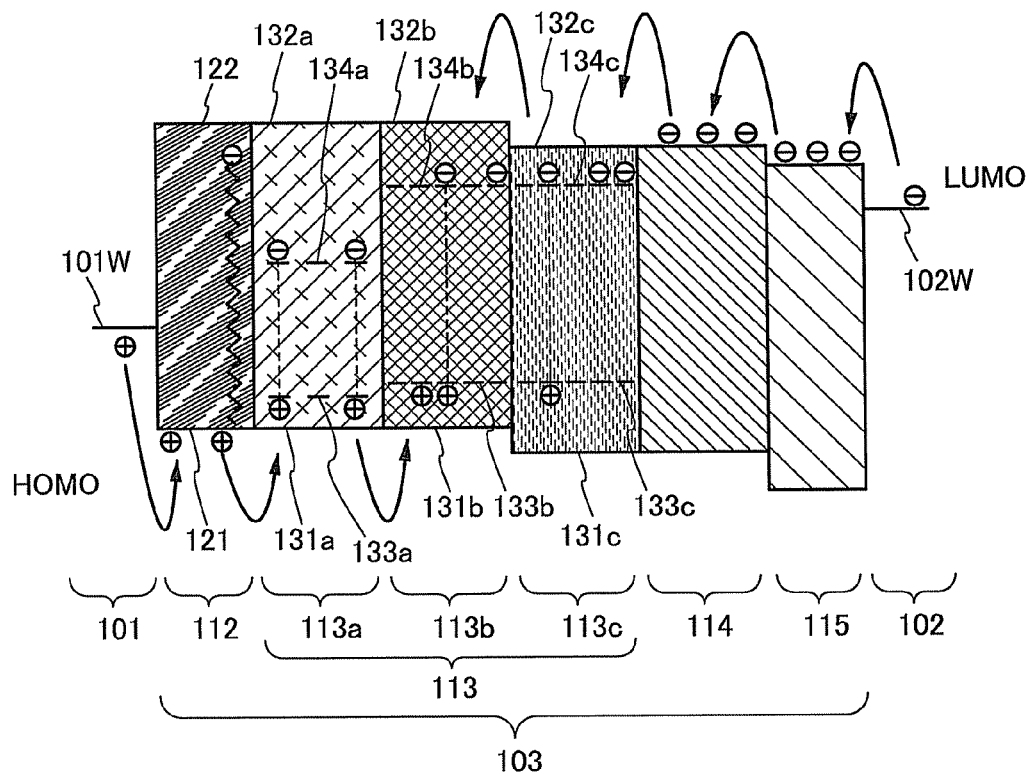

Next, the behavior of carriers in the light-emitting element of this embodiment is described. FIG. 3B illustrates the correlation of bands of layers in the EL layer of the light-emitting element illustrated in this embodiment.

The light-emitting element in this embodiment is different from the light-emitting elements illustrated in Embodiments 1 and 2 in the structure of the light-emitting layer 113. Therefore, only a portion relating to the light-emitting layer 113 is described in this embodiment.

The first light-emitting layer 113a, the second light-emitting layer 113b, and the third light-emitting layer 113c each contain a host material and a guest material.

Note that the host materials of the first light-emitting layer 113a, the second light-emitting layer 113b, and the third light-emitting layer 113c may be the same or different. At least, the host materials are bipolar and are stable with respect to an oxidation and a reduction. Therefore, the first light-emitting layer 113a, the second light-emitting layer 113b, and the third light-emitting layer 113c can transport both holes and electrons.

In addition, light-emitting materials are contained in the first light-emitting layer 113a, the second light-emitting layer 113b, and the third light-emitting layer 113c as the guest materials and have influence on the carrier-transport rate.

The relationship among a HOMO level 131a of the host material contained in the first light-emitting layer 113a ($HOMO_{HOST1}$), a HOMO level 133a of the light-emitting material contained in the first light-emitting layer 113a ($HOMO_{EM1}$), a HOMO level 131b of the host material contained in the second light-emitting layer 113b ($HOMO_{HOST2}$), a HOMO level 133b of the light-emitting material contained in the second light-emitting layer 113b ($HOMO_{EM2}$), a HOMO level 131c of the host material contained in the third light-emitting layer 113c ($HOMO_{HOST3}$), and a HOMO level 133c of the light-emitting material contained in the third light-emitting layer 113c ($HOMO_{EM3}$) is described below (see FIG. 3B). Note that FIG. 3B also illustrates a work function 101W of the first electrode 101, a work function 102W of the second electrode 102, and a HOMO level 121 and a LUMO level 122 of the hole-transport layer 112 of the light-emitting element of this embodiment.

In the EL layer 103, $HOMO_{HOST1}$ is deeper than or substantially equal to $HOMO_{HOST2}$. $HOMO_{EM1}$ is shallower than or substantially equal to $HOMO_{HOST1}$, $HOMO_{EM2}$ is shallower than or substantially equal to $HOMO_{HOST2}$, and $HOMO_{EM1}$ is deeper than or substantially equal to $HOMO_{EM2}$. $HOMO_{EM3}$ is shallower than or substantially equal to $HOMO_{HOST3}$. In addition, the absolute value of the difference between $HOMO_{EM1}$ and $HOMO_{HOST1}$ ($\Delta HOMO_{EM1-HOST1}$) is smaller than or equal to the absolute value of the difference between $HOMO_{EM2}$ and $HOMO_{HOST2}$ ($\Delta HOMO_{EM2-HOST2}$), and the absolute value of the difference between $HOMO_{EM3}$ and $HOMO_{HOST3}$ ($\Delta HOMO_{EM3-HOST3}$) is larger than the absolute value of the difference between $HOMO_{EM2}$ and $HOMO_{HOST2}$ ($\Delta HOMO_{EM2-HOST2}$) ($|\Delta HOMO_{EM1-HOST1}| \leq |\Delta HOMO_{EM2-HOST2}| < |\Delta HOMO_{EM3-HOST3}|$).

It is possible to assume that $\Delta HOMO_{EM1-HOST1}$ is a depth of a hole trap level formed by the light-emitting material, which is the guest material, in the first light-emitting layer 113a, that $\Delta HOMO_{EM2-HOST2}$ is a depth of a hole trap level formed by the light-emitting material, which is the guest material, in the second light-emitting layer 113b, and that $\Delta HOMO_{EM3-HOST3}$ is a depth of a hole trap level formed by the light-emitting material, which is the guest material, in the third light-emitting layer 113c. That is, in one embodiment of the present invention, the hole trap level formed in the second light-emitting layer 113b is deep (the absolute value thereof is large) as compared with that formed in the first light-emitting layer 113a, and the hole trap level formed in the third light-emitting layer 113c is deep (the absolute value thereof is large) as compared with that formed in the second light-emitting layer 113b.

Since holes are captured at the hole trap level, the hole trap level has influence on the hole-transport property of the light-emitting layer. In addition, the degree of the influence depends on the depth of the trap level. Specifically, the hole-transport property of the second light-emitting layer 113b is controlled to be lower than or equal to that of the first light-emitting layer 113a, and the hole-transport property of the third light-emitting layer 113c is controlled to be lower than or equal to that of the second light-emitting layer 113b.

With such a structure, in the light-emitting element of this embodiment, holes which are transported from the hole-transport layer 112 to the first light-emitting layer 113a are further transported to the third light-emitting layer 113c which is apart from the hole-transport layer 112. Furthermore, by providing the third light-emitting layer 113c with a reduced hole-transport property, it is possible to prevent holes from being transported to the electron-transport layer 114.

Next, the behavior of electrons which move in the EL layer and recombination of holes and electrons are described.

With the electron-injection layer 115, electrons are transported from the second electrode 102 serving as a cathode to the electron-transport layer 114. The electron-transport layer 114 has a high electron-transport property, so that the electrons are transported to the third light-emitting layer 113c.

Since the hole-transport property of the third light-emitting layer 113c is suppressed, the electrons transported from the electron-transport layer 114 are recombined with holes with high efficiency in the third light-emitting layer 113c to allow the light-emitting material which is a guest material to be excited, resulting in light emission.

Further, even in the case where electrons leak from the third light-emitting layer 113c to the second light-emitting layer 113b without being recombined with holes in the third light-emitting layer 113c, the electrons which have leaked can be recombined with holes in the second light-emitting layer 113b, and a light-emitting material which is added to the second light-emitting layer 113b can emit light. In a similar manner, even in the case where electrons leak from the second light-emitting layer 113b to the first light-emitting layer 113a without being recombined with holes in the second light-emitting layer 113b, the electrons which have leaked can be recombined with holes in the first light-emitting layer 113a, and a light-emitting material which is added to the first light-emitting layer 113a can emit light. Thus, emission efficiency is not diminished. In this manner, by using a large area of the light-emitting layer 113 as a region from which light can be emitted, the probability of recombination of holes and electrons can be increased. Thus, the emission efficiency can be increased.

Note that in the case where electrons reach the hole-transport layer 112 without being recombined with holes in the light-emitting layer 113, the hole-transport layer 112 might deteriorate. However, deterioration of the first organic compound by a reduction can be prevented because the hole-transport layer 112 which is illustrated in this embodiment contains the first organic compound and the anti-reducing material. The anti-reducing material receives electrons which have reached the hole-transport layer 112 instead of the first organic compound.

Note that in this embodiment, it is possible to select light-emitting materials to be added to the first light-emitting layer 113a, the second light-emitting layer 113b, and the third light-emitting layer 113c, as appropriate. Therefore, emission colors of the first light-emitting layer 113a, the second light-emitting layer 113b, and the third light-emitting layer 113c may be different. In the case where light-emitting layers of different emission colors are stacked, light emitted from the light-emitting element is a mixture of light emitted from each light-emitting layer. Note also that the light-emitting materials contained in the first to third light-emitting layers may be any of fluorescent materials and phosphorescent materials.

For example, in the case where the first light-emitting layer 113a of the light-emitting element of this embodiment contains a red fluorescent material, the second light-emitting layer 113b contains a green fluorescent material, and the third light-emitting layer 113c contains a blue fluorescent material, white light emission can be obtained. Further, in the case where the first light-emitting layer 113a of the light-emitting element of this embodiment contains a yellow fluorescent material and the second light-emitting layer 113b and the third light-emitting layer 113c contain a blue fluorescent material, white light emission can be obtained.

The first electrode 101, the second electrode 102, and the layers in the EL layer 103 of the light-emitting element of this embodiment can be formed using materials which are the same or substantially the same as those in Embodiment 1, as appropriate. Further, the direction of light emission, the stack order of the layers in the EL layer 103, and the like can be selected and used as appropriate in a manner similar to that in Embodiment 1. Alternatively, the EL layer 103 illustrated in this embodiment can be applied to the structures of the light-emitting elements of Embodiment 1, which are illustrated in FIG. 4 and FIG. 5A. Therefore, detailed description thereof is omitted here.

The light-emitting element illustrated in this embodiment has the light-emitting layers with a bipolar carrier-transport property. One light-emitting layer, which is near the anode side has a high hole-transport property as compared with another light-emitting layer, which is near the cathode side. A recombination region of carriers is formed in the light-emitting layers. Additionally, since phenomenon in which the holes and electrons are transported through the light-emitting layer, without recombination, to reach the electron-transport layer and the hole-transport layer, respectively, is suppressed, the holes and electrons efficiently undergo recombination in the light-emitting layer. Thus, the light-emitting element illustrated in this embodiment has high emission efficiency.

Further, in the light-emitting element illustrated in this embodiment, the hole-transport layer contains an anti-reducing material. Therefore, even when electrons which have passed through the light-emitting layer from the electron-transport layer side reach the hole-transport layer, deterioration of the hole-transport layer is suppressed. Thus, the light-emitting element illustrated in this embodiment has high reliability.

The light-emitting element illustrated in this embodiment can use a light-emitting layer in which a plurality of light-emitting layers of different emission colors are stacked, and a recombination region of carriers is widely spread in the plurality of light-emitting layers. Thus, the light-emitting element illustrated in this embodiment is preferable for a light-emitting element having a wide emission wavelength range.

Embodiment 4

Figure 12A:
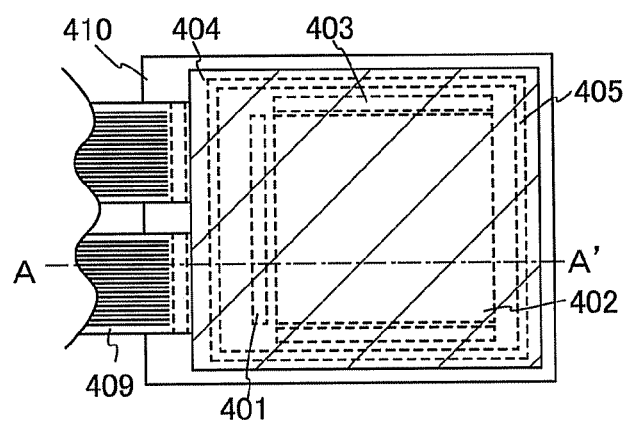
FIGS. 12A and 12B illustrate a light-emitting device according to an embodiment.
Figure 12B:
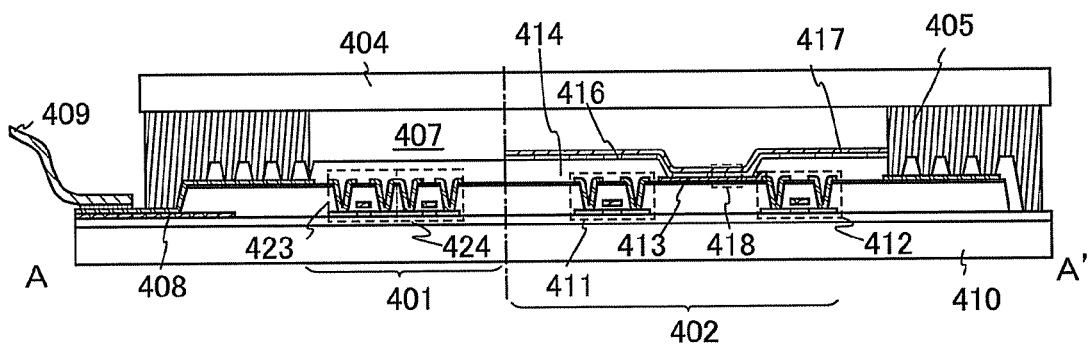

In this embodiment, a light-emitting device manufactured using a light-emitting element of an embodiment of the present invention is described with reference to FIGS. 12A and 12B and FIGS. 13A and 13B. Note that FIG. 12A is a top view illustrating the light-emitting device and FIG. 12B is a cross-sectional view of FIG. 12A taken along a line A-A'. Reference numeral 401 shown by a dotted line denotes a driver circuit portion (a source side driver circuit), reference numeral 402 denotes a pixel portion, and reference numeral 403 denotes a driver circuit portion (a gate side driver circuit). Reference numeral 404 denotes a sealing substrate, reference numeral 405 denotes a sealant, and an inner side region enclosed by the sealant 405 is a space 407.

Note that a lead wiring 408 is a wiring for transmitting signals that are to be inputted to the source side driver circuit 401 and the gate side driver circuit 403, and receives a video signal, a clock signal, a start signal, a reset signal, and the like through a flexible printed circuit (FPC) 409 which serves as an external input terminal. Although only the FPCs are illustrated here, printed wiring boards (PWBs) may be attached to the FPCs. The light-emitting device in this specification includes, in its category, not only the light-emitting device itself but also the light-emitting device provided with the FPC or the PWB.

Next, a cross-sectional structure of the light-emitting element is described with reference to FIG. 12B. The driver circuit portions and the pixel portion having a plurality of pixels are formed over a substrate 410. Here, the source side driver circuit 401 which is the driver circuit portion and one of the plurality of pixels in the pixel portion 402 are illustrated.

Note that in the source side driver circuit 401, a CMOS circuit which is obtained by combining an n-channel TFT 423 and a p-channel TFT 424 is formed. Further, the driver circuit may be formed using a variety of a CMOS circuit, a PMOS circuit, or an NMOS circuit which is formed using TFTs. In this embodiment, a driver-integrated type in which a driver circuit is formed on a substrate is shown; however, it is not always necessary to have such a structure, and the driver circuit can be formed not on the substrate but outside the substrate.

The pixel portion 402 includes a plurality of pixels having a switching TFT 411, a current control TFT 412, and a first electrode 413 electrically connected to a drain of the current control TFT 412. An insulator 414 is formed to cover an end portion of the first electrode 413. Here, the insulator 414 is formed using a positive type photosensitive acrylic resin film.

The insulator 414 is formed to have a curved surface having curvature at an upper end portion or a lower end portion thereof in order to obtain favorable coverage. For example, when positive type photosensitive acrylic resin is used as a material for the insulator 414, the insulator 414 preferably has a curved surface with a curvature radius (0.2 μm to 3 μm) only as the upper end. Alternatively, as the insulator 414, either a negative type which becomes insoluble in an etchant after light irradiation or a positive type which becomes soluble in an etchant after light irradiation can be used.

Over the first electrode 413, the EL layer 416 and a second electrode 417 are formed. Here, as a material for forming the first electrode 413 serving as the anode, it is preferable to use a material having a high work function. For example, the first electrode 413 can be formed using a stack of a titanium nitride film and a film containing aluminum as its main component; a three-layer structure of a titanium nitride film, a film containing aluminum as its main component, and another titanium nitride film; or the like, as well as a single-layer film such as an indium tin oxide (ITO) film, an indium tin oxide film containing silicon, an indium zinc oxide (IZO) film, a titanium nitride film, a chromium film, a tungsten film, a Zn film, or a Pt film. The stacked-layer structure achieves to have low wiring resistance, favorable ohmic contact, and a function as an anode.

Further, the EL layer 416 which is interposed between the first electrode 413 and the second electrode 417 is formed in a manner similar to that in any of Embodiment 1 to Embodiment 3.

The EL layer 416 can be formed by a variety of methods such as an evaporation method using an evaporation mask, an ink-jet method, and a spin coating method.

As a material used for the second electrode 417 which is formed over the EL layer 416, it is preferable to use a material with a low work function (e.g., Al, Ag, Li, Ca, or an alloy or a compound thereof such as MgAg, MgIn, AlLi). Note that in the case where light emitted from the EL layer 416 is transmitted through the second electrode 417 which serves as a cathode, it is preferable to use, as the second electrode 417, a stack of a metal thin film with reduced film thickness and a transparent conductive film (an indium oxide-tin oxide alloy (ITO), an indium oxide-zinc oxide alloy ($In_2O_3$—ZnO), zinc oxide (ZnO), or the like).

Attachment of the sealing substrate 404 to the substrate 410 with the sealant 405 makes a structure in which a light-emitting element 418 is provided in the space 407 enclosed by the substrate 410, the sealing substrate 404, and the sealant 405. Note that the space 407 may be filled with an inert gas (e.g., nitrogen or argon) or with the sealant 405.

Note that as the sealant 405, an epoxy-based resin is preferably used. A material used for the sealant 405 is desirably a material which does not transmit moisture or oxygen as much as possible. As the sealing substrate 404, a plastic substrate made of fiberglass-reinforced plastics (FRP), polyvinyl fluoride) (PVF), a polyester, an acrylic resin, or the like can be used besides a glass substrate or a quartz substrate.

In the above-described manner, a light-emitting device manufactured using a light-emitting element of an embodiment of the present invention can be obtained.

Since the light-emitting element described in any of Embodiment 1 to Embodiment 3 is used for the light-emitting device of the present invention, the light-emitting device having favorable characteristics can be obtained. Specifically, since a light-emitting element with high emission efficiency is included, a light-emitting device that has reduced power consumption and can be driven for a long time can be obtained.

Figure 13A:
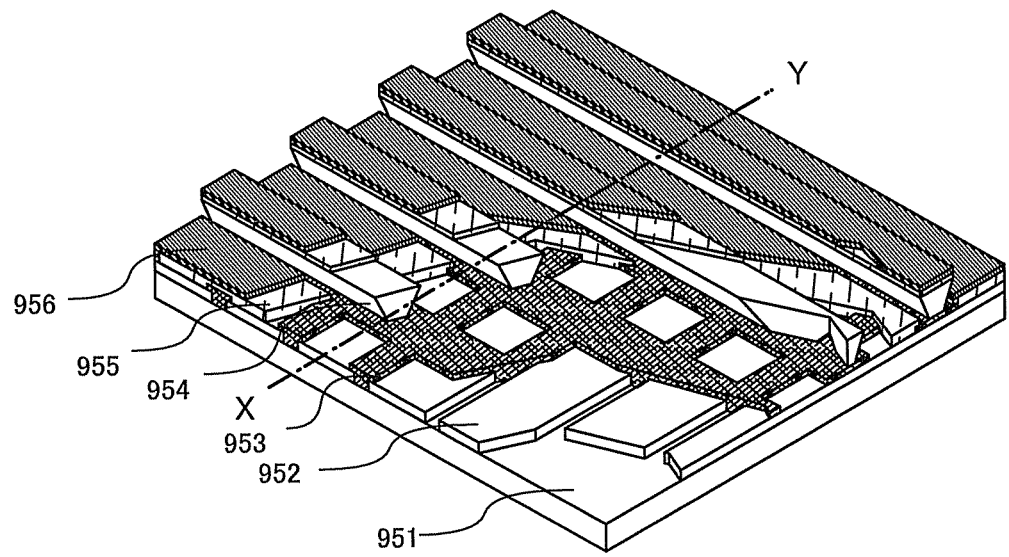
FIGS. 13A and 13B illustrate a light-emitting device according to an embodiment.
Figure 13B:
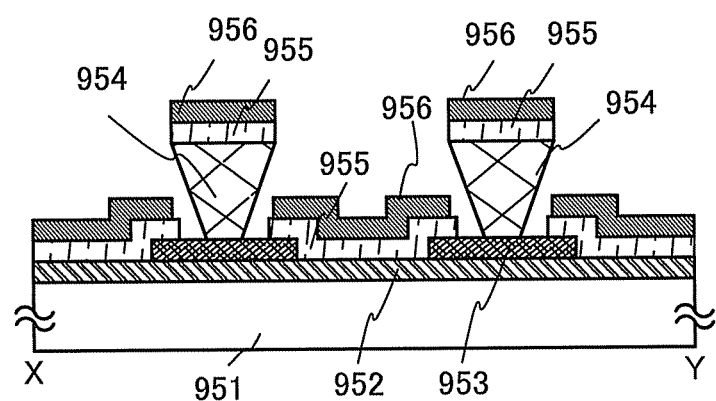

Although an active-matrix light-emitting device which controls driving of a light-emitting element with a transistor is described above, the light-emitting device may be a passive-matrix light-emitting device. FIGS. 13A and 13B illustrate a passive-matrix light-emitting device manufactured according to the present invention. FIG. 13A is a perspective view illustrating the passive-matrix light-emitting device, and FIG. 13B is a cross-sectional view of FIG. 13A taken along a line X-Y. In FIGS. 13A and 13B, an electrode 952 and an electrode 956 are provided over a substrate 951, and an EL layer 955 is provided between the electrode 952 and the electrode 956. An end portion of the electrode 952 is covered with an insulating layer 953. A partition layer 954 is provided over the insulating layer 953.

The sidewalls of the partition layer 954 are aslope such that the distance between both sidewalls is gradually narrowed toward the surface of the substrate. That is, a cross section in a short side of the partition layer 954 is a trapezoidal shape, and a lower side (the side which faces in the direction similar to a plane direction of the insulating layer 953 and is in contact with the insulating layer 953) is shorter than an upper side (the side which faces in the direction similar to a plane direction of the insulating layer 953 and is not in contact with the insulating layer 953). By the partition layer 954 provided in this manner, defects of the light-emitting element due to the crosstalk can be prevented.

The EL layer 955 which is interposed between the electrode 952 and the electrode 956 is formed in a manner similar to that in Embodiment 1 to Embodiment 3.

Since the light-emitting element described in any of Embodiment 1 to Embodiment 3 is used for the light-emitting device of the present invention, the light-emitting device of the present invention having favorable characteristics can be obtained. Specifically, since a light-emitting element with high emission efficiency is included, a light-emitting device that has reduced power consumption and can be driven for a long time can be obtained.

Embodiment 5

In this embodiment, electronic devices each of which uses the light-emitting device described in Embodiment 4, are described. The electronic devices of the present invention each have a display portion which includes the light-emitting element described in any of Embodiments 1 to 3, consumes less power, and can be driven for a long period of time. In addition, the electronic devices each include a display portion having excellent color reproducibility.

As examples of the electronic devices to which the light-emitting element of an embodiment of the present invention is applied, the following are given: cameras such as video cameras or digital cameras, goggle type displays, navigation systems, audio reproducing devices (e.g., car audio components and audio components), computers, game machines, portable information terminals (e.g., mobile computers, cellular phones, portable game machines, and electronic book readers), and image reproducing devices provided with recording media (specifically, a device capable of reproducing recording media such as digital versatile discs (DVDs) and provided with a display device that can display the image). Specific examples of such electronic devices are illustrated in FIGS. 14A to 14D.

Figure 14A:
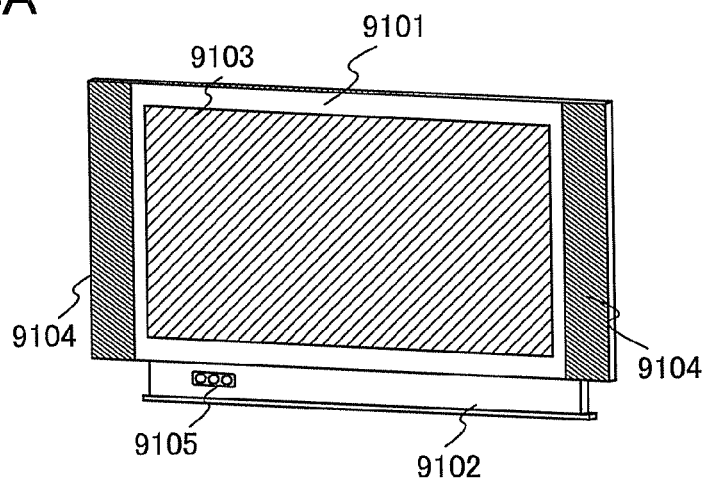
FIGS. 14A to 14D each illustrate an electronic device according to an embodiment.

FIG. 14A illustrates a television set of the present invention, which includes a chassis 9101, a support 9102, a display portion 9103, speaker portions 9104, a video input terminal 9105, and the like. In the display portion 9103 of this television set, light-emitting elements described in any of Embodiments 1 to 3 are arranged in a matrix. The light-emitting elements are characterized by high emission efficiency. The display portion 9103 including the light-emitting elements has similar features and enables the television set to exhibit light emission with high luminance and a decrease in power consumption. Further, the television set has high reliability and can withstand long-term use. The television set according to the present invention, which achieves lower power consumption and higher image quality, can be provided as a product that is suitable for any residential environment.

Figure 14B:
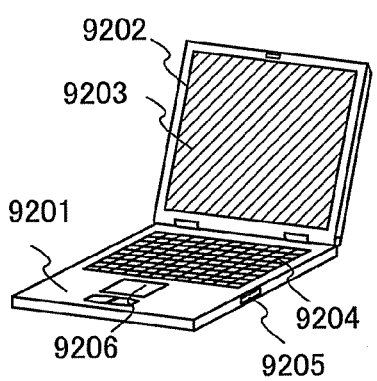

FIG. 14B shows a computer according to the present invention, which includes a main body 9201, a chassis 9202, a display portion 9203, a keyboard 9204, an external connection port 9205, a pointing device 9206, and the like. In the computer, the display portion 9203 has light-emitting elements described in any of Embodiments 1 to 3, which are arranged in a matrix. The light-emitting elements are characterized by high emission efficiency. The display portion 9203 including the light-emitting elements has similar features to achieve light emission with high luminance and a decrease in power consumption. Further, the computer has high reliability and can withstand long-term use. The computer according to the present invention, which achieves lower power consumption and higher image quality, can be provided as a product that is suitable for the environment.

Figure 14C:
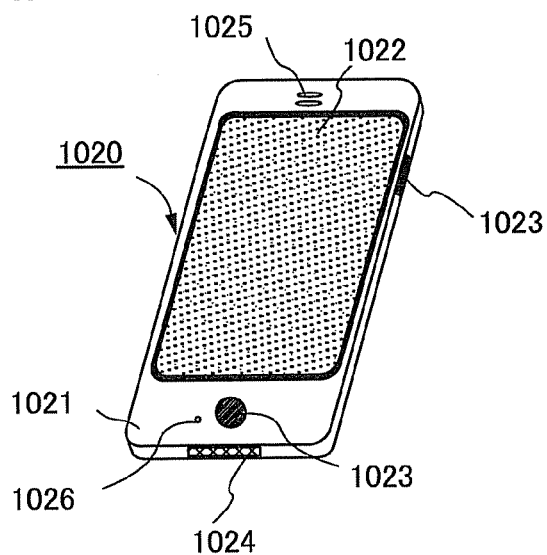

FIG. 14C illustrates a cellular phone 1020 according to the present invention, which includes a display portion 1022 incorporated in a chassis 1021, operation buttons 1023, an external connection port 1024, a speaker 1025, a microphone 1026 and the like. Information can be inputted when the display portion 1022 is touched with a finger or the like. In addition, operations such as making calls and composing mails can be conducted when a user touches the display portion 1022 with his/her finger or the like. In the cellular phone, the display portion 1022 has light-emitting elements described in any of Embodiments 1 to 3, which are arranged in a matrix. The light-emitting elements are characterized by high emission efficiency. The display portion 1022 which includes the light-emitting elements has similar features to achieve light emission with high luminance and reduction in power consumption. Further, the cellular phone has high reliability and can withstand long-term use. The cellular phone according to the present invention, which achieves lower power consumption and higher image quality, can be provided as a product that is suitable for portable use.

Figure 14D:
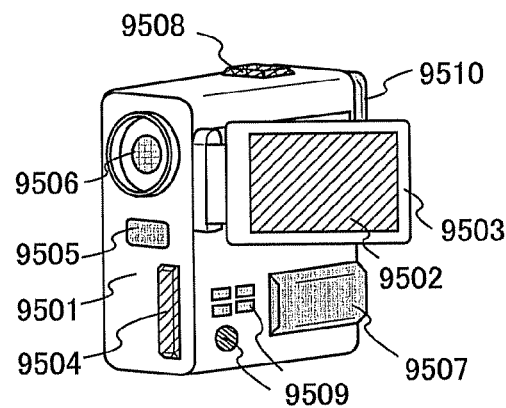

FIG. 14D illustrates a camera according to the present invention, which includes a main body 9501, a display portion 9502, a chassis 9503, an external connection port 9504, a remote control receiving portion 9505, an image receiving portion 9506, a battery 9507, an audio input portion 9508, operation keys 9509, an eye piece portion 9510, and the like. In the camera, the display portion 9502 has light-emitting elements described in any of Embodiments 1 to 3, which are arranged in a matrix. The light-emitting elements have such an advantage that the emission efficiency is high and long-time driving is possible. The display portion 9502 including the light-emitting elements has similar features to achieve light emission with high luminance and a decrease in power consumption. Further, the camera has high reliability and can withstand long-term use. The camera according to the present invention, which achieves lower power consumption and higher image quality, can be provided as a product that is suitable for portable use.

As thus described, application range of the light-emitting device of the present invention is quite wide, and this light-emitting device can be applied to electronic devices of a variety of fields. Use of the light-emitting element of an embodiment of the present invention can provide electronic devices each including a display portion having high emission efficiency, capability of long-time driving, and consuming low power.

Moreover, the light-emitting device of the present invention can be used as a lighting device. An embodiment in which the light-emitting element of the present invention is used for a lighting device will be described with reference to FIG. 15.

Figure 15:
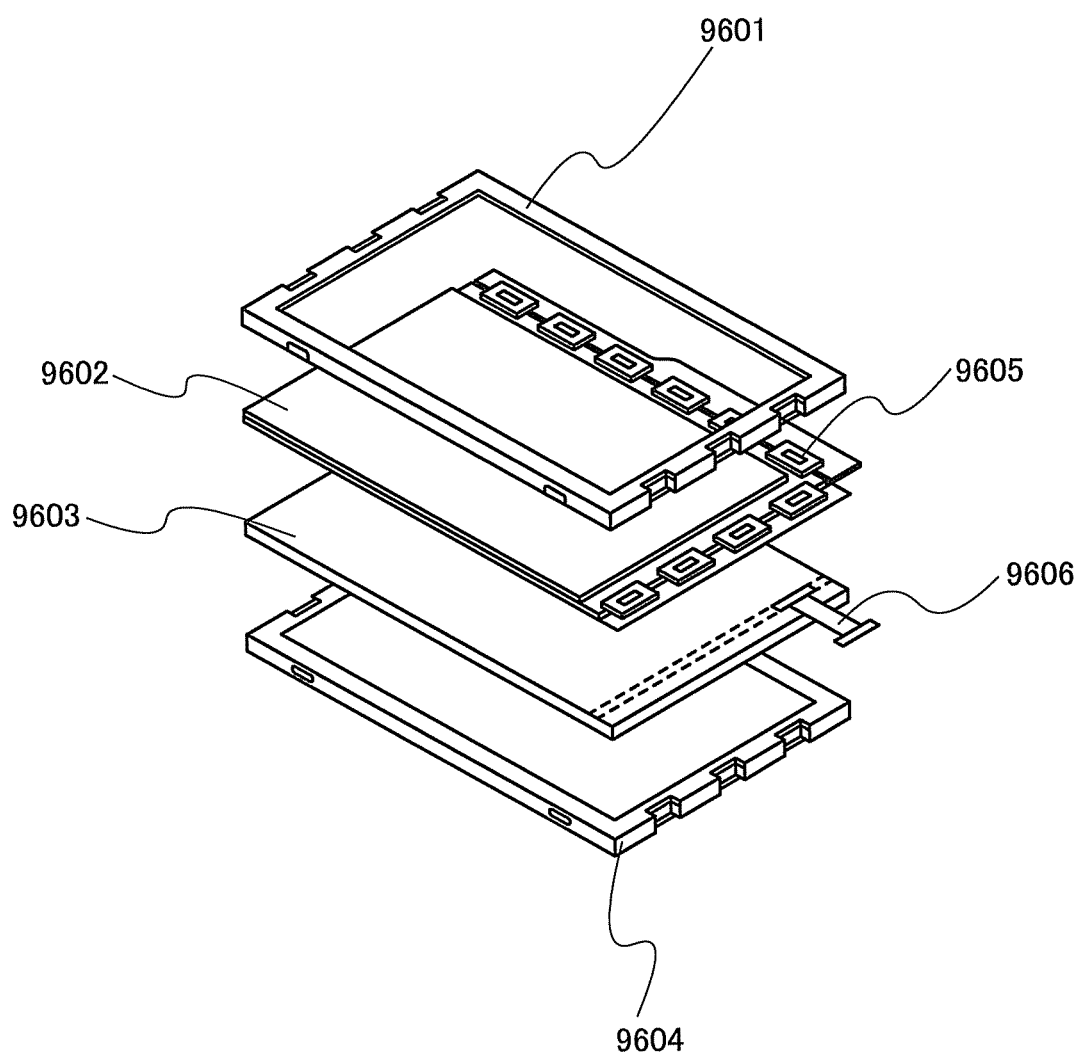
FIG. 15 illustrates a lighting device according to an embodiment.

FIG. 15 illustrates an example of a liquid crystal display device using the light-emitting device of the present invention as a backlight. The liquid crystal display device illustrated in FIG. 15 includes a chassis 9601, a liquid crystal layer 9602, a backlight 9603, and a chassis 9604, and the liquid crystal layer 9602 is connected to a driver IC 9605. The light-emitting device of the present invention is used as the backlight 9603, and a current is supplied through a terminal 9606.

With the use of the light-emitting device of the present invention as the backlight of the liquid crystal display device, a backlight with high emission efficiency and reduced power consumption can be obtained. Moreover, since the light-emitting device of the present invention is a lighting device having flat emission surface and the enlargement of the light-emitting device is possible, the backlight can be made larger and the liquid crystal display device can also have a larger area. Moreover, since the light-emitting device of the present invention is thin and consumes less power, reduction in thickness and power consumption of the display device is possible. Further, since the light-emitting device of the present invention can exhibit light emission with high luminance, a liquid crystal display device using the light-emitting device of the present invention can also exhibit light emission with high luminance.

Figure 16:
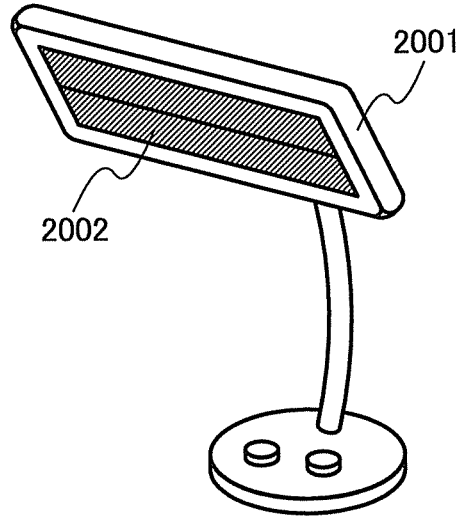
FIG. 16 illustrates a lighting device according to an embodiment.

FIG. 16 illustrates an example in which a light-emitting device to which the present invention is applied is used as a table lamp, which is one of lighting devices. A table lamp shown in FIG. 16 has a chassis 2001 and a light source 2002, and the light-emitting device of the present invention is used as the light source 2002. Since the light-emitting device of the present invention has high emission efficiency, can be driven for a long time, and has reduced power consumption, the table lamp also has high emission efficiency, can be driven for a long time, and has reduced power consumption.

Figure 17:
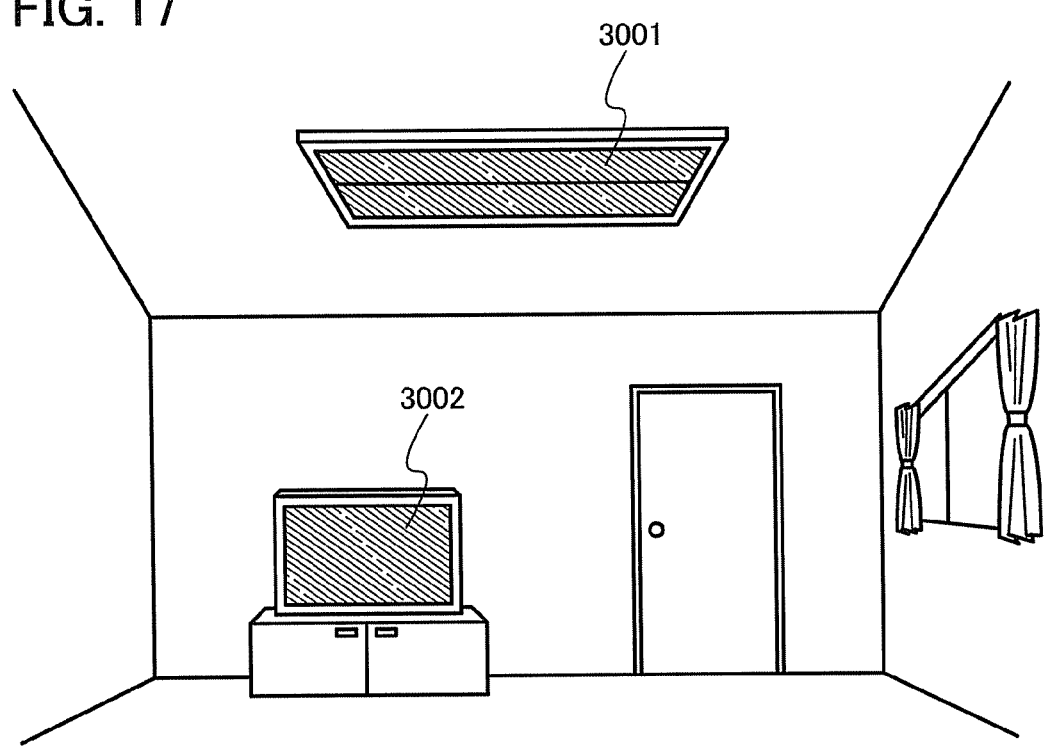
FIG. 17 illustrates a lighting device and an electric device according to an embodiment.

FIG. 17 illustrates an example in which a light-emitting device to which the present invention is applied is used as an indoor lighting device 3001.

Since the light-emitting device of the present invention can be enlarged, the light-emitting device can be used as a large-area lighting device. Further, since the light-emitting device of the present invention has a thin shape and consumes reduced power, the light-emitting device of the present invention can be used as a lighting device having a thin shape and consuming low power. A television set 3002 relating to the present invention as shown in FIG. 14A can be placed in a room where the light emitting device to which the present invention is applied is used as the indoor lighting device 3001. Thus, public broadcasting and movies can be watched. In such a case, since both of the devices consume reduced power, a powerful image can be watched in a bright room without concern about electricity charges. Further, a lighting device to which the light-emitting device of the present invention is applied has high reliability and can withstand long-term use.

EXAMPLE 1

A method for manufacturing a light-emitting element of an embodiment of the present invention, and measurement results of element characteristics thereof are described. Detailed structures of the light-emitting elements manufactured are shown in Table 1.

Structural formulas of the organic compounds used in Example 1 are shown below.

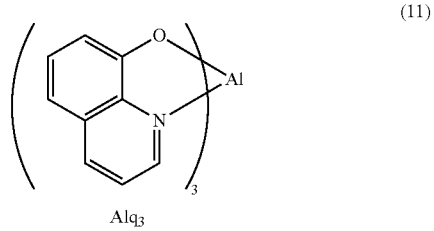

Alq₃  (11)

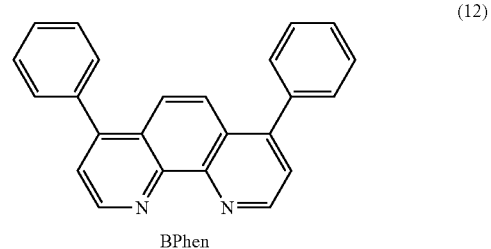

BPhen  (12)

TABLE 1

|  | 1502 | 1512 | 1513a | 1513b | 1513c | 1514a | 1514b | 1515 | 1504 |
|---|---|---|---|---|---|---|---|---|---|
| Light-emitting element 1 | ITSO 110 nm | PCzPA:MoOx (=4:1) 50 nm | PCzPA:DPQd (=1:0.02) 20 nm | PCzPA:2PCAPA (=1:0.04) 30 nm | — | Alq 10 nm | Bphen 20 nm | LiF 1 nm | Al 200 nm |
| Light-emitting element 2 | ITSO 110 nm | PCzPA:MoOx (=4:1) 50 nm | PCzPA:DPQd (=1:0.02) 30 nm | CzPA:2PCAPA (=1:0.05) 30 nm | — | Alq 10 nm | Bphen 20 nm | LiF 1 nm | Al 200 nm |
| Light-emitting element 3 | ITSO 110 nm | CzPA:MoOx (=4:2) 50 nm | PCzPA:DPQd (=1:0.02) 30 nm | 2PCzPA:2PCAPA (=1:0.05) 20 nm | CzPA:2DPAPA (=1:0.04) 30 nm | Alq 10 nm | Bphen 20 nm | LiF 1 nm | Al 200 nm |

Table 2 shows the HOMO levels and the LUMO levels of the organic compounds used in Example 1. Note that the HOMO levels and the LUMO levels obtained by cyclic voltammetry (CV) measurement are shown here. A method for measuring the HOMO levels and the LUMO levels by cyclic voltammetry (CV) measurement is described in Example 2 below.

TABLE 2

| Material | HOMO[a] (eV) | LUMO[a] (eV) |
|---|---|---|
| Alq | −5.58 | −2.69 |
| Bphen |  | −2.66 |
| CzPA | −5.79 | −2.73 |
| DPQd | −5.73 | −3.28 |
| PCzPA | −5.79 | −2.70 |
| 2DPAPA | −5.18 | −2.69 |
| 2PCAPA | −5.29 | −2.70 |
| 2PCzPA | −5.67 | −2.74 |

[a]Measured by the CV method

-continued

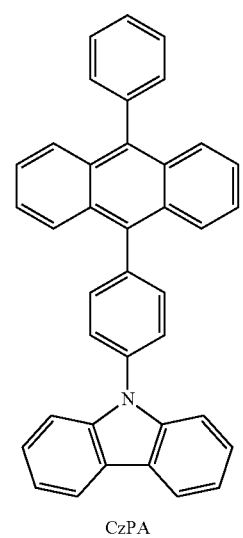

CzPA  (13)

(14)

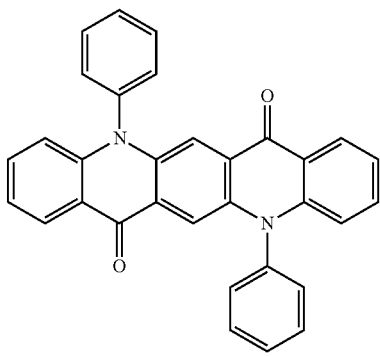

DPQd (15)

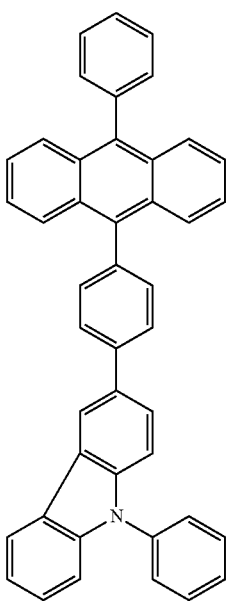

PCzPA (16)

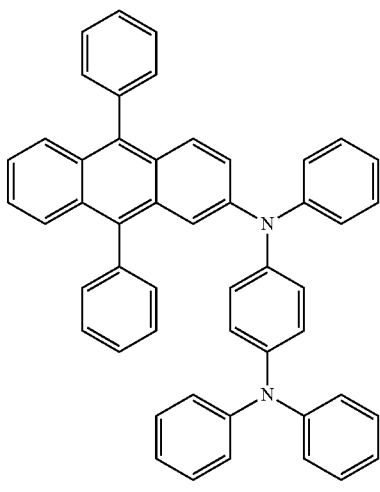

2DPAPA (17)

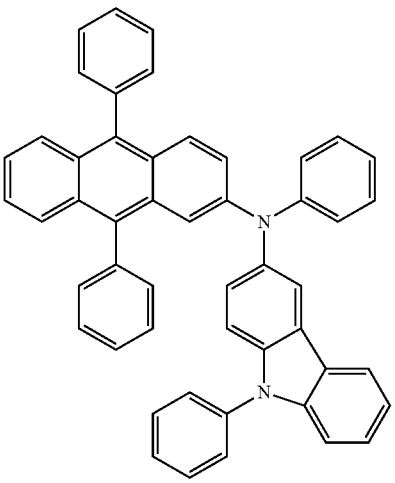

2PCAPA (18)

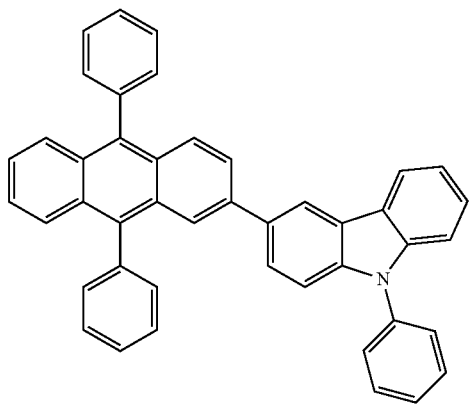

2PCzPA (Manufacture of Light-Emitting Element 1)

Figure 6A:
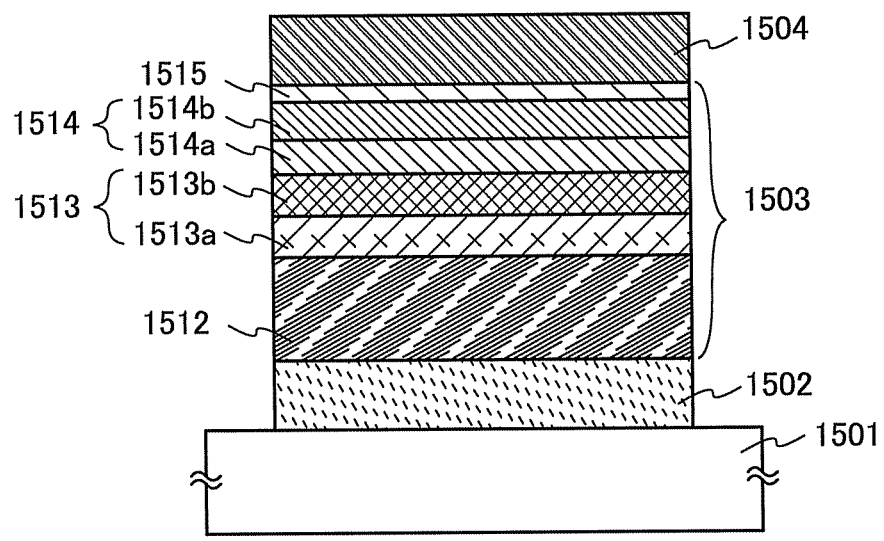
FIGS. 6A to 6C illustrate light-emitting elements according to Examples.
Figure 6B:
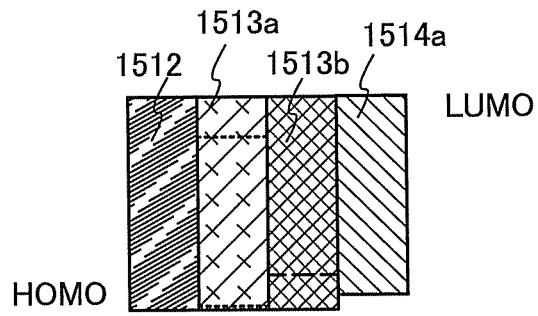

FIG. 6A illustrates an element structure of Light-emitting element 1, which is described in Example 1, and FIG. 6B illustrates part of a band structure thereof. Light-emitting element 1 includes an EL layer 1503 having a stack of plural layers over a first electrode 1502. In Example 1, the EL layer 1503 has a structure in which a hole-transport layer 1512, a light-emitting layer 1513 (a first light-emitting layer 1513a and a second light-emitting layer 1513b), an electron-transport layer 1514, and an electron-injection layer 1515 are stacked in that order.

Further, the electron-transport layer 1514 of Light-emitting element 1 of Example 1 includes two layers of a first electron-transport layer 1514a and a second electron-transport layer 1514b. FIG. 6B shows the correlation of bands of the hole-transport layer 1512, the first light-emitting layer 1513a, the second light-emitting layer 1513b, and the first electron-transport layer 1514a in Light-emitting element 1.

In Light-emitting element 1, the same organic material (PCzPA) was used for the host materials in the hole-transport layer 1512, the first light-emitting layer 1513a, and the second light-emitting layer 1513b which means that these layers have the same HOMO levels and LUMO levels. The HOMO level of a light-emitting material contained in the first light-emitting layer 1513a is substantially the same as the HOMO level of the host material contained therein. The HOMO level of a light-emitting material contained in the second light-emitting layer 1513b is shallower than the HOMO level of the host material contained therein by 0.50 eV, and a hole trap level is formed therein.

Next, a method for manufacturing Light-emitting element 1 is described. First, indium oxide-tin oxide containing silicon oxide (ITSO) was deposited on a glass substrate 1501 by a sputtering method, so that the first electrode 1502 was formed. Note that the thickness was 110 nm and the electrode area was 2 mm×2 mm.

The substrate provided with the first electrode 1502 was fixed to a substrate holder provided in a vacuum deposition apparatus such that a surface of the substrate where the first electrode 1502 was provided faced downward, and then the pressure in a chamber of the apparatus was reduced to about $10^{-4}$ Pa. After that, the hole-transport layer 1512 was formed on the first electrode 1502. The hole-transport layer 1512 was formed using a film obtained by co-evaporation of 9-phenyl-3-[4-(10-phenyl-9-anthryl)phenyl]-9H-carbazol (abbreviation: PCzPA) and molybdenum(VI) oxide. The thickness of the hole-transport layer 1512 was 50 nm, and the evaporation rate was adjusted such that the weight ratio of PCzPA to molybdenum(VI) oxide was 4:1 (=PCzPA:molybdenum oxide). Note that the co-evaporation refers to an evaporation method in which evaporation is carried out from a plurality of evaporation sources at the same time in one treatment chamber.

Next, the first light-emitting layer 1513a was formed on the hole-transport layer 1512. The first light-emitting layer 1513a was formed using a film obtained by co-evaporation of PCzPA and N,N'-diphenylquinacridone (abbreviation: DPQd). The thickness of the first light-emitting layer 1513a was 20 nm, and the evaporation rate was adjusted such that the weight ratio of PCzPA to DPQd was 1:0.02 (=PCzPA:DPQd).

Next, the second light-emitting layer 1513b was formed on the first light-emitting layer 1513a. The second light-emitting layer 1513b was formed using a film obtained by co-evaporation of PCzPA and N,9-diphenyl-N-(9,10-diphenyl-2-anthryl)-9H-carbazol-3-amine (abbreviation: 2PCAPA). The thickness of the second light-emitting layer 1513b was 30 nm, and the evaporation rate was adjusted such that the weight ratio of PCzPA to 2PCAPA was 1:0.04 (=PCzPA:2PCAPA).

The electron-transport layer 1514 was further formed on the second light-emitting layer 1513b. The electron-transport layer 1514 was formed using a stacked-layer film which was formed such that tris(8-quinolinolato)aluminum (abbreviation: Alq) was deposited to a thickness of 10 nm and bathophenanthroline (abbreviation: BPhen) was deposited thereon to a thickness of 20 nm.

The electron-injection layer 1515 was formed on the electron-transport layer 1514. The electron-injection layer 1515 was formed using lithium fluoride (LiF), and the thickness thereof was 1 nm.

Finally, the second electrode 1504 was formed on the electron-injection layer 1515. The second electrode 1504 was formed using aluminum, and the thickness thereof was 200 nm. Thus, Light-emitting element 1 was manufactured.

Sealing was performed in a glove box under a nitrogen atmosphere so that the resulting Light-emitting element 1 in the present invention was not exposed to the atmosphere, and then operation characteristics of this light-emitting element were measured. Note that the measurement was carried out at room temperature (in an atmosphere kept at 25° C.).

Figure 8:
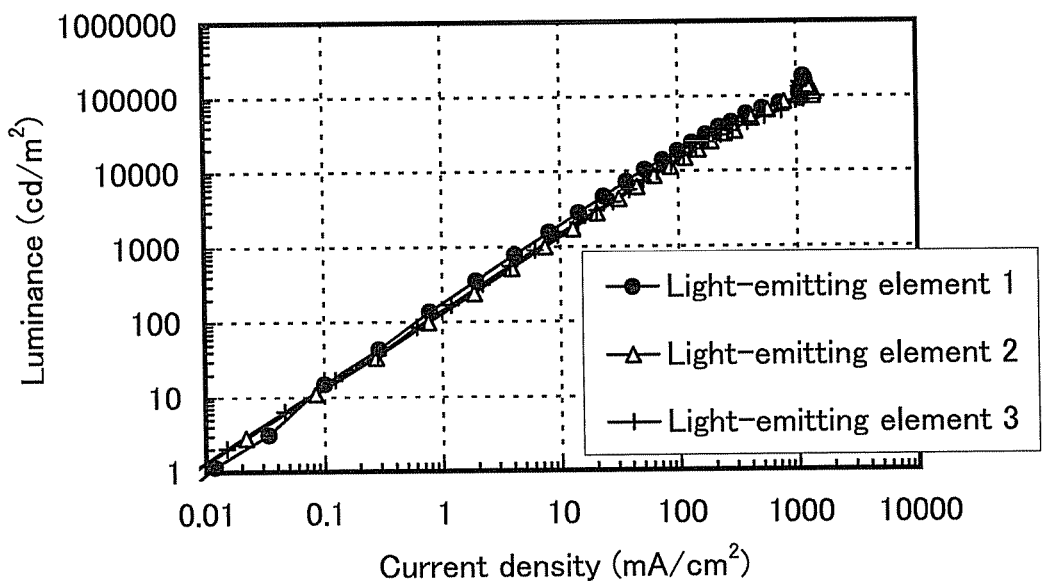
FIG. 8 shows current density-luminance characteristics of Light-emitting elements 1 to 3.
Figure 9:
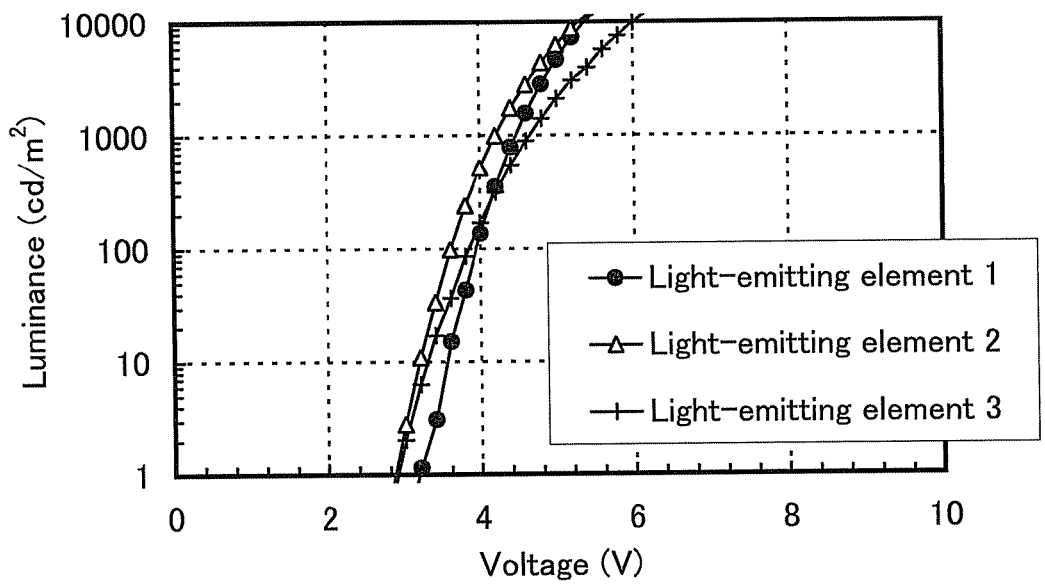
FIG. 9 shows voltage-luminance characteristics of Light-emitting elements 1 to 3.
Figure 10:
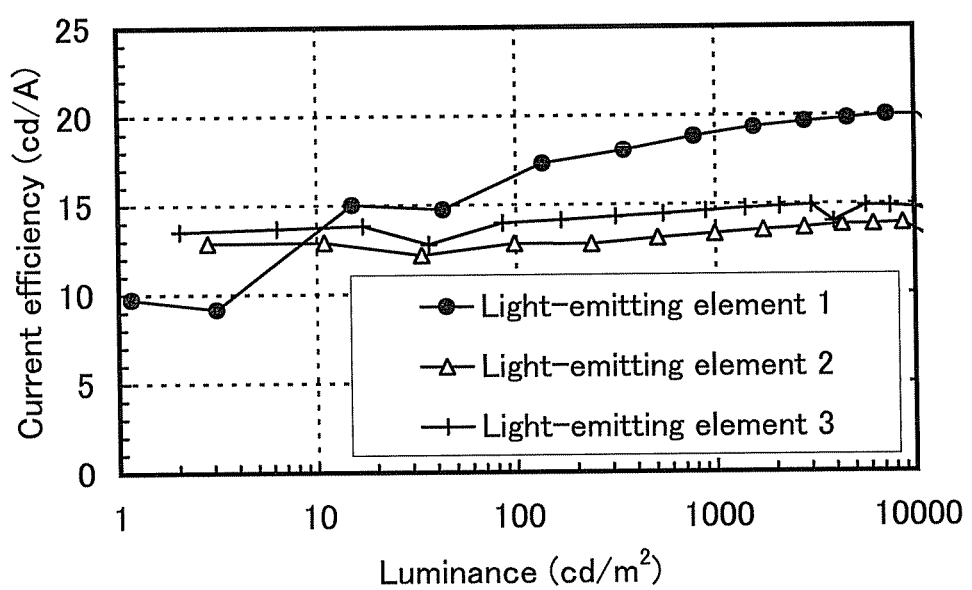
FIG. 10 shows luminance-current efficiency characteristics of Light-emitting elements 1 to 3.
Figure 11:
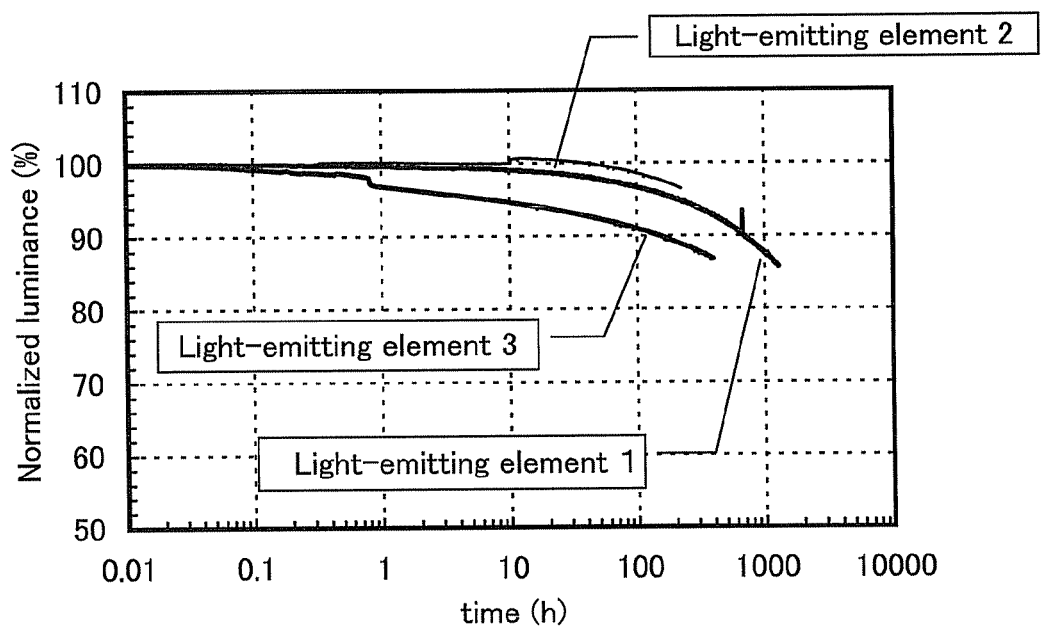
FIG. 11 shows results of continuous lighting tests in which Light-emitting elements 1 to 3 are continuously lit by constant current driving.

FIG. 8 illustrates current density-luminance characteristics of Light-emitting element 1. FIG. 9 illustrates voltage-luminance characteristics thereof. FIG. 10 illustrates luminance-current efficiency characteristics thereof. FIG. 11 illustrates time dependence of normalized luminance of Light-emitting element 1 when the initial luminance was set to approximately 5000 cd/m².

The CIE chromaticity coordinate of Light-emitting element 1 at a luminance of 1000 cd/m² was x=0.27, y=0.65, and green light was emitted. The current efficiency, the voltage, and the current density at the luminance of 1000 cd/m² were 18.8 cd/A, 4.4 V, and 41.7 mA/cm², respectively. According to FIG. 11, Light-emitting element 1 exhibited 92% of the initial luminance even when 400 hours passed, and it is apparent that Light-emitting element 1 is a long-lifetime light-emitting element.

As described above, a long-lifetime light-emitting element with high efficiency was obtained by application of the present invention.

(Manufacture of Light-Emitting Element 2)

Figure 6C:
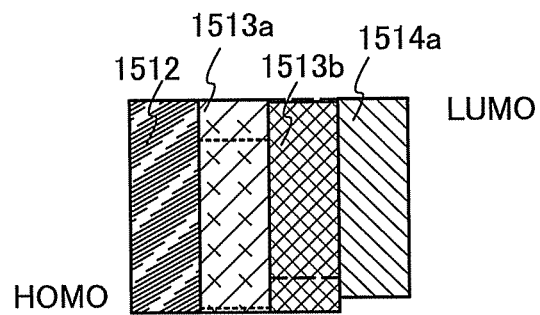

FIG. 6A illustrates an element structure of Light-emitting element 2, which is described in Example 1, and FIG. 6C illustrates part of a band structure thereof. A host material contained in a second light-emitting layer 1513b included in Light-emitting element 2 is different from the host material contained in the second light-emitting layer 1513b included in Light-emitting element 1. Since the other structure is the same as that of Light-emitting element 1, detailed description is omitted here.

Further, the electron-transport layer 1514 of Light-emitting element 2 of Example 1 includes two layers. FIG. 6C shows the correlation of bands of the hole-transport layer 1512, the first light-emitting layer 1513a, the second light-emitting layer 1513b, and a first electron-transport layer 1514a of Light-emitting element 2.

In Light-emitting element 2, the hole-transport layer 1512 and a light-emitting layer 1513 (the first light-emitting layer 1513a and the second light-emitting layer 1513b) were formed using organic materials which have substantially the same HOMO levels and LUMO levels. The HOMO level of a light-emitting material contained in the first light-emitting layer 1513a is substantially the same as the HOMO level of a host material contained therein. The HOMO level of a light-emitting material contained in the second light-emitting layer 1513b is shallower than the HOMO level of a host material contained therein by 0.50 eV, and a hole trap level is formed.

Subsequently, a method for manufacturing Light-emitting element 2 is described. The hole-transport layer 1512 was formed on the first electrode 1502 with the use of a substrate which is similar to that used for Light-emitting element 1. The hole-transport layer 1512 was formed using a film obtained by co-evaporation of PCzPA and molybdenum(VI) oxide. The thickness of the hole-transport layer 1512 was 50 nm, and the evaporation rate was adjusted such that the weight ratio of PCzPA to molybdenum(VI) oxide was 4:1 (=PCzPA:molybdenum oxide).

Next, the first light-emitting layer 1513a was formed on the hole-transport layer 1512. The first light-emitting layer 1513a was formed using a film obtained by co-evaporation of PCzPA and DPQd. The thickness of the first light-emitting layer 1513a was 30 nm, and the evaporation rate was adjusted such that the weight ratio of PCzPA to DPQd was 1:0.02 (=PCzPA:DPQd).

Then, the second light-emitting layer 1513b was formed on the first light-emitting layer 1513a. The second light-emitting layer 1513b was formed using a film obtained by co-evaporation of 9-[4-(N-carbazolyl)phenyl]-10-phenylanthracene (abbreviation: CzPA) and 2PCAPA. The thickness of the second light-emitting layer 1513b was 30 nm, and the evaporation rate was adjusted such that the weight ratio of CzPA to 2PCAPA was 1:0.05 (=CzPA:2PCAPA).

The electron-transport layer 1514 was further formed on the second light-emitting layer 1513b. The electron-transport layer 1514 includes two layers of a first electron-transport layer 1514a and a second electron-transport layer 1514b. Tris(8-quinolinolato)aluminum(III) (abbreviation: Alq) was deposited to a thickness of 10 nm as the first electron-transport layer 1514a, and bathophenanthroline (abbreviation: BPhen) was deposited thereon to a thickness of 20 nm as the second electron-transport layer 1514b.

The electron-injection layer 1515 was formed on the electron-transport layer 1514. The electron-injection layer 1515 was formed using lithium fluoride (LiF), and the thickness thereof was 1 nm.

Finally, the second electrode 1504 was formed on the electron-injection layer 1515. The second electrode 1504 was formed using aluminum, and the thickness thereof was 200 nm. Thus, Light-emitting element 2 was manufactured.

Sealing was performed in a glove box under a nitrogen atmosphere so that the resulting Light-emitting element 2 in the present invention was not exposed to the atmosphere, and then operation characteristics of this light-emitting element were measured. Note that the measurement was carried out at room temperature (in an atmosphere kept at 25° C.).

FIG. 8 illustrates current density-luminance characteristics of Light-emitting element 2. FIG. 9 illustrates voltage-luminance characteristics thereof. FIG. 10 illustrates luminance-current efficiency characteristics thereof. FIG. 11 illustrates time dependence of normalized luminance of Light-emitting element 2 when the initial luminance was set to approximately 5000 cd/m$^2$.

The CIE chromaticity coordinate of Light-emitting element 2 at a luminance of 1000 cd/m$^2$ was x=0.32, y=0.60, and green light was emitted. The current efficiency, the voltage, and the current density at the luminance of 1000 cd/m$^2$ were 13.3 cd/A, 4.2 V, and 7.4 mA/cm$^2$, respectively. According to FIG. 11, Light-emitting element 2 exhibited 97% of the initial luminance even when 200 hours passed, and it is apparent that Light-emitting element 2 is a long-lifetime light-emitting element.

As described above, a long-lifetime light-emitting element with high efficiency was obtained by application of the present invention.

(Manufacture of Light-Emitting Element 3)

Figure 7A:
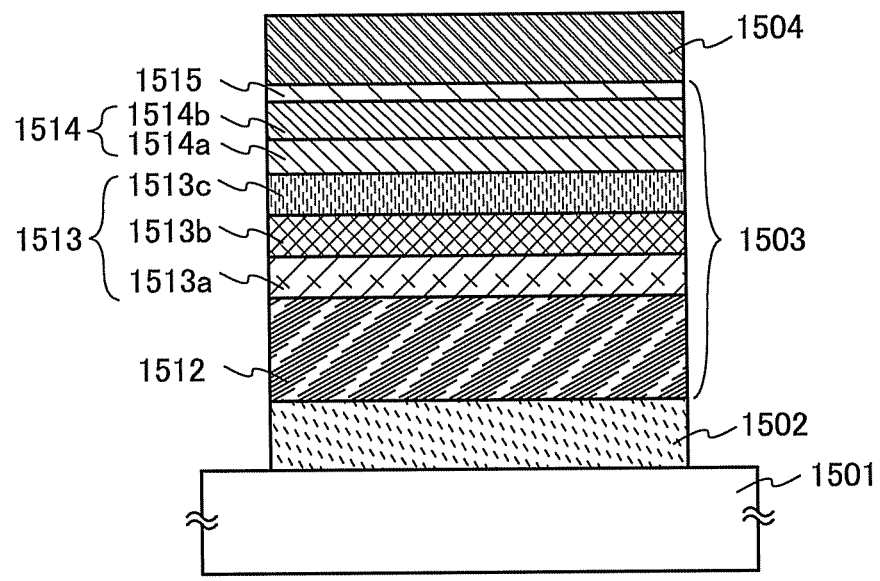
FIGS. 7A and 7B illustrate a light-emitting element according to an Example.
Figure 7B:
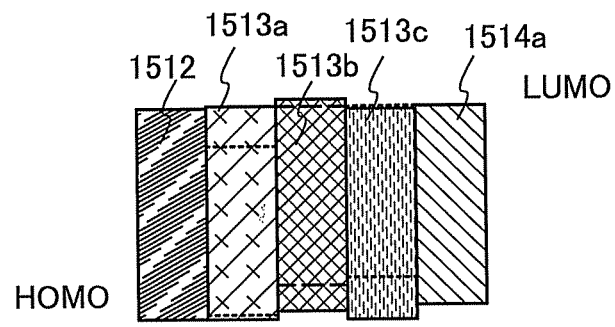

FIG. 7A illustrates an element structure of Light-emitting element 3, which is described in Example 1, and FIG. 7B illustrates part of a band structure thereof. Light-emitting element 3 includes an EL layer 1503 having a stack of plural layers over a first electrode 1502. In Example 1, the EL layer 1503 has a structure in which a hole-transport layer 1512, a first light-emitting layer 1513a, a second light-emitting layer 1513b, a third light-emitting layer 1513c, an electron-transport layer 1514, and an electron-injection layer 1515 are stacked in that order.

Further, the electron-transport layer 1514 includes two layers of a first electron-transport layer 1514a and a second electron-transport layer 1514b. FIG. 7B shows the correlation of bands of the hole-transport layer 1512, the first light-emitting layer 1513a, the second light-emitting layer 1513b, the third light-emitting layer 1513c, and the first electron-transport layer 1514a in Light-emitting element 3.

In Light-emitting element 3, the hole-transport layer 1512, the first light-emitting layer 1513a, the second light-emitting layer 1513b, and the third light-emitting layer 1513c were formed using organic materials which have substantially the same HOMO levels and LUMO levels. The HOMO level of a light-emitting material contained in the first light-emitting layer 1513a is substantially the same as the HOMO level of a host material contained therein. The HOMO level of a light-emitting material contained in the second light-emitting layer 1513b is shallower than the HOMO level of a host material contained therein by 0.38 eV, and a hole trap level is formed. The HOMO level of a light-emitting material contained in the third light-emitting layer 1513c is shallower than the HOMO level of a host material contained therein by 0.61 eV, and a hole trap level is formed.

Next, a method for manufacturing Light-emitting element 3 is described. A substrate which is similar to that used for Light-emitting element 1 was used, and the hole-transport layer 1512 was formed on the first electrode 1502. The hole-transport layer 1512 was formed using a film obtained by co-evaporation of CzPA and molybdenum(VI) oxide. The thickness of the hole-transport layer 1512 was 50 nm, and the evaporation rate was adjusted such that the weight ratio of CzPA to molybdenum(VI) oxide was 4:2 (=CzPA:molybdenum oxide).

Next, the first light-emitting layer 1513a was formed on the hole-transport layer 1512. The first light-emitting layer 1513a was formed using a film obtained by co-evaporation of PCzPA and DPQd. The thickness of the first light-emitting layer 1513a was 30 nm, and the evaporation rate was adjusted such that the weight ratio of PCzPA to DPQd was 1:0.02 (=PCzPA:DPQd).

Then, the second light-emitting layer 1513b was formed on the first light-emitting layer 1513a. The second light-emitting layer 1513b was formed using a film obtained by co-evaporation of 3-(9,10-diphenyl-2-anthryl)-9-phenyl-9H-carbazole (abbreviation: 2PCzPA) and 2PCAPA. The thickness of the second light-emitting layer 1513b was 20 nm, and the evaporation rate was adjusted such that the weight ratio of 2PCzPA to 2PCAPA was 1:0.05 (=2PCzPA:2PCAPA).

The third light-emitting layer 1513c was formed on the second light-emitting layer 1513b. The third light-emitting layer 1513c was formed using a film obtained by co-evaporation of CzPA and 9,10-diphenyl-2-N,N',N'-triphenyl-1,4-phenylenediamine-N-yl)anthracene (abbreviation: 2DPAPA). The thickness of the third light-emitting layer 1513c was 30 nm, and the evaporation rate was adjusted such that the weight ratio of CzPA to 2DPAPA was 1:0.04 (=CzPA:2DPAPA).

The electron-transport layer 1514 was further formed on the third light-emitting layer 1513c. The electron-transport layer 1514 was formed using a stacked-layer film which was formed such that tris(8-quinolinolato)aluminum(III) (abbreviation: Alq) was deposited to a thickness of 10 nm and bathophenanthroline (abbreviation: BPhen) was deposited thereon to a thickness of 20 nm.

The electron-injection layer 1515 was formed on the electron-transport layer 1514. The electron-injection layer 1515 was formed using lithium fluoride (LiF), and the thickness thereof was 1 nm.

Finally, the second electrode 1504 was formed on the electron-injection layer 1515. The second electrode 1504 was formed using aluminum, and the thickness thereof was 200 nm. Thus, Light-emitting element 3 was manufactured.

Sealing was performed in a glove box under a nitrogen atmosphere so that the resulting Light-emitting element 3 in the present invention was not exposed to the atmosphere, and then operation characteristics of this light-emitting element were measured. Note that the measurement was carried out at room temperature (in an atmosphere kept at 25° C.).

FIG. 8 illustrates current density-luminance characteristics of Light-emitting element 3. FIG. 9 illustrates voltage-luminance characteristics thereof. FIG. 10 illustrates luminance-current efficiency characteristics thereof. FIG. 11 illustrates time dependence of normalized luminance of Light-emitting element 3 when the initial luminance was set to approximately 5000 cd/m$^2$.

The CIE chromaticity coordinate of Light-emitting element 3 at a luminance of 1000 cd/m$^2$ was x=0.30, y=0.61, and green light was emitted. The current efficiency, the voltage, and the current density at the luminance of 1000 cd/m$^2$ were 14.6 cd/A, 4.6 V, and 6.1 mA/cm$^2$, respectively. According to FIG. 11, Light-emitting element 3 exhibited 87% of the initial luminance even when 400 hours passed, and it is apparent that Light-emitting element 3 is a long-lifetime light-emitting element.

As described above, a long-lifetime light-emitting element with high efficiency was obtained by application of the present invention.

EXAMPLE 2

In this example, a method for measuring the HOMO levels and the LUMO levels of materials used for a light-emitting element of an embodiment of the present invention is described.

Here, an embodiment of a method for measuring the HOMO levels and the LUMO levels by cyclic voltammetry (CV) measurement is described.

An oxidation-reduction characteristic was explored by cyclic voltammetry (CV) measurement. Note that an electrochemical analyzer (ALS model 600A or 600C, manufactured by BAS Inc.) was used for the measurement.

A platinum electrode (manufactured by BAS Inc., PTE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE-7 non-aqueous reference electrode) was used as a reference electrode. The measurement was conducted at room temperature (20° C. to 25° C.). The scan rate at the CV measurement was set to 0.1 V/sec in all the measurement.

As for a sample solution used for the CV measurement, dehydrated N,N-dimethylformamide (DMF, product of Sigma-Aldrich Inc., 99.8%, catalog No. 22705-6) was used as a solvent, and tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration of tetra-n-butylammonium perchlorate was 100 mmol/L. The object to be measured was also dissolved in the solvent such that the concentration thereof was 2 mmol/L.

(Calculation of Potential Energy of Reference Electrode with Respect to Vacuum Level)

A method for calculating the potential energy (eV) of a reference electrode (Ag/Ag$^+$ electrode) used for measurement, with respect to a vacuum level is described. Note that the potential energy of the reference electrode (Ag/Ag$^+$ electrode) with respect to the vacuum level corresponds to the Fermi level of the Ag/Ag$^+$ electrode.

The potential energy of the reference electrode (Ag/Ag$^+$ electrode) with respect to the vacuum level may be calculated from a value obtained by measuring a substance whose potential energy from a vacuum level is known, with the use of the reference electrode (Ag/Ag$^+$ electrode).

Specifically, it is known that the potential energy of a standard hydrogen electrode from the vacuum level is −4.44 eV (Reference: Toshihiro Ohnishi and Tamami Koyama, High molecular EL material, Kyoritsu shuppan, pp. 64-67). It is also known that the oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp. 83-96, 2002). Therefore, the oxidation-reduction potential of ferrocene with respect to the vacuum level is −4.44−0.61=−5.05 [eV].

As an example, with the use of the reference electrode (Ag/Ag$^+$ electrode) used in Example 2, the oxidation-reduction potential of ferrocene in methanol was estimated to be +0.11 V [vs. Ag/Ag$^+$]. Therefore, the potential energy of the reference electrode (Ag/Ag$^+$ electrode) used in Example 2 from the vacuum level was able to be calculated, which was −5.05+0.11=−4.94 [eV].

(Calculation of HOMO Level)

The potential of a working electrode with respect to a reference electrode is scanned in the range of positive values, and a sample solution which is prepared in the above-described manner is measured by CV measurement. The range of positive values here denotes a range in which an oxidation occurs, typically, a range in which one-electron oxidation of the sample occurs.

An oxidation peak potential Epa and a reduction peak potential Epc are obtained from CV measurement, and a half-wave potential (a potential intermediate between Epa and Epc) is calculated. The half-wave potential (Epa+Epc)/2 [V vs. Ag/Ag$^+$] represents a measure value of electric energy needed for an oxidation on a working electrode with respect to a reference electrode. Thus, the potential energy with respect to the vacuum level is −4.94−(Epa+Epc)/2 [eV].

(Calculation of LUMO Level)

The potential of a working electrode with respect to a reference electrode is scanned in the range of negative values, and a sample solution which is prepared in the above-described manner is measured by CV measurement. The range of negative values here denotes a range in which a reduction occurs, typically, a range in which one-electron reduction of the sample occurs.

A reduction peak potential Epc and an oxidation peak potential Epa are obtained from CV measurement, and a half-wave potential (a potential intermediate between Epc and Epa) is calculated. The half-wave potential (Epa+Epc)/2 [V vs. Ag/Ag$^+$] represents a measure value of electric energy needed for a reduction on a working electrode with respect to a reference electrode. Thus, the potential energy with respect to the vacuum level is −4.94−(Epa+Epc)/2 [eV].

Note that the HOMO level and the LUMO level of a material used for the light-emitting element of an embodiment of the present invention can be measured with a photoelectron spectrometer (AC-2, product of Riken Keiki Co., Ltd.). The HOMO level of a thin-film sample is measured in the atmosphere with a photoelectron spectrometer (AC-2, product of Riken Keiki Co., Ltd.). The absorption spectrum of the thin-film sample is measured with ultraviolet-visible spectrophotometer (V-550, manufactured by JASCO Corporation), and with the use of the absorption spectrum, an absorption edge is obtained from a Tauc plot. An energy gap in a solid state is estimated from the absorption edge. The energy gap is added to the HOMO level, whereby the LUMO level can be estimated.

EXAMPLE 3

In Example 3, a recombination region of holes and electrons in a light-emitting element of an embodiment of the present invention is examined by calculation, and results of the calculation are described.

Figure 18A:
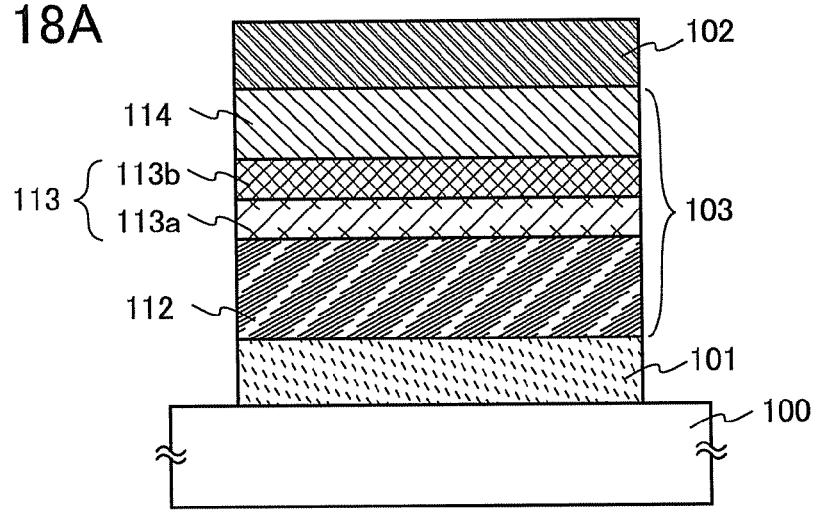
FIGS. 18A and 18B illustrate a light-emitting element according to an Example.

The structure of a light-emitting element used for the calculation in Example 3 is illustrated in FIG. 18A. The light-emitting element of Example 3 included a first electrode 101, a second electrode 102, and an EL layer 103. The first electrode 101 was formed over a substrate 100. The first electrode 101 served as an anode, and the second electrode 102 served as a cathode.

The EL layer 103 included a hole-transport layer 112, a first light-emitting layer 113a, a second light-emitting layer 113b, and an electron-transport layer 114. The hole-transport layer 112 was provided between the electrode serving as an anode and the first light-emitting layer 113a and was in contact with the anode and a side on the anode side of the first light-emitting layer 113a. The second light-emitting layer 113b was provided between the first light-emitting layer 113a and the electrode serving as a cathode and was in contact with a side on the cathode side of the first light-emitting layer 113a. The electron-transport layer 114 was provided between the second light-emitting layer 113b and the electrode serving as a cathode and was in contact with a side on the cathode side of the second light-emitting layer 113b and the electrode serving as the cathode.

Figure 18B:
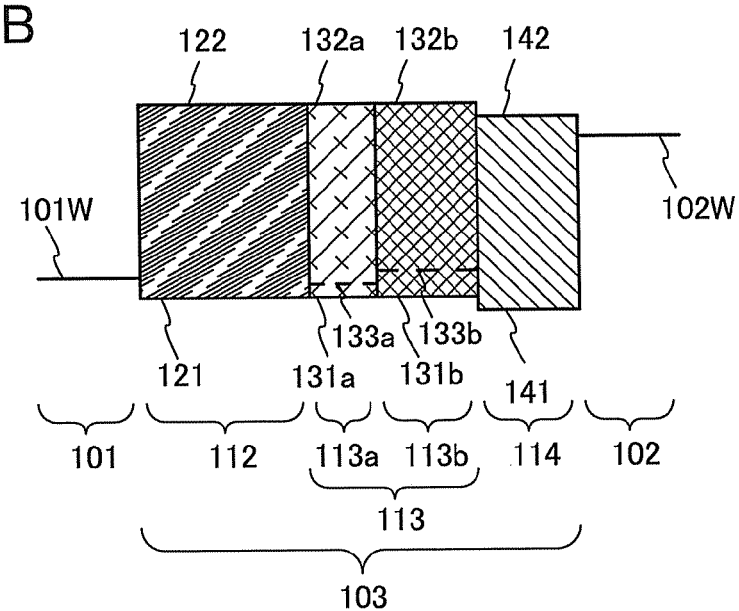

FIG. 18B is a band diagram illustrating the correlation of bands of layers in the EL layer of the light-emitting element of Example 3.

The work function 101W of the first electrode 101 of the light-emitting element illustrated in Example 3 was −5.3 eV. The work function 102W of the second electrode 102 was −3.2 eV.

A HOMO level 121 of a first organic compound contained in the hole-transport layer 112 ($HOMO_{HTL}$), a HOMO level 131a of a host material contained in the first light-emitting layer 113a ($HOMO_{HOST1}$), and a HOMO level 131b of a host material contained in the second light-emitting layer 113b ($HOMO_{HOST2}$) were each −5.6 eV. Note that the HOMO level 133a of the light-emitting material contained in the first light-emitting layer 113a ($HOMO_{EM1}$) and the HOMO level 133b of the light-emitting material contained in the second light-emitting layer 113b ($HOMO_{EM2}$) are also illustrated in FIG. 18B.

A LUMO level 122 of the first organic compound contained in the hole-transport layer 112 ($LUMO_{HTL}$), a LUMO level 132a of the host material contained in the first light-emitting layer 113a ($LUMO_{HOST1}$), and a LUMO level 132b of the host material contained in the second light-emitting layer 113b ($LUMO_{HOST2}$) were each −2.7 eV.

Note that the electron mobility and the hole mobility in the hole-transport layer 112, the first light-emitting layer 113a, and the second light-emitting layer 113b were $1 \times 10^{-7}$ cm$^2$/Vs and $1 \times 10^{-5}$ cm$^2$/Vs, respectively. Note also that the concentration of holes contained in the hole-transport layer 112 was $1 \times 10^{16}$/cm$^3$.

A HOMO level 141 of the electron-transport layer 114 ($HOMO_{ETL}$) and a LUMO level 142 thereof ($LUMO_{ETL}$) were −5.8 eV and −2.9 eV, respectively. Note that the hole mobility and the electron mobility in the electron-transport layer 114 were $1.5 \times 10^{-7}$ cm$^2$/Vs and $1.5 \times 10^{-5}$ cm$^2$/Vs, respectively. Note also that the concentration of electrons contained in the electron-transport layer 114 was $1 \times 10^{16}$/cm$^3$.

The concentration of hole trap levels of both the first light-emitting layer 113a and the second light-emitting layer 113b were $1 \times 10^{19}$/cm$^3$.

The potential of the second electrode 102 was lower than that of the first electrode 101 by 10 V.

Simulation of the light-emitting element having the above structure was performed with use of a device simulator "Atlas" (manufactured by Silvaco Data Systems Inc.), and distribution of the probability of recombination of holes and electrons in the EL layer was calculated. In the simulation, it is possible to assume the position where the recombination occurs to be a light-emitting region. Then, 0.1 eV, 0.2 eV, 0.3 eV, and 0.4 eV were each applied to a depth of the hole trap level $E_{trap\_EM1}$ ($|HOMO_{EM1}-HOMO_{HOST1}|$) of the first light-emitting layer 113a and a depth of the hole trap level $E_{trap\_EM2}$ ($|HOMO_{EM2}-HOMO_{HOST2}|$) of the second light-emitting layer 113b. Calculation was performed on 16 combinations in total.

Figure 18C:
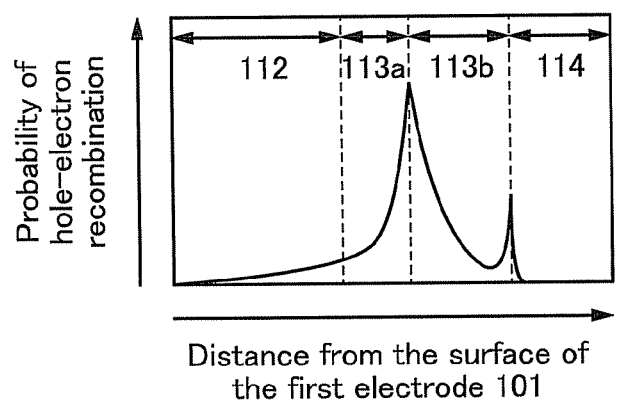
FIG. 18C shows a calculation result to estimate recombination region in a light emitting element according to an Example.

A representative calculation result is shown in a schematic view in FIG. 18C, in which the probability of recombination of holes and electrons with respect to a distance from the first electrode 101 was plotted. In FIG. 18C, positions of the hole-transport layer 112, the first light-emitting layer 113a, the second light-emitting layer 113b, and the electron-transport layer 114 are illustrated as arrows and dotted lines.

Figure 19:
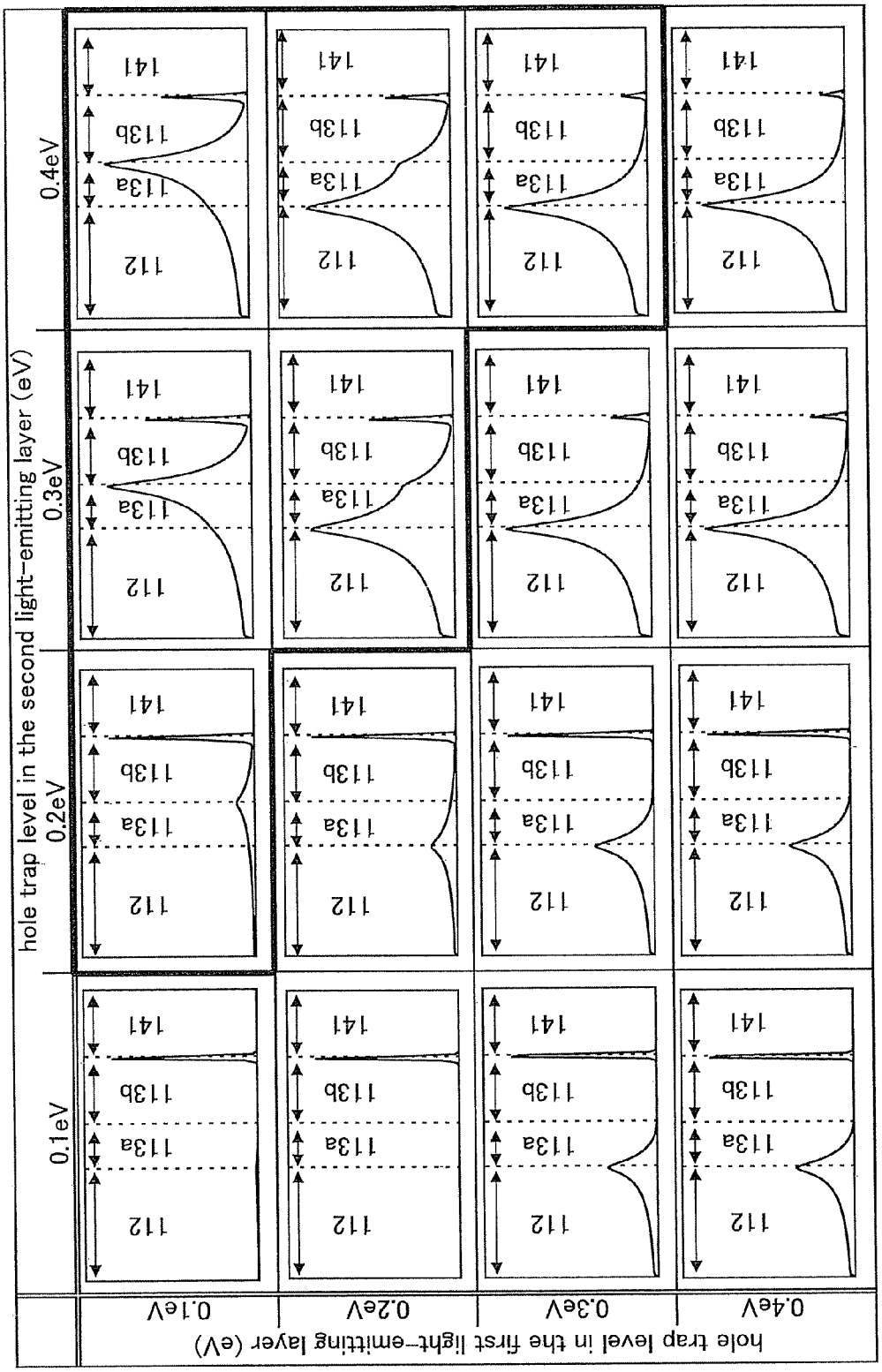
FIG. 19 shows the calculated recombination region for light-emitting elements according to an Example.

FIG. 19 shows calculation results of the 16 combinations. The results of combinations in which the hole trap level in the second light-emitting layer 113b is deeper than the hole trap level in the first light-emitting layer 113a are surrounded by a bold line.

It was confirmed that the probability of recombination of holes and electrons is distributed widely in the first light-emitting layer 113a and the second light-emitting layer 113b and that the light-emitting region is spread entirely in the light-emitting layers with the combination in which the depth of the hole trap level in the second light-emitting layer 113b is deeper than the hole trap level in the first light-emitting layer 113a. For example, in the case where the depth of the hole trap level in the first light-emitting layer 113a is 0.1 eV, it was confirmed that, as the hole trap level in the second light-emitting layer 113b becomes deeper, the probability of recombination of holes and electrons between the second light-emitting layer 113b and the electron-transport layer 114 is decreased and that recombination in the light-emitting layers occurs increasingly. This indicates that holes that pass through the light-emitting layers and reach the electron-transport layer side are reduced in number with increasing depth of the hole trap level in the second light-emitting layer 113b. Thus, it was confirmed that with the element structure of Example 3, the light-emitting region is spread entirely in the light-emitting layers so that emission efficiency is increased, and that the element structure of Example 3 has an effect of preventing deterioration of the electron-transport layer due to holes that reach the electron-transport layer.

EXAMPLE 4

Detailed structures of light-emitting elements and comparative elements manufactured in Example 4 are shown in Table 3.

TABLE 3

|  | 1502 | 1512 | 1513a | 1513b | 1514a | 1514b | 1515 | 1504 |
|---|---|---|---|---|---|---|---|---|
| Light-emitting element 4 | ITSO 110 nm | mDBTPTpII: MoOx (=4:2) 50 nm | mDBTPTpII: Ir(mppr-Me)$_2$dpm (=1:0.05) 20 nm | mDBTPTpII: Ir(2phq)$_3$ (=1:0.04) 30 nm | Alq 10 nm | Bphen 20 nm | LiF 1 nm | Al 200 nm |

TABLE 3-continued

|  | 1502 | 1512 | 1513a | 1513b | 1514a | 1514b | 1515 | 1504 |
|---|---|---|---|---|---|---|---|---|
| Light-emitting element 5 | ITSO 110 nm | mDBTPTpII: MoOx (=4:2) 50 nm | mDBTPTpII: Ir(mppr-Me)₂dpm (=1:0.05) 20 nm | mDBTPTpII: Ir(ppy)₃ (=1:0.04) 30 nm | Alq 10 nm | Bphen 20 nm | LiF 1 nm | Al 200 nm |
| Comparative element 1 | ITSO 110 nm | mDBTPTpII: MoOx (=4:2) 70 nm | — | mDBTPTpII: Ir(2phq)₃ (=1:0.04) 30 nm | Alq 10 nm | Bphen 20 nm | LiF 1 nm | Al 200 nm |
| Comparative element 2 | ITSO 110 nm | mDBTPTpII: MoOx (=4:2) 70 nm | — | mDBTPTpII: Ir(ppy)₃ (=1:0.04) 30 nm | Alq 10 nm | Bphen 20 nm | LiF 1 nm | Al 200 nm |

Structural formulas of organic compounds used in Example 4 are shown below.

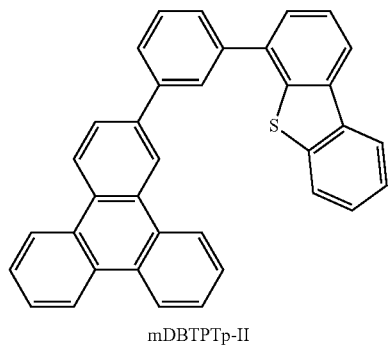

mDBTPTp-II (19)

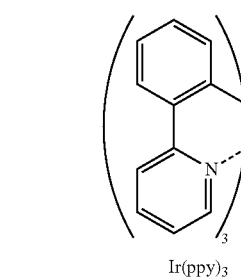

Ir(ppy)₃ (20)

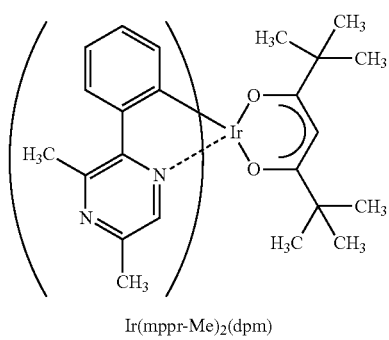

Ir(mppr-Me)₂(dpm) (21)

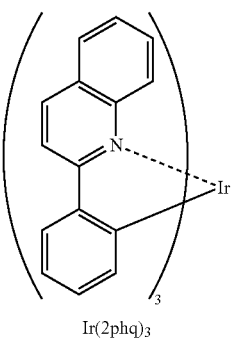

Ir(2phq)₃ (22)

Table 4 shows the HOMO levels and the LUMO levels of the organic compounds used in Example 4. Note that the HOMO levels and the LUMO levels were obtained by cyclic voltammetry (CV) measurement described in Example 2.

TABLE 4

| Material | HOMO$^a$ (eV) | LUMO$^a$ (eV) |
|---|---|---|
| Bphen |  | −2.66 |
| Alq | −5.58 | −2.69 |
| Ir(2phq)₃ | −5.43 | −2.72 |
| Ir(ppy)₃ | −5.32 | −2.29 |
| Ir(mppr-Me)₂dpm | −5.50 | −2.77 |
| mDBTPTpII | −6.24 | −2.36 |

$^a$Measured by the CV method (Manufacture of Light-Emitting Element 4)

Figure 20A:
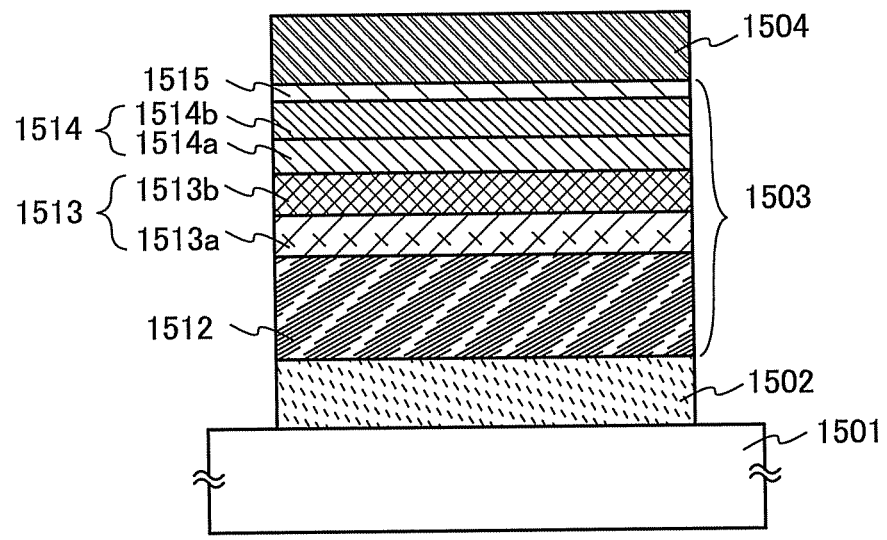
FIGS. 20A to 20C illustrate a light-emitting element according to an Example.
Figure 20B:
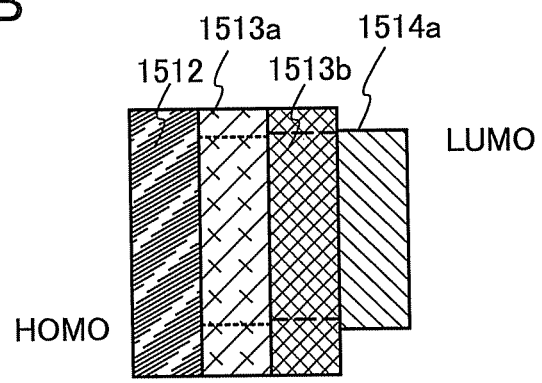

FIG. 20A illustrates an element structure of Light-emitting element 4 manufactured in Example 4, and FIG. 20B illustrates part of a band structure thereof. Light-emitting element 4 includes an EL layer 1503 having a stack of plural layers over a first electrode 1502. The EL layer 1503 of Light-emitting element 4 of Example 4 has a structure in which a hole-transport layer 1512, a light-emitting layer 1513, an electron-transport layer 1514, and an electron-injection layer 1515 are stacked in that order. Note that the light-emitting layer 1513 has a structure in which a second light-emitting layer 1513b is stacked over a first light-emitting layer 1513a, and the electron-transport layer 1514 has a structure in which a second electron-transport layer 1514b is stacked over a first electron-transport layer 1514a.

In order to describe the correlation of bands of layers in Light-emitting element 4, FIG. 20B illustrates the HOMO levels and the LUMO levels of the hole-transport layer 1512, the first light-emitting layer 1513a, the second light-emitting layer 1513b, and the first electron-transport layer 1514a. Note that the hole-transport layer 1512, the first light-emitting layer 1513a, and the second light-emitting layer 1513b of Light-emitting element 4 contain the same host material. As the same host material, mDBTPTp-II was used.

In the first light-emitting layer 1513a, Ir(mppr-Me)$_2$dpm is dispersed as a light-emitting material in the host material. Because the HOMO level of the light-emitting material (−5.50 eV) is shallower than the HOMO level of the host material (−6.24 eV), a hole trap level of 0.74 eV is formed in the first light-emitting layer 1513a.

In the second light-emitting layer 1513b, Ir(2phq)$_3$ is dispersed as a light-emitting material in the host material. Because the HOMO level of the light-emitting material (−5.43 eV) is shallower than the HOMO level of the host material (−6.24 eV), a hole trap level of 0.81 eV is formed in the second light-emitting layer 1513b. Therefore, the first light-emitting layer has a low ability for capturing a hole than the second light-emitting layer, and the hole-transport property of the first light-emitting layer is higher than that of the second light-emitting layer.

Next, a method for manufacturing Light-emitting element 4 is described. The hole-transport layer 1512 was formed on the first electrode 1502 over a substrate 1501 in a manner similar to that of Light-emitting element 1. The hole-transport layer 1512 was formed by co-evaporation of mDBTPTp-II and molybdenum(VI) oxide. The thickness of the hole-transport layer 1512 was 50 nm, and the evaporation rate was adjusted such that the weight ratio of mDBTPTp-II to molybdenum(VI) oxide was 4:2 (=mDBTPTp-II:molybdenum oxide).

Next, the first light-emitting layer 1513a was formed on the hole-transport layer 1512. The first light-emitting layer 1513a was formed by co-evaporation of mDBTPTp-II and Ir(mppr-Me)$_2$dpm. The thickness of the first light-emitting layer 1513a was 20 nm, and the evaporation rate was adjusted such that the weight ratio of mDBTPTp-II to Ir(mppr-Me)$_2$dpm was 1:0.05 (=mDBTPTp-II:Ir(mppr-Me)$_2$dpm).

Then, the second light-emitting layer 1513b was formed on the first light-emitting layer 1513a. The second light-emitting layer 1513b was formed by co-evaporation of mDBTPTp-II and Ir(2phq)$_3$. The thickness of the second light-emitting layer 1513b was 30 nm, and the evaporation rate was adjusted such that the weight ratio of mDBTPTp-II to Ir(2phq)$_3$ was 1:0.04 (=mDBTPTp-II:Ir(2phq)$_3$).

The electron-transport layer 1514 was further formed on the second light-emitting layer 1513b. The electron-transport layer 1514 includes two layers of a first electron-transport layer 1514a and a second electron-transport layer 1514b. Tris(8-quinolinolato)aluminum(III) (abbreviation: Alq) was deposited to a thickness of 10 nm as the first electron-transport layer 1514a, and bathophenanthroline (abbreviation: BPhen) was deposited thereon to a thickness of 20 nm as the second electron-transport layer 1514b.

The electron-injection layer 1515 was formed on the electron-transport layer 1514. The electron-injection layer 1515 was formed by evaporating lithium fluoride (LiF), and the thickness thereof was 1 nm.

Finally, the second electrode 1504 was formed on the electron-injection layer 1515. The second electrode 1504 was formed by evaporating aluminum, and the thickness thereof was 200 nm. Thus, Light-emitting element 4 was manufactured.

Sealing was performed in a glove box under a nitrogen atmosphere so that the resulting Light-emitting element 4 was not exposed to the atmosphere, and then operation characteristics of this light-emitting element were measured. Note that the measurement was carried out at room temperature (in an atmosphere kept at 25° C.).

(Manufacture of Light-Emitting Element 5)

Figure 20C:
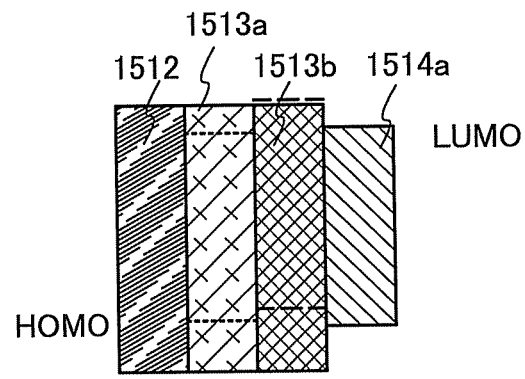

FIG. 20A illustrates an element structure of Light-emitting element 5 described in Example 4, and FIG. 20C illustrates part of a band structure thereof. Light-emitting element 5 includes an EL layer 1503 having a stack of plural layers over a first electrode 1502. The EL layer 1503 of Light-emitting element 5 of Example 4 has a structure in which a hole-transport layer 1512, a light-emitting layer 1513, an electron-transport layer 1514, and an electron-injection layer 1515 are stacked in that order. Note that the light-emitting layer 1513 has a structure in which a second light-emitting layer 1513b is stacked over a first light-emitting layer 1513a, and the electron-transport layer 1514 has a structure in which an electron-transport layer 1514b is stacked over an electron-transport layer 1514a.

In order to describe the correlation of bands of layers in Light-emitting element 5, FIG. 20C illustrates the HOMO levels and the LUMO levels of the hole-transport layer 1512, the first light-emitting layer 1513a, the second light-emitting layer 1513b, and the first electron-transport layer 1514a. Note that the hole-transport layer 1512, the first light-emitting layer 1513a, and the second light-emitting layer 1513b of Light-emitting element 5 contain the same host material. As the same host material, mDBTPTp-II was used.

In the first light-emitting layer 1513a, Ir(mppr-Me)$_2$dpm is dispersed as a light-emitting material in the host material. Because the HOMO level of the light-emitting material (−5.50 eV) is shallower than the HOMO level of the host material (−6.24 eV), a hole trap level of 0.74 eV is formed in the first light-emitting layer 1513a.

In the second light-emitting layer 1513b, Ir(ppy)$_3$ is dispersed as a light-emitting material in the host material. Because the HOMO level of the light-emitting material (−5.32 eV) is shallower than the HOMO level of the host material (−6.24 eV), a hole trap level of 0.92 eV is formed in the second light-emitting layer 1513b. Therefore, the first light-emitting layer has a low ability for capturing a hole than the second light-emitting layer, and the hole-transport property of the first light-emitting layer is higher than that of the second light-emitting layer.

Next, a method for manufacturing Light-emitting element 5 is described. Light-emitting element 5 has a structure which is different from that of Light-emitting element 4 only in the second light-emitting layer 1513b. Therefore, only a method for manufacturing the second light-emitting layer 1513b is described here, and description of the method for manufacturing Light-emitting element 4 can be referred to for the other structure.

The second light-emitting layer 1513b was formed on the first light-emitting layer 1513a. The second light-emitting layer 1513b was formed by co-evaporation of mDBTPTp-II and Ir(ppy)$_3$. The thickness of the second light-emitting layer 1513b was 30 nm, and the evaporation rate was adjusted such that the weight ratio of mDBTPTp-II to Ir(ppy)$_3$ was 1:0.04 (=mDBTPTp-II:Ir(ppy)$_3$).

Sealing was performed in a glove box under a nitrogen atmosphere so that the resulting Light-emitting element 5 was not exposed to the atmosphere, and then operation characteristics of this light-emitting element were measured. Note that the measurement was carried out at room temperature (in an atmosphere kept at 25° C.).

(Manufacture of Comparative Element 1)

Figure 21A:
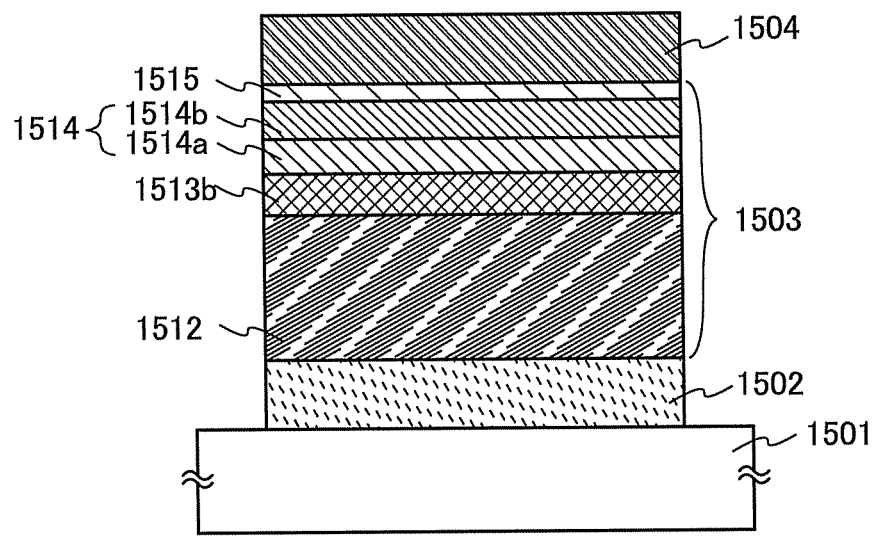
FIGS. 21A to 21C illustrate a light-emitting element according to an Example.
Figure 21B:
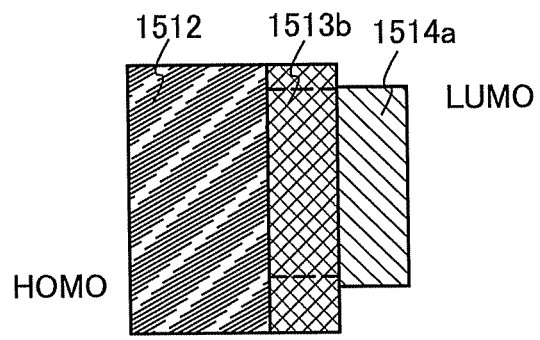

FIG. 21A illustrates an element structure of Comparative element 1 manufactured in Example 4, and FIG. 21B illustrates part of a band structure thereof. Comparative element 1 includes an EL layer 1503 having a stack of plural layers over a first electrode 1502. The EL layer 1503 of Comparative element 1 has a structure in which a hole-transport layer 1512, a light-emitting layer 1513b, an electron-transport layer 1514, and an electron-injection layer 1515 are stacked in that order. Note that the light-emitting layer 1513b has a single-layer structure, and the electron-transport layer 1514 has a structure in which a second electron-transport layer 1514b is stacked over a first electron-transport layer 1514a.

In order to describe the correlation of bands of layers in Comparative element 1, FIG. 21B illustrates the HOMO levels and the LUMO levels of the hole-transport layer 1512, the light-emitting layer 1513b, and the first electron-transport layer 1514a. Note that the hole-transport layer 1512 and the light-emitting layer 1513b of Comparative element 1 contain the same host material. As the same host material, mDBTPTp-II was used.

In the light-emitting layer 1513b, Ir(2phq)$_3$ is dispersed as a light-emitting material in the host material. Because the HOMO level of the light-emitting material (−5.43 eV) is shallower than the HOMO level of the host material (−6.24 eV), a hole trap level of 0.81 eV is formed in the light-emitting layer 1513b.

Next, a method for manufacturing Comparative element 1 is described. The hole-transport layer 1512 was formed on the first electrode 1502 over a substrate in a manner similar to that of Light-emitting element 1. The hole-transport layer 1512 was formed by co-evaporation of mDBTPTp-II and molybdenum(VI) oxide. The thickness of hole-transport layer 1512 was 70 nm, and the evaporation rate was adjusted such that the weight ratio of mDBTPTp-II to molybdenum(VI) oxide was 4:2 (=mDBTPTp-II:molybdenum oxide).

Next, the light-emitting layer 1513b was formed on the hole-transport layer 1512. The light-emitting layer 1513b was formed by co-evaporation of mDBTPTp-II and Ir(2phq)$_3$. The thickness of the light-emitting layer 1513b was 30 nm, and the evaporation rate was adjusted such that the weight ratio of mDBTPTp-II to Ir(2phq)$_3$ was 1:0.04 (=mDBTPTp-II:Ir(2phq)$_3$).

The electron-transport layer 1514 was further formed on the light-emitting layer 1513b. The electron-transport layer 1514 includes two layers of a first electron-transport layer 1514a and a second electron-transport layer 1514b. Tris(8-quinolinolato)aluminum(III) (abbreviation: Alq) was deposited to a thickness of 10 nm as the first electron-transport layer 1514a, and bathophenanthroline (abbreviation: BPhen) was deposited thereon to a thickness of 20 nm as the second electron-transport layer 1514b.

The electron-injection layer 1515 was formed on the electron-transport layer 1514. The electron-injection layer 1515 was formed by evaporating lithium fluoride (LiF), and the thickness thereof was 1 nm.

Finally, the second electrode 1504 was formed on the electron-injection layer 1515. The second electrode 1504 was formed by evaporating aluminum, and the thickness thereof was 200 nm. Thus, Comparative element 1 was manufactured.

Sealing was performed in a glove box under a nitrogen atmosphere so that the resulting Comparative element 1 was not exposed to the atmosphere, and then operation characteristics of Comparative element 1 were measured. Note that the measurement was carried out at room temperature (in an atmosphere kept at 25° C.).

(Manufacture of Comparative Element 2)

Figure 21C:
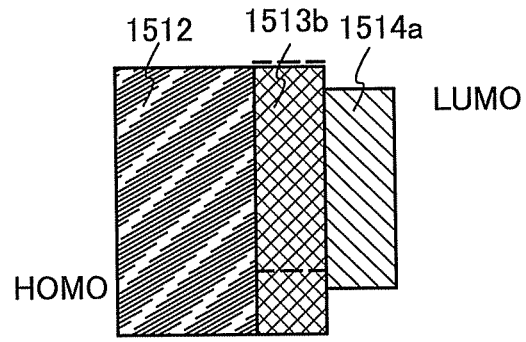

FIG. 21A illustrates an element structure of Comparative element 2 manufactured in Example 4, and FIG. 21C illustrates part of a band structure thereof. Comparative element 2 includes an EL layer 1503 having a stack of plural layers over a first electrode 1502. The EL layer 1503 of Comparative element 2 has a structure in which a hole-transport layer 1512, a light-emitting layer 1513b, an electron-transport layer 1514, and an electron-injection layer 1515 are stacked in that order. Note that the light-emitting layer 1513b has a single-layer structure, and the electron-transport layer 1514 has a structure in which an electron-transport layer 1514b is stacked over an electron-transport layer 1514a.

In order to describe the correlation of bands of layers in Comparative element 2, FIG. 21C illustrates the HOMO levels and the LUMO levels of the hole-transport layer 1512, the light-emitting layer 1513b, and the first electron-transport layer 1514a. Note that the hole-transport layer 1512 and the light-emitting layer 1513b of Comparative element 2 contain the same host material. As the same host material, mDBTPTp-II was used.

In the light-emitting layer 1513b, Ir(ppy)$_3$ is dispersed as a light-emitting material in the host material. Because the HOMO level of the light-emitting material (−5.32 eV) is shallower than the HOMO level of the host material (−6.24 eV), a hole trap level of 0.92 eV is formed in the light-emitting layer 1513b.

Next, a method for manufacturing Comparative element 2 is described. Comparative element 2 has a structure which is different from that of Comparative element 1 only in the second light-emitting layer 1513b. Therefore, only a method for manufacturing the second light-emitting layer 1513b is described here, and description in the method for manufacturing Comparative element 1 can be referred to for the other structure.

The light-emitting layer 1513b was formed on the hole-transport layer 1512. The light-emitting layer 1513b was formed by co-evaporation of mDBTPTp-II and Ir(ppy)$_3$. The thickness of the light-emitting layer 1513b was 30 nm, and the evaporation rate was adjusted such that the weight ratio of mDBTPTp-II to Ir(ppy)$_3$ was 1:0.04 (=mDBTPTp-II:Ir(ppy)$_3$).

Sealing was performed in a glove box under a nitrogen atmosphere so that the resulting Comparative element 2 was not exposed to the atmosphere, and then operation characteristics of Comparative element 2 were measured. Note that the measurement was carried out at room temperature (in an atmosphere kept at 25° C.).

(Evaluation Results)

Figure 22:
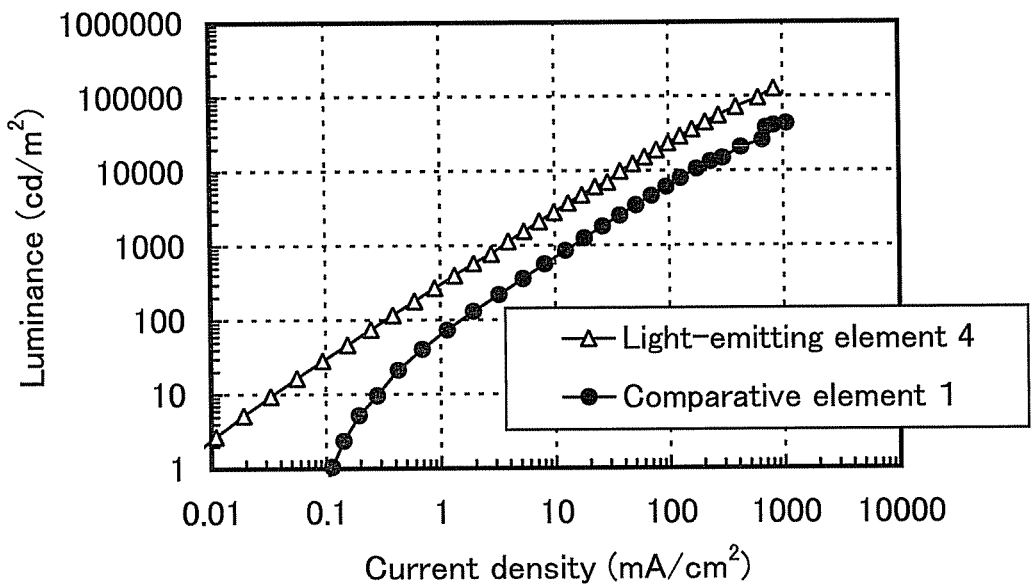
FIG. 22 shows current density-luminance characteristics of Light-emitting element 4 and Comparative element 1.
Figure 23:
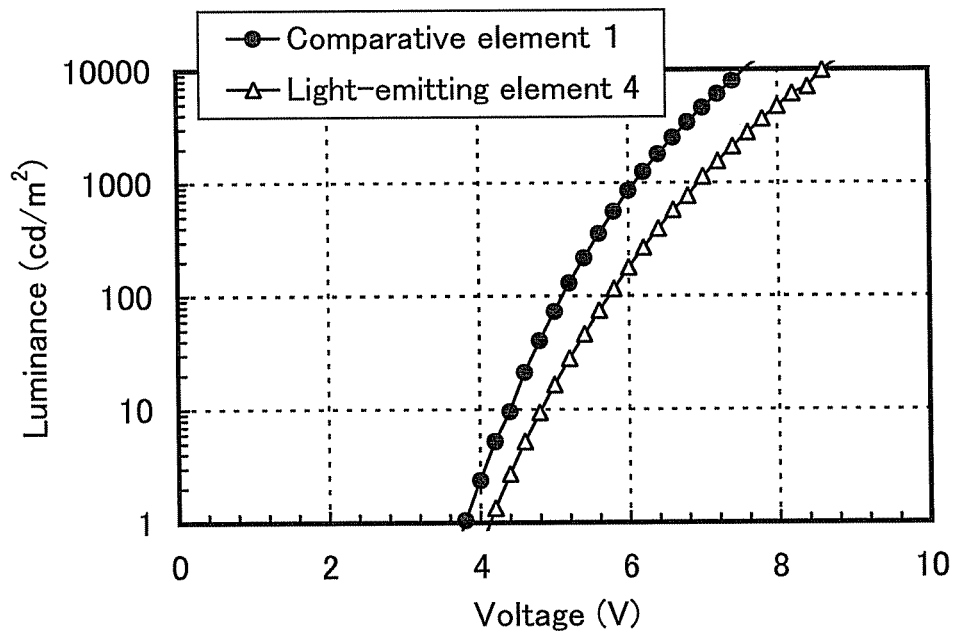
FIG. 23 shows voltage-luminance characteristics of Light-emitting element 4 and Comparative element 1.
Figure 24:
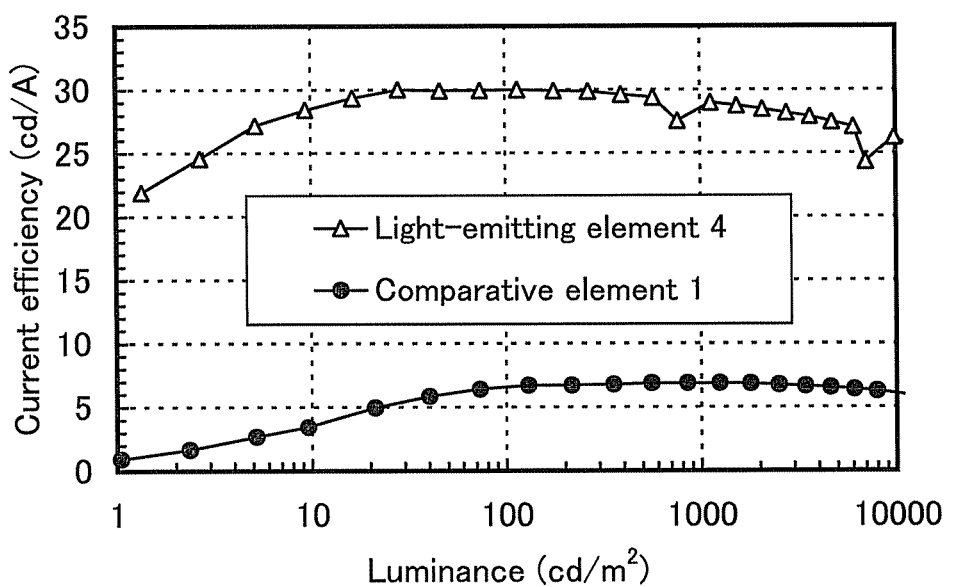
FIG. 24 shows luminance-current efficiency characteristics of Light-emitting element 4 and Comparative element 1.

FIG. 22, FIG. 23, and FIG. 24 respectively show current density-luminance characteristics, voltage-luminance characteristics, and luminance-current efficiency characteristics of Light-emitting element 4 and Comparative element 1.

The CIE chromaticity coordinate of Light-emitting element 4 at a luminance of 1000 cd/m$^2$ was x=0.558, y=0.441, and green light was emitted. The current efficiency, the voltage, and the current density at the luminance of 1000 cd/m$^2$ were 29.0 cd/A, 7.0 V, and 3.9 mA/cm$^2$, respectively. On the other hand, the CIE chromaticity coordinate of Comparative element 1 at a luminance of 1000 cd/m$^2$ was x=0.577, y=0.421, and orange light was emitted. The current efficiency, the voltage, and the current density at the luminance of 1000 cd/m$^2$ were 6.87 cd/A, 6.0 V, and 12.3 mA/cm$^2$, respectively.

As can be seen from the above measurement results, Light-emitting element 4 emitted light with higher current efficiency than Comparative element 1. Since Light-emitting element 4 in an embodiment of the present invention has the first light-emitting layer 1513a interposed between the second light-emitting layer 1513b and the hole-transport layer 1512 and has a hole trap level, emission efficiency is high.

Figure 25:
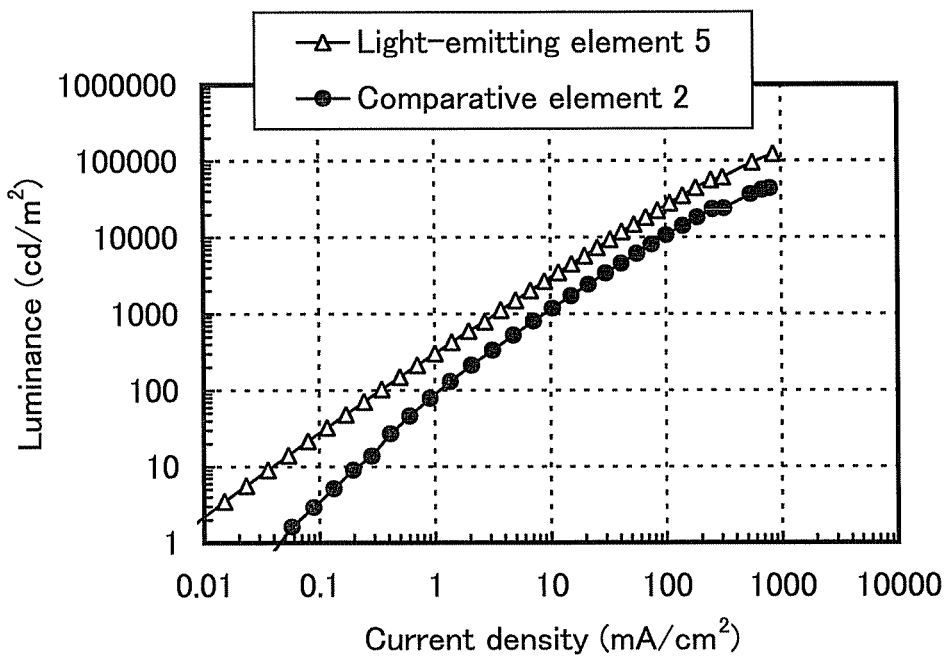
FIG. 25 shows current density-luminance characteristics of Light-emitting element 5 and Comparative element 2.
Figure 26:
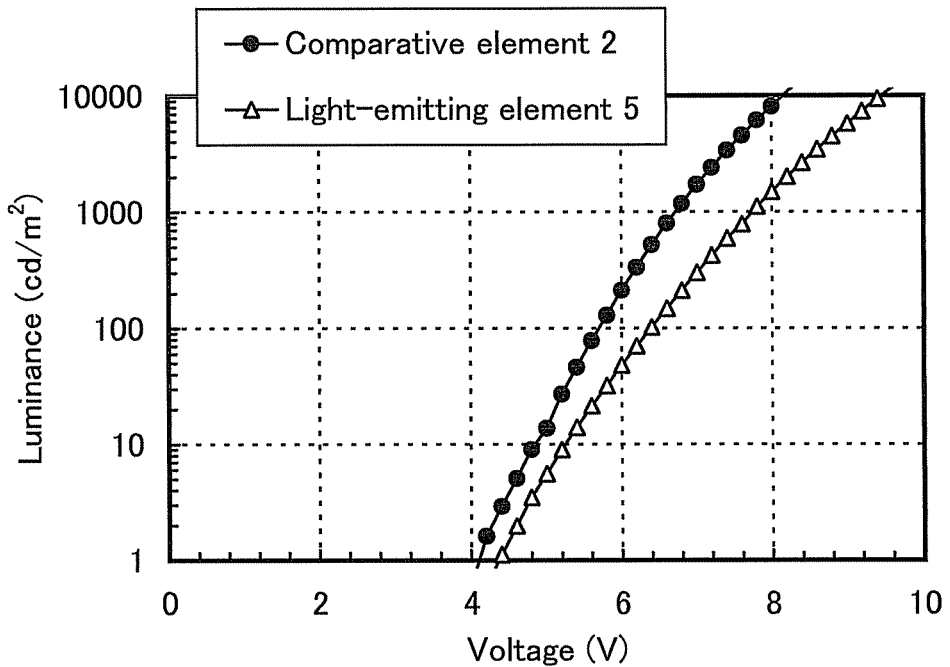
FIG. 26 shows voltage-luminance characteristics of Light-emitting element 5 and Comparative element 2.
Figure 27:
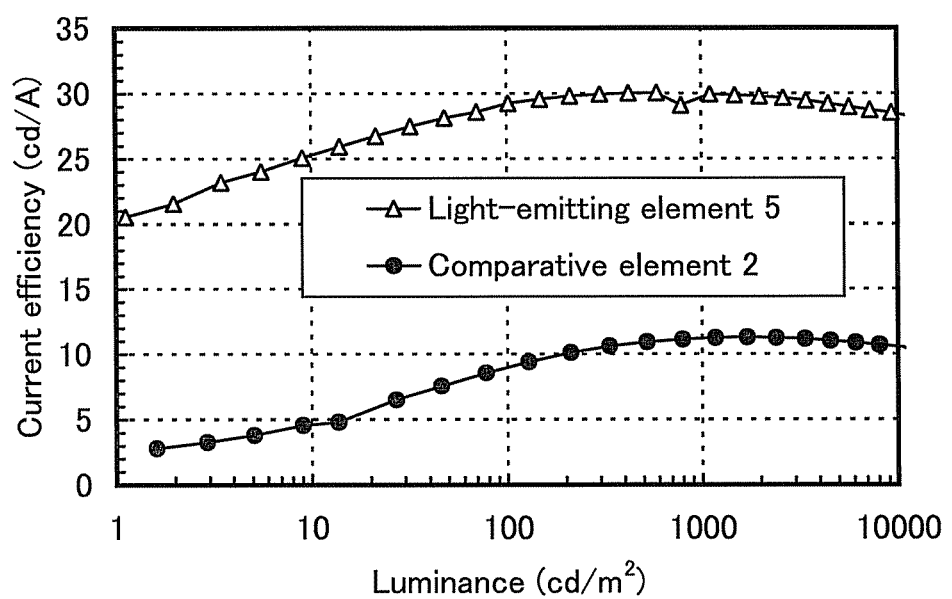
FIG. 27 shows luminance-current efficiency characteristics of Light-emitting element 5 and Comparative element 2.

FIG. 25, FIG. 26, and FIG. 27 respectively show current density-luminance characteristics, voltage-luminance characteristics, and luminance-current efficiency characteristics of Light-emitting element 5 and Comparative element 2.

The CIE chromaticity coordinate of Light-emitting element 5 at a luminance of 1000 cd/m$^2$ was x=0.523, y=0.467, and orange light was emitted. The current efficiency, the voltage, and the current density at the luminance of 1000 cd/m$^2$ were 29.9 cd/A, 7.8 V, and 3.71 mA/cm$^2$, respectively. On the other hand, the CIE chromaticity coordinate of Comparative element 2 at a luminance of 1000 cd/m$^2$ was x=0.335, y=0.610, and green light was emitted. The current efficiency, the voltage, and the current density at the luminance of 1000 cd/m$^2$ were 11.2 cd/A, 6.8 V, and 10.5 mA/cm$^2$, respectively.

As can be seen from the above measurement results, Light-emitting element 5 emitted light with high current efficiency. Since Light-emitting element 5 in an embodiment of the present invention has the first light-emitting layer 1513a interposed between the second light-emitting layer 1513b and the hole-transport layer 1512 and has a hole trap level, the emission efficiency is high.

This application is based on Japanese Patent Application serial no. 2009-205300 filed with Japan Patent Office on Sep. 4, 2009, the entire contents of which are hereby incorporated by reference.

EXPLANATION OF REFERENCE

100: substrate, 101: electrode, 101W: working function, 102: electrode, 102W: working function, 103: EL layer, 112: hole-transport layer, 113: light-emitting layer, 113a: light-emitting layer, 113b: light-emitting layer, 113c: light-emitting layer, 114: electron-transport layer, 115: electron-injection layer, 121: HOMO level, 122: LUMO level, 131a: HOMO level, 131b: HOMO level, 131c: HOMO level, 134: LUMO level, 134a: LUMO level, 134b: LUMO level, 141: HOMO level, 142: LUMO level, 401: source side driver circuit, 402: pixel portion, 403: gate side driver circuit, 404: sealing substrate, 405: sealant, 407: space, 408: wiring, 409: flexible printed circuit (FPO), 410: substrate, 411: switching TFT, 412: current control TFT, 413: electrode, 414: insulator, 416: EL layer, 417: second electrode, 418: light-emitting element, 423: n-channel TFT, 424: p-channel TFT, 601: electrode, 602: electrode, 604: intermediate layer, 631: EL layer, 632: EL layer, 951: substrate, 952: electrode, 953: insulating layer, 954: partition layer, 955: EL, 956: electrode, 1002: display portion, 1003: EL layer, 1004: intermediate layer, 1011: electrode, 1012: electrode, 1020: cellular phone, 1021: chassis, 1023: operation button, 1024: external connection port, 1025: speaker, 1026: microphone, 1501: glass substrate, 1502: electrode, 1503: EL layer, 1504: electrode, 1512: hole-transport layer, 1513: light-emitting layer, 1513a: light-emitting layer, 1513b: light-emitting layer, 1513c: light-emitting layer, 1514: electron-transport layer, 1514a: electron-transport layer, 1514b: electron-transport layer, 1515: electron-injection layer, 2001: chassis, 2002: light source, 3001: lighting device, 3002: television set, 9101: chassis, 9102: support, 9103: display portion, 9104: speaker, 9105: video input terminal, 9201: body, 9202: chassis, 9203: display portion, 9204: keyboard, 9205: external connection port, 9206: pointing device, 9501: body, 9502: display portion, 9503: chassis, 9504: external connection port, 9505: remote control receive portion, 9506: image receiving portion, 9507: battery, 9508: audio input portion, 9509: operation key, 9510: eye piece portion, 9601: chassis, 9602: liquid crystal layer, 9603: backlight, 9604: chassis, 9605: driver IC, 9606: terminal.

The invention claimed is:

1. A light-emitting device comprising:
   an anode;
   a hole-transport layer over the anode, the hole-transport layer comprising a first host material and an oxide of any of Group 4 to 8 metals;
   a first light-emitting layer over and in contact with the hole-transport layer;
   a second light-emitting layer over and in contact with the first light-emitting layer;
   an electron-transport layer over and in contact with the second light-emitting layer; and
   a cathode over the electron-transport layer,
   wherein among the anode and the cathode, only the cathode has a light-transmitting property so that light is extracted through the cathode,
   wherein the first light-emitting layer contains the first host material and a first light-emitting material,
   wherein the second light-emitting layer contains the first host material and a second light-emitting material,
   wherein a hole-transport property of the first light-emitting layer is higher than a hole-transport property of the second light-emitting layer, and
   wherein emission colors of the first light-emitting material and the second light-emitting material are red and yellow, respectively.

2. The light-emitting device according to claim 1, wherein a difference between HOMO levels of the first host material and the second light-emitting material is larger than a difference between HOMO levels of the first host material and the first light-emitting material.

3. The light-emitting device according to claim 1, wherein an electron-transport property of the first light-emitting layer is lower than an electron-transport property of the second light-emitting layer.

4. The light-emitting device according to claim 1, wherein a difference between LUMO levels of the first host material and the first light-emitting material is larger than a difference between LUMO levels of the first host material and the second light-emitting material.

5. The light-emitting device according to claim 1, wherein the first host material is bipolar.

6. The light-emitting device according to claim 1, wherein the hole-transport layer is in contact with the anode.

7. The light-emitting device according to claim 1, wherein the oxide is molybdenum oxide.

8. An electric device comprising the light-emitting device according to claim 1.

9. A lighting device comprising the light-emitting device according to claim 1.

10. The light-emitting device according to claim 1, wherein the hole-transport layer include a first organic compound,
    wherein a HOMO level of the first organic compound is substantially equal to a HOMO level of the first host material.

11. The light-emitting device according to claim 1, wherein the first host material is selected from an anthracene derivative, a pyrene derivative, a phenanthrene derivative, a chrysene derivative, a triphenylene derivative, and a naphthacene derivative.

12. The light-emitting device according to claim 1, wherein the first host material is selected from an anthracene derivative and a pyrene derivative.

13. The light-emitting device according to claim 1, further comprising an electron-injection layer between and in contact with the electron-transport layer and the cathode.

14. A light-emitting device comprising:
an anode;
a hole-transport layer over the anode, the hole-transport layer comprising a first host material and an oxide of any of Group 4 to 8 metals;
a first light-emitting layer over and in contact with the hole-transport layer;
a second light-emitting layer over and in contact with the first light-emitting layer;
an electron-transport layer over and in contact with the second light-emitting layer; and
a cathode over the electron-transport layer,
wherein among the anode and the cathode, only the cathode has a light-transmitting property so that light is extracted through the cathode,
wherein the first light-emitting layer contains the first host material and a first phosphorescent light-emitting material,
wherein the second light-emitting layer contains the first host material and a second phosphorescent light-emitting material,
wherein a hole-transport property of the first light-emitting layer is higher than a hole-transport property of the second light-emitting layer, and
wherein emission colors of the first phosphorescent light-emitting material and the second phosphorescent light-emitting material are red and yellow, respectively.

15. The light-emitting device according to claim 14, wherein a difference between HOMO levels of the first host material and the second phosphorescent light-emitting material is equal to or larger than a difference between HOMO levels of the first host material and the first phosphorescent light-emitting material.

16. The light-emitting device according to claim 14, wherein the first host material is bipolar.

17. The light-emitting device according to claim 14, wherein the hole-transport layer is in contact with the anode.

18. An electric device comprising the light-emitting device according to claim 14.

19. A lighting device comprising the light-emitting device according to claim 14.

20. The light-emitting device according to claim 14, wherein an electron-transport property of the first light-emitting layer is lower than an electron-transport property of the second light-emitting layer.

21. The light-emitting device according to claim 14, wherein a difference between LUMO levels of the first host material and the first phosphorescent light-emitting material is larger than a difference between LUMO levels of the first host material and the second phosphorescent light-emitting material.

22. The light-emitting device according to claim 14, wherein the hole-transport layer include a first organic compound,
wherein a HOMO level of the first organic compound is substantially equal to a HOMO level of the first host material.

23. The light-emitting device according to claim 12, wherein the anthracene derivative comprise a carbazolyl group.

* * * * *